United States Patent
Nihashi et al.

(10) Patent No.: US 10,394,127 B2
(45) Date of Patent: Aug. 27, 2019

(54) PATTERN FORMING METHOD AND METHOD FOR MANUFACTURING ELECTRONIC DEVICE

(71) Applicant: FUJIFILM Corporation, Tokyo (JP)

(72) Inventors: Wataru Nihashi, Shizuoka (JP); Hideaki Tsubaki, Shizuoka (JP); Toru Tsuchihashi, Shizuoka (JP); Tomotaka Tsuchimura, Shizuoka (JP)

(73) Assignee: FUJIFILM Corporation, Tokyo (JP)

( * ) Notice: Subject to any disclaimer, the term of this patent is extended or adjusted under 35 U.S.C. 154(b) by 0 days.

(21) Appl. No.: 15/718,659

(22) Filed: Sep. 28, 2017

(65) Prior Publication Data
US 2018/0017872 A1    Jan. 18, 2018

Related U.S. Application Data

(63) Continuation of application No. PCT/JP2016/059522, filed on Mar. 24, 2016.

(30) Foreign Application Priority Data

Mar. 31, 2015 (JP) .................. 2015-074229

(51) Int. Cl.
*G03F 7/20* (2006.01)
*G03F 7/32* (2006.01)
*G03F 7/038* (2006.01)
*G03F 7/16* (2006.01)
*G03F 7/039* (2006.01)

(52) U.S. Cl.
CPC ............. *G03F 7/325* (2013.01); *G03F 7/038* (2013.01); *G03F 7/0382* (2013.01); *G03F 7/0392* (2013.01); *G03F 7/16* (2013.01); *G03F 7/20* (2013.01); *G03F 7/2004* (2013.01)

(58) Field of Classification Search
CPC ......... G03F 7/325; G03F 7/0382; G03F 7/038
See application file for complete search history.

(56) References Cited

U.S. PATENT DOCUMENTS

| 6,576,392 B1* | 6/2003 | Sato ...................... G03F 7/0045 |
| | | 430/270.1 |
| 9,772,558 B2* | 9/2017 | Ayothi ...................... G03F 7/40 |
| 2003/0232277 A1 | 12/2003 | Sasaki et al. |
| 2005/0089800 A1* | 4/2005 | Lee ...................... C07D 327/04 |
| | | 430/281.1 |
| 2012/0237875 A1 | 9/2012 | Asano et al. |
| 2014/0212813 A1 | 7/2014 | Asano et al. |
| 2014/0349224 A1 | 11/2014 | Takizawa et al. |
| 2015/0086925 A1* | 3/2015 | Ayothi ...................... G03F 7/40 |
| | | 430/285.1 |
| 2015/0192851 A1* | 7/2015 | Yamashita ............ G03F 7/2002 |
| | | 430/296 |
| 2016/0147147 A1 | 5/2016 | Hirano et al. |
| 2016/0179003 A1 | 6/2016 | Asano et al. |
| 2017/0176862 A1* | 6/2017 | Inoue ...................... G03F 7/038 |

FOREIGN PATENT DOCUMENTS

| JP | 2003-316007 A | 11/2003 |
| JP | 2011-98953 A | 5/2011 |
| JP | 2011-150211 A | 8/2011 |
| JP | 2013-160947 A | 8/2013 |
| JP | 2015-25879 A | 2/2015 |
| JP | 2015-31851 A | 2/2015 |
| JP | 2015-96932 A | 5/2015 |
| JP | 2016-71206 A | 5/2016 |
| JP | 2016-71207 A | 5/2016 |

OTHER PUBLICATIONS

Park et al., "Polymers with Acid-amplifying Side Chainsas Positive-type Photoresists", Journal of Photopolymer Science and Technology, vol. 17, No. 3, 2004, pp. 427-432. (Year: 2004).*
English Translation of JP 2015-096932 A generated machine translation from AIPN Japan Patent Office National Center for Industrial Property Information and Training, generated Oct. 19, 2018, 62 pages. (Year: 2018).*
Communication dated Feb. 20, 2018, from the Japanese Patent Office in counterpart Application No. 2017-509886.
International Search Report, issued by International Searching Authority in corresponding International Application No. PCT/JP2016/059522, dated Jun. 21, 2016, (PCT/ISA/210).
Written Opinion, issued by International Searching Authority in corresponding International Application No. PCT/JP2016/059522, dated Jun. 21, 2016, (PCT/ISA/237).

* cited by examiner

*Primary Examiner* — Cynthia Hamilton
(74) *Attorney, Agent, or Firm* — Sughrue Mion, PLLC

(57) ABSTRACT

Provide are a pattern forming method including a step (1) of forming a film using an actinic ray-sensitive or radiation-sensitive resin composition including a resin having an acid-decomposable repeating unit capable of decomposing by the action of an acid to generate an acid having a pKa of 3.0 or less, a step (2) of exposing the film using actinic rays or radiation, and a step (3) of carrying out development using a developer including an organic solvent after the exposure to form a negative tone pattern; and a method for manufacturing an electronic device, including the pattern forming method.

12 Claims, No Drawings

PATTERN FORMING METHOD AND METHOD FOR MANUFACTURING ELECTRONIC DEVICE

CROSS REFERENCE TO RELATED APPLICATION(S)

This is a continuation of International Application No. PCT/JP2016/059522 filed on Mar. 24, 2016, and claims priority from Japanese Patent Application No. 2015-074229 filed on Mar. 31, 2015, the entire disclosures of which are incorporated herein by reference.

BACKGROUND OF THE INVENTION

1. Field of the Invention

The present invention relates to a pattern forming method and a method for manufacturing an electronic device. More specifically, the present invention relates to a pattern forming method which is suitable for a process for manufacturing a semiconductor such as an integrated circuit (IC), the manufacture of a circuit board for a liquid crystal, a thermal head, or the like, and other lithographic processes for photofabrication, and a method for manufacturing an electronic device.

2. Description of the Related Art

Since a resist for a KrF excimer laser (248 nm) was developed, a pattern forming method using chemical amplification has been used in order to compensate for desensitization caused by light absorption. For example, in a positive type chemical amplification method, a photoacid generator included in an exposed area first decomposes by light irradiation to generate an acid. Further, in a post-exposure bake (PEB) process or the like, a catalytic action of the generated acid allows an alkali-insoluble group included in a photosensitive composition to be changed into an alkali-soluble group. Thereafter, development is carried out using, for example, an alkali solution. Thus, the exposed area is removed to obtain a desired pattern.

In the method, as an alkali developer, various ones have been proposed. For example, as the alkali developer, an aqueous alkali developer of a 2.38%-by-mass aqueous tetramethylammonium hydroxide solution (TMAH) has been widely used.

As a positive type resist composition using the alkali developer, an actinic ray-sensitive or radiation-sensitive resin composition including a resin having a structure capable of decomposing by the action of an acid to generate sulfonic acid has been disclosed (JP2011-150211A and JP2003-316007A).

Moreover, in order to make semiconductor elements finer, the wavelength of an exposure light source has been shortened and a projection lens with a high numerical aperture (high NA) has been advanced. Thus, an exposure machine using an ArF excimer laser having a wavelength of 193 nm as a light source has been currently developed. In addition, as a technique for further improving resolving power, a so-called liquid immersion method in which a liquid having a high refractive index (hereinafter also referred to as an "immersion liquid") is filled between a projection lens and a sample; and extreme ultraviolet (EUV) lithography that performs exposure with ultraviolet rays at a shorter wavelength (13.5 nm) have been proposed.

Furthermore, recently, a negative tone pattern forming method including a step of applying a resist composition whose solubility in an organic developer decreases by irradiation with actinic rays or radiation on a substrate, an exposing step, and a step of carrying out development using an organic developer has been disclosed (JP2013-160947A). In JP2013-160947A, an actinic ray-sensitive or radiation-sensitive resin composition including a compound capable of decomposing by the action of an acid to generate an acid has been disclosed.

SUMMARY OF THE INVENTION

However, although a good pattern shape can be obtained by the pattern forming method in the related art, using a developer including an organic solvent, there is a demand for reduction in film shrinkage (PEB shrinkage) in a post-exposure bake (PEB) process, in addition to excellent performance of resolution and line width roughness (LWR), particularly in the formation of an ultrafine pattern (for example, a pattern having a line width of 20 nm or less).

It is an object of the present invention to provide a pattern forming method having excellent performance of resolution and line width roughness as well as reduction in film shrinkage (PEB shrinkage) in a PEB process, particularly in the formation of an ultrafine (for example, a line width of 20 nm hp or less) pattern. It is another object of the present invention to provide a method for manufacturing an electronic device, including the pattern forming method.

That is, the objects can be accomplished by the following means.

<1> A pattern forming method comprising:
a step (1) of forming a film using an actinic ray-sensitive or radiation-sensitive resin composition including a resin having an acid-decomposable repeating unit capable of decomposing by the action of an acid to generate an acid having a pKa of 3.0 or less;
a step (2) of exposing the film using actinic rays or radiation; and
a step (3) of carrying out development using a developer including an organic solvent after the exposure to form a negative tone pattern.

<2> The pattern forming method as described in <1>, in which the acid having a pKa of 3.0 or less is sulfonic acid, phosphoric acid, or phosphonic acid.

<3> The pattern forming method as described in <1> or <2>, in which the acid-decomposable repeating unit capable of decomposing by the action of an acid to generate an acid having a pKa of 3.0 or less is represented by General Formula (1-1).

In the formula,
Ra and Rb each independently represent a hydrogen atom, an alkyl group, or a cyano group.
Rc represents a hydrogen atom or a substituent.
$L_1$ represents a single bond or a linking group.

In a case where Rc is the substituent and $L_1$ is the linking group, Rc and $L_1$ may be bonded to each other to form a ring.

X represents a group capable of leaving by the action of an acid.

<4> The pattern forming method as described in <3>, in which the group represented by X in General Formula (1-1) has a total number of carbon atoms and oxygen atoms of 4 or less.

<5> The pattern forming method as described in any one of <1> to <4>, in which the content of the repeating unit capable of decomposing by the action of an acid to generate an acid having a pKa of 3.0 or less is 55% to 100% by mole with respect to all the repeating units of the resin.

<6> The pattern forming method as described in any one of <1> to <5>, in which the resin further has a repeating unit represented by General Formula (2).

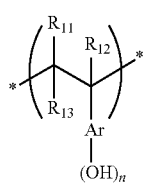

(2)

In the formula, $R_{11}$ and $R_{12}$ each independently represent a hydrogen atom, an alkyl group, a cycloalkyl group, a halogen atom, a cyano group, or an alkoxycarbonyl group. $R_{13}$ represents a hydrogen atom, an alkyl group, a cycloalkyl group, a halogen atom, a cyano group, or an alkoxycarbonyl group, or is bonded to Ar below to form a ring structure. Ar represents an aromatic cyclic group. n represents an integer of 1 to 4.

<7> The pattern forming method as described in any one of <1> to <6>, in which the resin does not contain a fluorine atom.

<8> The pattern forming method as described in any one of <1> to <7>, in which the actinic ray-sensitive or radiation-sensitive resin composition contains a compound capable of generating an acid with actinic rays or radiation.

<9> The pattern forming method as described in any one of <1> to <8>, in which the organic solvent includes an ester-based solvent.

<10> The pattern forming method as described in any one of <1> to <9>, in which the step (2) is a step of exposing the film using electron beams, X-rays, or extreme ultraviolet rays.

<11> A method for manufacturing an electronic device, comprising:

the pattern forming method as described in any one of <1> to <10>.

According to the present invention, it is possible to provide a pattern forming method having excellent performance of resolution and line width roughness as well as reduction in film shrinkage (PEB shrinkage) in a PEB process, particularly in the formation of an ultrafine pattern (for example, a pattern having a line width of 20 nm hp or less). In addition, according to the present invention, it is possible to provide a method for manufacturing an electronic device, including the pattern forming method.

DESCRIPTION OF THE PREFERRED EMBODIMENTS

Hereafter, embodiments of the present invention will be described in detail.

In citations for a group (atomic group) in the present specification, in a case where the group is denoted without specifying whether it is substituted or unsubstituted, the group includes both a group not having a substituent and a group having a substituent. For example, an "alkyl group" includes not only an alkyl group not having a substituent (unsubstituted alkyl group), but also an alkyl group having a substituent (substituted alkyl group).

"Actinic rays" or "radiation" in the present specification means, for example, a bright line spectrum of a mercury lamp, far ultraviolet rays represented by an excimer laser, extreme ultraviolet rays, X-rays, electron beams (EB), or the like. In addition, in the present invention, light means actinic rays or radiation.

Unless otherwise specified, "exposure" in the present specification includes not only exposure by a bright line spectrum of a mercury lamp, far ultraviolet rays represented by an excimer laser, extreme ultraviolet rays, X-rays, extreme ultraviolet rays, or the like, but also writing by particle rays such as electron beams and ion beams.

In the present specification, a "(meth)acrylic monomer" means at least one of monomers having a structure of "$CH_2$=CH—CO—" or "$CH_2$=C($CH_3$)—CO—". Similarly, "(meth)acrylate" and "(meth)acrylic acid" means "at least one of acrylate or methacrylate" and "at least one of acrylic acid or methacrylic acid".

In the present specification, the weight-average molecular weight of the resin is a value measured in terms of polystyrene by a GPC method. GPC follows a method using HLC-8120 (manufactured by Tosoh Corporation), TSK gel Multipore HXL-M (manufactured by Tosoh Corporation, 7.8 mmID×30.0 cm) as a column, and tetrahydrofuran (THF) or N-methyl-2-pyrrolidone (NMP) as an eluent.

Hereafter, the pattern forming method of the present invention will be described in detail.

<Pattern Forming Method>

The pattern forming method of the present invention includes:

a step (1) of forming a film using an actinic ray-sensitive or radiation-sensitive resin composition (hereinafter also referred to as a "composition") including a resin (hereinafter also referred to as a "resin (A)") having an acid-decomposable repeating unit capable of decomposing by the action of an acid to generate an acid having a pKa of 3.0 or less, a step (2) of exposing the film using actinic rays or radiation, and a step (3) of carrying out development using a developer including an organic solvent after the exposure to form a negative tone pattern.

According to the present invention, it is possible to provide a pattern forming method having excellent performance of resolution and line width roughness as well as reduction in film shrinkage (PEB shrinkage) in a PEB process, particularly in the formation of an ultrafine pattern (for example, a pattern having a line width of 20 nm hp or less).

The reason thereof is not clear, but presumed as follows, for example.

For example, it is thought that in a case where a film is formed using a composition including a resin having an acid-decomposable repeating unit capable of decomposing by the action of an acid to generate methacrylic acid, and is developed using a developer including an organic solvent after the exposure to form a negative tone pattern, the developer including an organic solvent permeates into the pattern part, and thus, performance of resolution performance and line width roughness is deteriorated. In contrast, it is thought that since the resin (A) in the present invention has an acid-decomposable repeating unit capable of decomposing by the action of an acid to generate an acid having a pKa of 3.0 or less and the generated acid has more hydrophilic than methacrylic acid, it is suppressed for the developer including an organic solvent to permeate into the pattern part, and thus, performance of resolution performance and line width roughness can be accomplished at a very high level.

Furthermore, it is thought that in a case where a group leaves by the action of an acid by reducing the total number of carbon atoms and oxygen atoms of the group capable of leaving by the action of an acid, occurrence of film reduction by the shrinkage of the pattern can be effectively prevented, and as a result, high resolution can be obtained.

[Actinic Ray-Sensitive or Radiation-Sensitive Resin Composition]

Hereafter, the actinic ray-sensitive or radiation-sensitive resin composition which is used in the step (1) of the present invention will be described.

In the present invention, the actinic ray-sensitive or radiation-sensitive resin composition is used for negative tone development (development in which the solubility in a developer is reduced during exposure, and thus the exposed area remains as a pattern while the unexposed area is removed). That is, the composition used in the step (1) of the present invention is an actinic ray-sensitive or radiation-sensitive resin composition for organic solvent development, which is used for development using a developer including an organic solvent. Here, being used for organic solvent development means applications provided for at least a step of carrying out development using a developer including an organic solvent.

The composition used in the step (1) of the present invention includes a resin (resin (A)) having an acid-decomposable repeating unit capable of decomposing by the action of an acid to generate an acid having a pKa of 3.0 or less.

[Resin (A)]

The resin (A) has an acid-decomposable repeating unit capable of decomposing by the action of an acid to generate an acid having a pKa of 3.0 or less. By incorporation of such the repeating unit, the resin (A) exhibits properties in which the solubility in an organic solvent decreases by the action of an acid. Further, it is preferable that the resin (A) does not contain a fluorine atom. Since the fluorine atom has a high solubility in the solvent, swelling can be suppressed by incorporation of no fluorine atom.

Hereafter, the acid-decomposable repeating unit capable of decomposing by the action of an acid to generate an acid having a pKa of 3.0 or less is also referred to as a "repeating unit (a)".

Furthermore, the value of the pKa is a value determined by calculation using ACD/LABs pKaDB (FUJITSU LIMITED) with respect to a monomer corresponding to the repeating unit serving as an acid.

(Repeating Unit (a))

Preferred examples of the acid generated by decomposition of a part of the repeating unit (a) by the action of an acid include sulfonic acid, phosphoric acid, and phosphonic acid, with sulfonic acid being more preferable. The pKa of the generated acid is preferably 2.5 or less, and more preferably 2.0 or less.

It is preferable that the repeating unit (a) has a group in which a hydrogen atom in the acid having a pKa of 3.0 or less is substituted with a group capable of leaving with an acid, and it is more preferable that this group is contained in the side chain.

Examples of the group capable of leaving by an action of an acid include —$C(R_{36})(R_{37})(R_{38})$, —$C(R_{36}R_{37})(OR_{39})$, —$C(R_{01})(R_{02})(OR_{39})$, —$C(=O)$—O—$C(R_{36})(R_{37})(R_{38})$, —$C(R_{01})(R_{02})$—$C(=O)$—O—$C(R_{36})(R_{37})(R_{38})$, and —$CH(R_{36})(Ar)$.

In the formulae, $R_{36}$ to $R_{39}$ each independently represent an alkyl group, a cycloalkyl group, an aryl group, a group formed by combining an alkylene group with an aryl group, or an alkenyl group. $R_{36}$ and $R_{37}$ may be bonded to each other to form a ring.

$R_{01}$ and $R_{02}$ each independently represent a hydrogen atom, an alkyl group, a cycloalkyl group, an aryl group, a group formed by combining an alkylene group with an aryl group, or an alkenyl group.

Ar represents an aryl group.

The alkyl group of each of $R_{36}$ to $R_{39}$, $R_{01}$, and $R_{02}$ may be linear or branched, and is preferably an alkyl group having 1 to 8 carbon atoms, and examples thereof include a methyl group, an ethyl group, a propyl group, an n-butyl group, a sec-butyl group, a hexyl group, and an octyl group.

The cycloalkyl group of each of $R_{36}$ to $R_{39}$, $R_{01}$, and $R_{02}$ may be monocyclic or polycyclic. As the monocyclic cycloalkyl group, a cycloalkyl group having 3 to 10 carbon atoms is preferable, and examples thereof include a cyclopropyl group, a cyclobutyl group, a cyclopentyl group, a cyclohexyl group, and a cyclooctyl group. As the polycyclic cycloalkyl group, a cycloalkyl group having 6 to 20 carbon atoms is preferable, and examples thereof include an adamantyl group, a norbornyl group, an isobornyl group, a camphanyl group, a dicyclopentyl group, an α-pinel group, a tricyclodecanyl group, a tetracyclododecyl group, and an androstanyl group. In addition, some of the carbon atoms in the cycloalkyl group may be substituted with heteroatoms such as an oxygen atom.

The aryl group of each of $R_{36}$ to $R_{39}$, $R_{01}$, $R_{02}$, and Ar is preferably an aryl group having 6 to 10 carbon atoms and examples thereof include aryl groups such as a phenyl group, a naphthyl group, and an anthryl group, and divalent aromatic cyclic groups containing a heterocycle, such as thiophene, furan, pyrrole, benzothiophene, benzofuran, benzopyrrole, triazine, imidazole, benzimidazole, triazole, thiadiazole, and thiazole.

The group formed by combining the alkylene group with an aryl group of each of $R_{36}$ to $R_{39}$, $R_{01}$, and $R_{02}$ is preferably an aralkyl group having 7 to 12 carbon atoms, and examples thereof include a benzyl group, a phenethyl group, and a naphthylmethyl group.

The alkenyl group of $R_{36}$ to $R_{39}$, $R_{01}$, and $R_{02}$ is preferably an alkenyl group having 2 to 8 carbon atoms, and examples thereof include a vinyl group, an allyl group, a butenyl group, and a cyclohexenyl group.

A ring which can be formed by the mutual bonding of $R_{36}$ and $R_{37}$ may be monocyclic or polycyclic. The monocycle is preferably a cycloalkyl structure having 3 to 10 carbon atoms, and examples thereof include a cyclopropane structure, a cyclobutane structure, a cyclopentane structure, a cyclohexane structure, a cycloheptane structure, and a cyclooctane structure. The polycycle is preferably a cycloalkyl structure having 6 to 20 carbon atoms, and examples thereof include an adamantane structure, a norbornane structure, a dicyclopentane structure, a tricyclodecane structure, and a tetracyclododecane structure. Further, some of the carbon atoms in the cycloalkyl structure may be substituted with heteroatoms such as an oxygen atom.

The respective groups of $R_{36}$ to $R_{39}$, $R_{01}$, $R_{02}$, and Ar may have a substituent, and examples of the substituent include an alkyl group, a cycloalkyl group, an aryl group, an amino group, an amido group, a ureido group, a urethane group, a hydroxyl group, a carboxyl group, a halogen atom, an alkoxy group, a thioether group, an acyl group, an acyloxy group, an alkoxycarbonyl group, a cyano group, and a nitro group. These substituents preferably have 8 or less carbon atoms.

The resin (A) may have a repeating unit having a group capable of decomposing by the action of an acid to generate a polar group, in addition to the repeating unit (a), and examples thereof include a repeating unit represented by General Formula (VI).

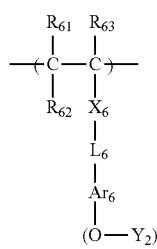

(VI)

In General Formula (VI), $R_{61}$, $R_{62}$, and $R_{63}$ each independently represent a hydrogen atom, an alkyl group, a cycloalkyl group, a halogen atom, a cyano group, or an alkoxycarbonyl group. However, $R_{62}$ may be bonded to $Ar_6$ to form a ring, and $R_{62}$ in this case represents a single bond or an alkylene group.

$X_6$ represents a single bond, —COO—, or —CONR$_{64}$—, and $R_{64}$ represents a hydrogen atom or an alkyl group.

$L_6$ represents a single bond or an alkylene group.

$Ar_6$ represents an (n+1)-valent aromatic cyclic group, and in a case of being bonded to $R_{62}$ to form a ring, represents an (n+2)-valent aromatic cyclic group.

In a case of n≥2, $Y_2$'s each independently represent a hydrogen atom or a group capable of leaving by the action of an acid. However, at least one of $Y_2$'s represents a group capable of leaving by the action of an acid.

n represents an integer of 1 to 4.

General Formula (VI) will be described in more detail.

$R_{61}$ to $R_{63}$ in General Formula (VI) have the same definitions as $R_{51}$, $R_{52}$, and $R_{53}$, respectively, in General Formula (V) which will be described later, and preferred ranges thereof are also the same.

In a case where $R_{62}$ represents an alkylene group, preferred examples of the alkylene group include alkylene groups having 1 to 8 carbon atoms, such as a methylene group, an ethylene group, a propylene group, a butylene group, a hexylene group, and an octylene group, which may have a substituent.

Examples of the alkyl group of $R_{64}$ in —CONR$_{64}$— ($R_{64}$ represents a hydrogen atom or an alkyl group) represented by $X_6$ include the same alkyl group as that in each of $R_{61}$ to $R_{63}$.

$X_6$ is preferably a single bond, —COO—, or —CONH—, and more preferably a single bond or —COO—.

The alkylene group in $L_6$ is preferably an alkylene group having 1 to 8 carbon atoms, such as a methylene group, an ethylene group, a propylene group, a butylene group, a hexylene group, and an octylene group, which may have a substituent. The ring formed by the bonding of $R_{62}$ and $L_6$ is particularly preferably a 5- or 6-membered ring.

$Ar_6$ represents an (n+1)-valent aromatic cyclic group. The divalent aromatic cyclic group in a case where n is 1 may have a substituent, and preferred examples of the divalent aromatic cyclic group include an arylene group having 6 to 18 carbon atoms, such as a phenylene group, a tolylene group, and a naphthylene group, and divalent aromatic cyclic groups containing a heterocycle, such as thiophene, furan, pyrrole, benzothiophene, benzofuran, benzopyrrole, triazine, imidazole, benzimidazole, triazole, thiadiazole, and thiazole.

Specific suitable examples of the (n+1)-valent aromatic cyclic group in a case where n is an integer of 2 or more include the groups formed by removing arbitrary (n−1) hydrogen atoms from the above-described specific examples of the divalent aromatic cyclic group.

The (n+1)-valent aromatic cyclic group may further have a substituent.

Specific examples of the substituent that the above-described alkyl group, cycloalkyl group, alkoxycarbonyl group, alkylene group, and (n+1)-valent aromatic cyclic group may have are the same as those of the substituent that the groups represented by $R_{51}$ to $R_{53}$ in General Formula (V) may have.

n is preferably 1 or 2, and more preferably 1.

n $Y_2$'s each independently represent a hydrogen atom or a group capable of leaving by the action of an acid. However, at least one of n $Y_2$ represents a group capable of leaving by the action of an acid.

In the formulae, $R_{36}$ to $R_{39}$ each independently represent an alkyl group, a cycloalkyl group, an aryl group, a group formed by combining an alkylene group with an aryl group, or an alkenyl group. $R_{36}$ and $R_{37}$ may be bonded to each other to form a ring.

$R_{01}$ and $R_{02}$ each independently represent a hydrogen atom, an alkyl group, a cycloalkyl group, an aryl group, a group formed by combining an alkylene group with an aryl group, or an alkenyl group.

The resin (A) may have a repeating unit (a) having another acid-decomposable group capable of decomposing by the action of an acid. Such the repeating unit (a) including an acid-decomposable group is preferably a repeating unit represented by General Formula (V).

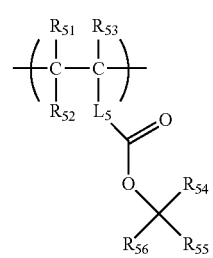

(V)

In General Formula (V), $R_{51}$, $R_{52}$, and $R_{53}$ each independently represent a hydrogen atom, an alkyl group, a cycloalkyl group, a halogen atom, a cyano group, or an alkoxycarbonyl group. $R_{52}$ may be bonded to $L_5$ to form a ring, and $R_{52}$ in this case represents an alkylene group.

$L_5$ represents a single bond or a divalent linking group, and in a case of being bonded to $R_{52}$ to form a ring, it represents a trivalent linking group.

$R_{54}$ represents an alkyl group, $R_{55}$ and $R_{56}$ each independently represent a hydrogen atom, an alkyl group, a cycloalkyl group, an aryl group, or an aralkyl group, and $R_{55}$ and $R_{56}$ may be bonded to each other to form a ring. However, $R_{55}$ and $R_{56}$ do not represent a hydrogen atom at the same time in any case.

General Formula (V) will be described in more detail.

Examples of the alkyl group of each of $R_{51}$ to $R_{53}$ in General Formula (V) preferably include an alkyl group having 20 or less carbon atoms, such as a methyl group, an ethyl group, a propyl group, an isopropyl group, an n-butyl group, a sec-butyl group, a hexyl group, a 2-ethylhexyl group, an octyl group, and a dodecyl group, which may have a substituent, more preferably include an alkyl group having 8 or less carbon atoms, and particularly preferably include an alkyl group having 3 or less carbon atoms.

The alkyl group included in an alkoxycarbonyl group is preferably the same alkyl group as that in each of $R_{51}$ to $R_{53}$ described above.

The cycloalkyl group may be monocyclic or polycyclic. Preferred examples thereof include a monocyclic cycloalkyl group having 3 to 10 carbon atoms, such as a cyclopropyl group, a cyclopentyl group, and a cyclohexyl group, which may have a substituent.

Examples of the halogen atom include a fluorine atom, a chlorine atom, a bromine atom and an iodine atom, with the fluorine atom being particularly preferable.

Preferred examples of the substituent in each group described above can include an alkyl group, a cycloalkyl group, an aryl group, an amino group, an amido group, a ureido group, a urethane group, a hydroxyl group, a carboxyl group, a halogen atom, an alkoxy group, a thioether group, an acyl group, an acyloxy group, an alkoxycarbonyl group, a cyano group, and a nitro group, and the substituent preferably has 8 or less carbon atoms.

Furthermore, in a case where $R_{52}$ represents an alkylene group and is bonded to $L_5$ to form a ring, preferred examples of the alkylene group include an alkylene group having 1 to 8 carbon atoms, such as a methylene group, an ethylene group, a propylene group, a butylene group, a hexylene group, and an octylene group. The alkylene group is more preferably an alkylene group having 1 to 4 carbon atoms, and particularly preferably an alkylene group having 1 or 2 carbon atoms. A ring formed by the bonding of $R_{52}$ and $L_5$ is particularly preferably a 5- or 6-membered ring.

$R_{51}$ and $R_{53}$ in Formula (V) are each more preferably a hydrogen atom, an alkyl group, or a halogen atom, and particularly preferably a hydrogen atom, a methyl group, an ethyl group, a trifluoromethyl group (—CF$_3$), a hydroxymethyl group (—CH$_2$—OH), a chloromethyl group (—CH$_2$—Cl), or a fluorine atom (—F). $R_{52}$ is more preferably a hydrogen atom, an alkyl group, a halogen atom, or an alkylene group (which is bonded to $L_5$ to form a ring), and particularly preferably a hydrogen atom, a methyl group, an ethyl group, a trifluoromethyl group (—CF$_3$), a hydroxymethyl group (—CH$_2$—OH), a chloromethyl group (—CH$_2$—Cl), a fluorine atom (—F), a methylene group (which is bonded to $L_5$ to form a ring), or an ethylene group (which is bonded to $L_5$ to form a ring).

Examples of the divalent linking group represented by $L_5$ include an alkylene group, a divalent aromatic cyclic group, —COO-$L_1$-, —O-$L_1$-, and a group formed by combining two or more thereof. Here, $L_1$ represents an alkylene group, a cycloalkylene group, a divalent aromatic cyclic group, and a group formed by combining an alkylene group with a divalent aromatic cyclic group.

$L_5$ is preferably a single bond, a group represented by —COO-$L_1$-, or a divalent aromatic cyclic group. $L_1$ is preferably an alkylene group having 1 to 5 carbon atoms, and more preferably a methylene group or a propylene group. The divalent aromatic cyclic group is preferably a 1,4-phenylene group, a 1,3-phenylene group, a 1,2-phenylene group, or a 1,4-naphthylene group, and more preferably a 1,4-phenylene group.

Suitable examples of the trivalent linking group represented by $L_5$ in a case where $L_5$ is bonded to $R_{52}$ to form a ring include a group obtained by eliminating arbitrary one hydrogen atom from the above-described specific examples of the divalent linking group represented by $L_5$.

The alkyl group of each of $R_{54}$ to $R_{56}$ is preferably an alkyl group having 1 to 20 carbon atoms, more preferably an alkyl group having 1 to 10 carbon atoms, and particularly preferably an alkyl group having 1 to 4 carbon atoms, such as a methyl group, an ethyl group, an n-propyl group, an isopropyl group, an n-butyl group, an isobutyl group, and a t-butyl group.

The cycloalkyl group represented by each of $R_{55}$ and $R_{56}$ is preferably a cycloalkyl group having 3 to 20 carbon atoms, may be a cycloalkyl group which is monocyclic, such as a cyclopentyl group and a cyclohexyl group, and may be a cycloalkyl group which is polycyclic, such as a norbornyl group, an adamantyl group, a tetracyclodecanyl group, and a tetracyclododecanyl group.

Furthermore, the ring formed by the mutual bonding of $R_{55}$ and $R_{56}$ is preferably a ring having 3 to 20 carbon atoms, may be monocyclic, such as a cyclopentyl group and a cyclohexyl group, and may be the ring which is polycyclic, such as a norbornyl group, an adamantyl group, a tetracyclodecanyl group, and a tetracyclododecanyl group. In a case where $R_{55}$ and $R_{56}$ are bonded to each other to form a ring, $R_{54}$ is preferably an alkyl group having 1 to 3 carbon atoms, and more preferably a methyl group or an ethyl group.

The aryl group represented by each of $R_{55}$ and $R_{56}$ is preferably an aryl group having 6 to 20 carbon atoms, may be monocyclic or polycyclic, or may have a substituent. Examples thereof include a phenyl group, a 1-naphthyl group, a 2-naphthyl group, a 4-methylphenyl group, and a 4-methoxyphenyl group. In a case where any one of $R_{55}$ and $R_{56}$ is a hydrogen atom, the other is preferably an aryl group.

The aralkyl group represented by each of $R_{55}$ and $R_{56}$ may be monocyclic or polycyclic, or may have a substituent. The aralkyl group preferably has 7 to 21 carbon atoms, and examples thereof include a benzyl group and a 1-naphthylmethyl group.

The side chain structure included in the repeating unit (a) is preferably represented by General Formula (S).

-L-SO$_3$—W$^1$                                       General Formula (S):

(In the formula, W$^1$ represents a group capable of leaving by an acid, and L represents a linking group formed of a polyvalent non-metal atom which is necessary to link a structural unit represented by General Formula (S) to a polymer skeleton.)

That is, in General Formula (S), the moiety represented by -L-SO$_3$— represents a moiety capable of generating a sulfonic acid group as the leaving group represented by W$^1$ at the terminal leaves, L is a polyvalent linking group formed of a non-metal atom, and more specific examples of the moiety include those configured by the combination of the following structural units.

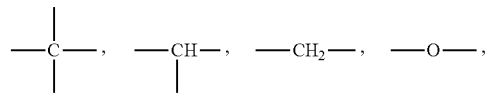

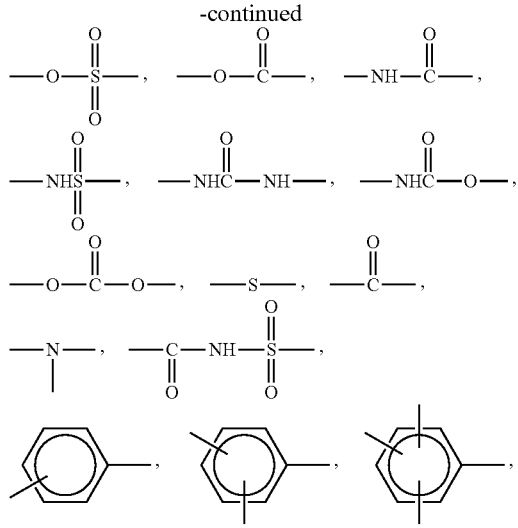

Polyvalent naphthalene, Polyvalent anthracen

In a case where the polyvalent linking group has a substituent, as the substituent, for example, an alkyl group having 1 to 20 carbon atoms, such as methyl and ethyl; an aryl group having 6 to 16 carbon atoms, such as phenyl and naphthyl; a hydroxyl group; a carboxyl group; a sulfonamido group; an N-sulfonylamido group; an acyloxy group having 1 to 6 carbon atoms, such as an acetoxy group; an alkoxy group having 1 to 6 carbon atoms, such as methoxy and ethoxy; a halogen atom such as chlorine and bromine; an alkoxycarbonyl group having 2 to 7 carbon atoms, such as methoxycarbonyl, ethoxycarbonyl, and cyclohexyloxycarbonyl; a cyano group; a carbonic ester group such as t-butyl carbonate; or the like can be used. Further, $W^1$ represents a terminal group capable of leaving by the acid, and is selected from an ester group, a ketal group, a thioketal group, an acetal group, and a tertiary alcohol group.

The acid-decomposable repeating unit (a) capable of decomposing by the action of an acid to generate an acid having a pKa of 3.0 or less is preferably a repeating unit represented by General Formula (1-1), General Formula (1-2), or General Formula (1-3), and more preferably a repeating unit represented by General Formula (1-1).

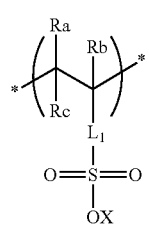

(1-1)

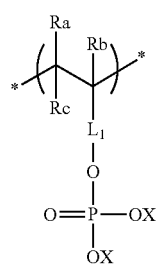

(1-2)

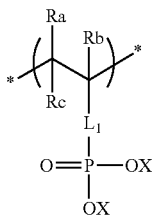

(1-3)

In the formulae,

Ra and Rb each independently represent a hydrogen atom, an alkyl group, or a cyano group.

Rc represents a hydrogen atom or a substituent.

$L_1$ represents a single bond or a linking group.

In a case where Rc is the substituent and $L_1$ is the linking group, Rc and $L_1$ may be bonded to each other to form a ring.

X represents a group capable of leaving by the action of an acid.

The group represented by X preferably has the total number of carbon atoms and oxygen atoms of 4 or less.

It is preferable that the total number of carbon atoms and oxygen atoms in the group represented by X is 4 or less since in a case where the group leaves by the action of an acid, occurrence of film reduction by the shrinkage of the pattern can be effectively prevented, and as a result, high resolution can be obtained.

Each of Ra and Rb represents a hydrogen atom, an alkyl group, or a cyano group, as described above. This alkyl group may further have a substituent. Examples of this substituent include a halogen atom such as a fluorine atom and a chlorine atom, and a hydroxy group. Examples of the alkyl group of Ra or Rb include a methyl group, a chloromethyl group, a trifluoromethyl group, and a hydroxymethyl group. Each of Ra and Rb is preferably a hydrogen atom or a methyl group, and more preferably a hydrogen atom.

Rc represents a hydrogen atom or a substituent, as described above. Examples of this substituent include an alkyl group, a cycloalkyl group, an alkenyl group, an alkynyl group, an aryl group, an alkanolyl group, an alkoxycarbonyl group, an aryloxycarbonyl group, an alkylsulfonyl group, an arylsulfonyl group, an alkylthiocarbonyl group, an arylthiocarbonyl group, a heterocyclic group, a (di)alkylaminocarbonyl group, and an aminothiocarbonyl group.

$L_1$ represents a single bond or a linking group, as described above.

This linking group is preferably an arylene group, an alkylene group, a cycloalkylene group, —O—, —S—, —SO₂—, —CO—, —N($R_{33}$)—, or a combination thereof. This linking group is more preferably a single bond, an arylene group, an alkylene group, —O—, —SO₂—, —CO—, —N($R_{33}$)—, or a combination thereof. Here, $R_{33}$ represents a hydrogen atom, an alkyl group, a cycloalkyl group, an alkenyl group, an aryl group, or an aralkyl group.

As described above, Rc and $L_1$ may be bonded to each other to form a ring. Examples of this ring include a monocyclic hydrocarbon, a fused polycyclic hydrocarbon, and a heterocycle.

In a case where the acid-decomposable repeating unit is represented by General Formula (1-1), the acid having a pKa of 3.0 or less, generated upon decomposition by the action of an acid, includes a structural unit represented by General Formula (1-1').

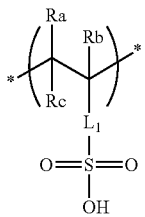
(1-1')

In the formula,

Ra and Rb each independently represent a hydrogen atom, an alkyl group, or a cyano group.

Rc represents a hydrogen atom or a substituent.

$L_1$ represents a single bond or a linking group. In a case where Rc is the substituent and $L_1$ is the linking group, Rc and $L_1$ may be bonded to each other to form a ring.

Specific examples and preferred ranges of Ra, Rb, Rc, and $L_1$ are the same as the specific examples and the preferred ranges of Ra, Rb, Rc, and $L_1$ in General Formula (1-1), respectively.

The structure including Ra, Rb, Rc, and $L_1$ in General Formulae (1-1) and (1-1') (a moiety other than $SO_3X$ or $SO_3H$ and a structure represented by General Formula (1-1-1). Ra, Rb, Rc, and $L_1$ have the same definitions as those in General Formula (1-1), respectively) is preferably a structure represented by General Formula (III-1), (III-2), (III-3), (IV-1), (IV-2), or (V-1). Among these, a configuration represented by General Formula (III-1) or (III-2) is particularly preferable.

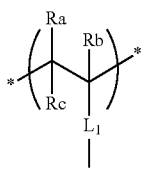
(1-1-1)

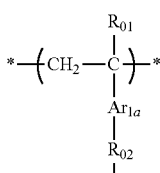
(III-1)

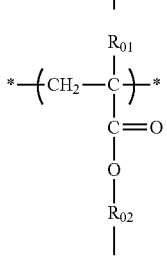
(III-2)

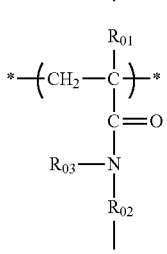
(III-3)

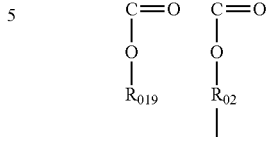
(IV-1)

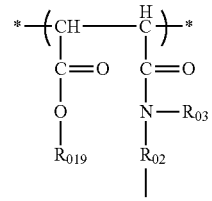
(IV-2)

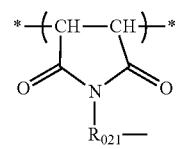
(V-1)

In the formulae, $Ar_{1a}$ represents an arylene group.

$R_{01}$ represents a hydrogen atom, an alkyl group, or a cyano group. This alkyl group may further have a substituent. Examples of this substituent include a halogen atom such as a fluorine atom and a chlorine atom. Examples of the alkyl group of $R_{01}$ include a methyl group, a chloromethyl group, and a trifluoromethyl group. $R_{01}$ is preferably a hydrogen atom or a methyl group, and more preferably a hydrogen atom.

Each of $R_{02}$ and $R_{021}$ represents a single bond or a divalent linking group. This divalent linking group is, for example, an arylene group, an alkylene group, a cycloalkylene group, —O—, —S—, —$SO_2$—, —CO—, —N($R_{33}$)—, or a combination thereof. Here, $R_{33}$ represents a hydrogen atom, an alkyl group, a cycloalkyl group, an alkenyl group, an aryl group, or an aralkyl group.

The arylene group as $R_{02}$ or $R_{021}$ preferably has 6 to 14 carbon atoms, and specific examples thereof include a phenylene group, a tolylene group, and a naphthylene group. This arylene group may further have a substituent.

The alkylene group as $R_{02}$ or $R_{021}$ is preferably an alkylene group having 1 to 8 carbon atoms, such as a methylene group, an ethylene group, a propylene group, a butylene group, a hexylene group, and an octylene group. This alkylene group may further have a substituent.

The cycloalkylene group as $R_{02}$ or $R_{021}$ is preferably a cycloalkylene group having 5 to 8 carbon atoms, such as a cyclopentylene group and a cyclohexylene group. This cycloalkylene group may further have a substituent.

$R_{03}$ and $R_{019}$ each independently represent a hydrogen atom, an alkyl group, a cycloalkyl group, an aryl group, or an aralkyl group.

The alkyl group as $R_{03}$ or $R_{019}$ is preferably an alkyl group having 20 or less carbon atoms, such as methyl group, an ethyl group, a propyl group, an isopropyl group, an n-butyl group, a sec-butyl group, a hexyl group, a 2-ethylhexyl group, an octyl group and dodecyl group, and more preferably an alkyl group having 8 or less carbon atoms.

The cycloalkyl group as $R_{03}$ or $R_{019}$ may be monocyclic or polycyclic. Examples of this cycloalkyl group include a monocyclic cycloalkyl group having 3 to 8 carbon atoms, such as a cyclopropyl group, a cyclopentyl group, and a cyclohexyl group.

The aryl group as $R_{03}$ or $R_{019}$ is preferably an aryl group having 6 to 15 carbon atoms. Examples of such the aryl group include a phenyl group, a tolyl group, a naphthyl group, and an anthryl group.

The aralkyl group as $R_{03}$ or $R_{019}$ is preferably an aralkyl group having 6 to 20 carbon atoms. Examples of such the aralkyl group include a benzyl group and a phenethyl group.

Each of these alkyl, cycloalkyl, aryl, and aralkyl groups may have a substituent. Examples of this substituent include a hydroxyl group; a halogen atom such as fluorine, chlorine, bromine, and iodine atoms; nitro group; cyano group; amido group; a sulfonamido group; an alkyl group such as a methyl group, an ethyl group, a propyl group, an isopropyl group, an n-butyl group, a sec-butyl group, a hexyl group, a 2-ethylhexyl group, an octyl group, and dodecyl group; an alkoxy group such as a methoxy group, an ethoxy group, a hydroxy ethoxy group, a propoxy group, a hydroxypropoxy group, and a butoxy group; an alkoxycarbonyl group such as a methoxycarbonyl group and an ethoxycarbonyl group; an acyl group such as a formyl group, an acetyl group, and a benzoyl group; an acyloxy group such as an acetoxy group and a butyryloxy group; and a carboxy group. Further, these substituents preferably have 8 or less carbon atoms.

The arylene group as $Ar_{1a}$ preferably has 6 to 14 carbon atoms. Examples of such the arylene group include a phenylene group, a tolylene group, and a naphthylene group.

This arylene group may have a substituent. Examples of this substituent include the same substituents as those described for $R_{03}$ and $R_{019}$ above.

Examples of a preferred partial structure of General Formulae (1-1) and (1-1') (a partial structure other than X or H and a partial structure represented by General Formula (1-1-2). Ra, Rb, Rc, and $L_1$ have the same definitions as those in General Formula (1-1), respectively) include the following ones.

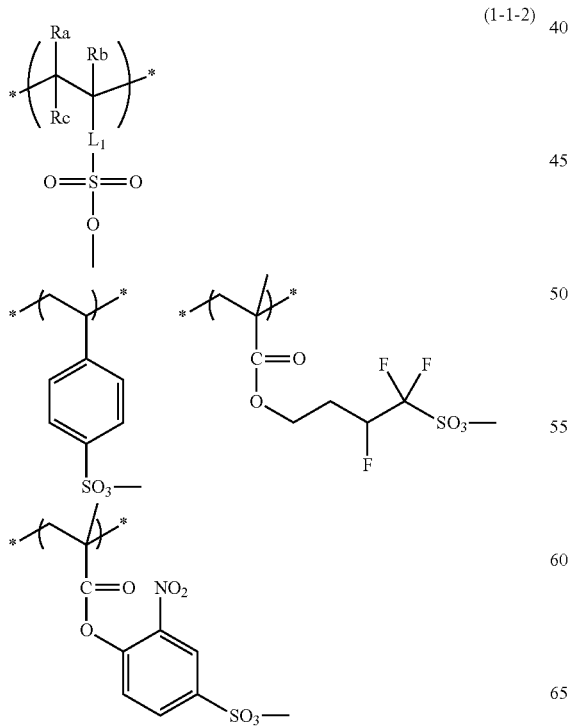

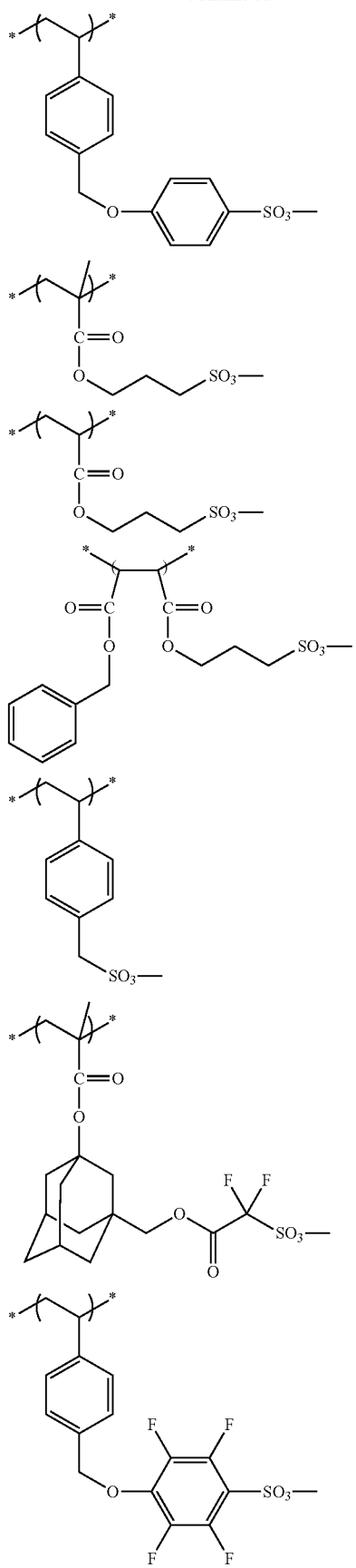

17
-continued
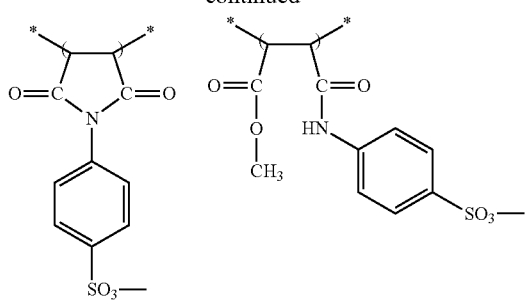
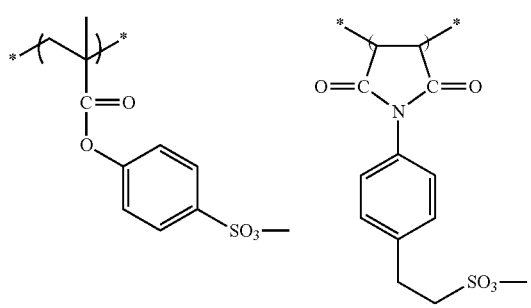
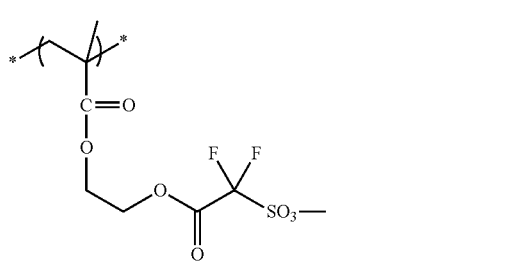
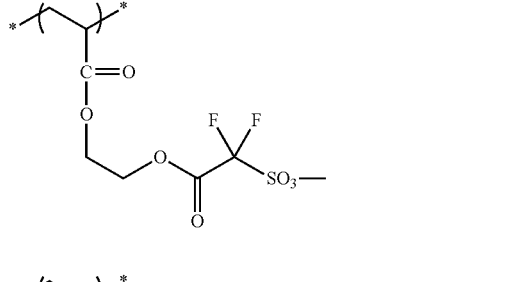
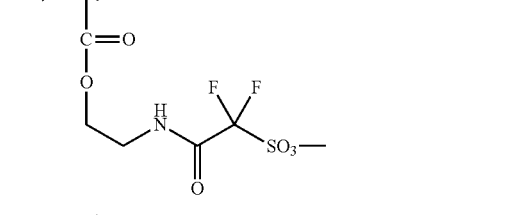
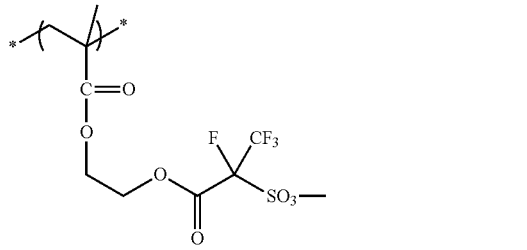
18
-continued
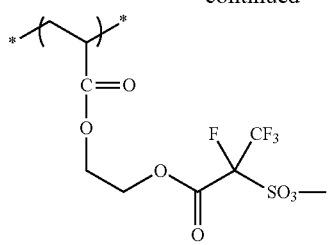
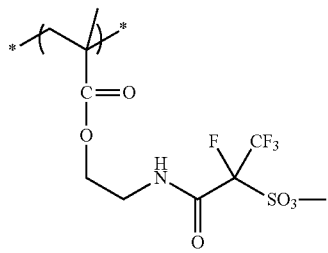
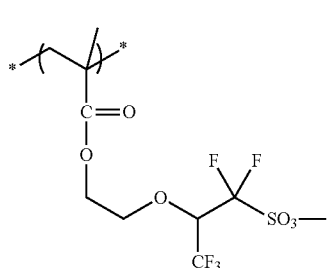
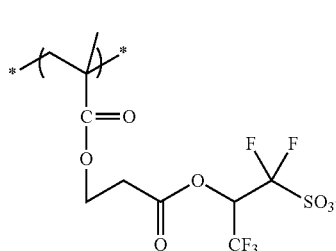
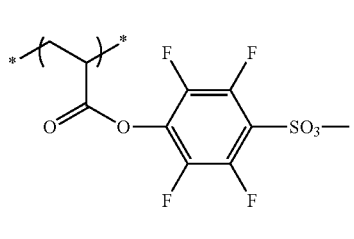
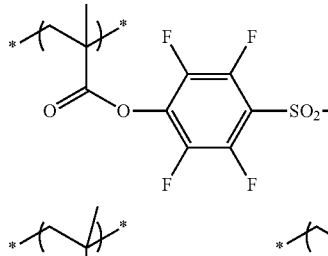

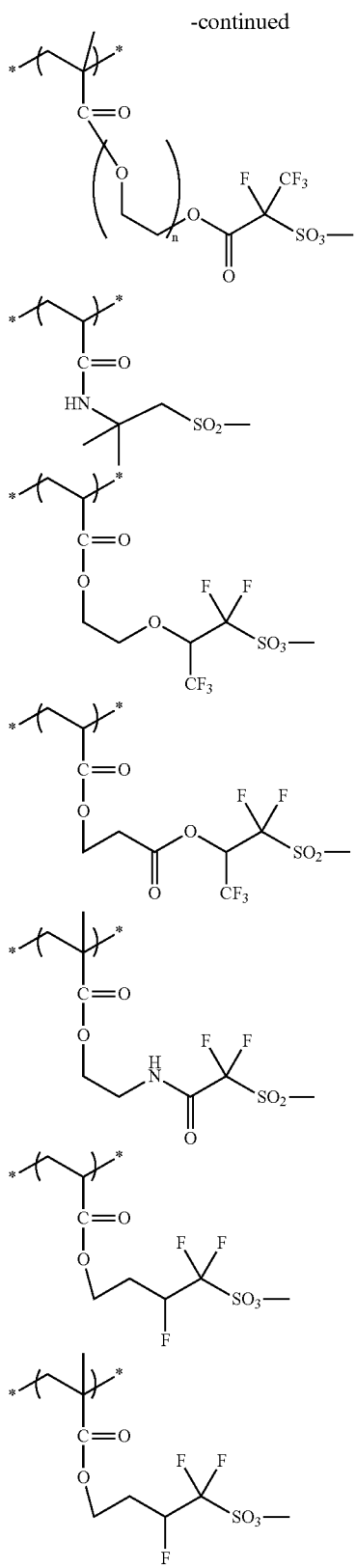

Moreover, the repeating unit (a) preferably includes an acetal structure.

The present inventors have found that a resin including the repeating unit (a) having an acetal structure has high acid amplifying ability and stability. The reason therefor is not necessarily clear, but the present inventors guess as follows. That is, excellent acid amplifying ability is presumed to be caused by the ease in a deprotection reaction of an acetal in the presence of an acid and/or a β leaving reaction. Further, excellent stability is presumed to be caused by the degree of heat stability of the acetal structure.

Therefore, in a case where a resin including the repeating unit (a) having an acetal structure is used, it is possible to obtain a composition which is excellent in both sensitivity and temporal stability. That is, in this manner, it is possible to establish both excellent sensitivity and excellent temporal stability.

The repeating unit (a) more preferably includes a structural unit represented by General Formula (I-AC).

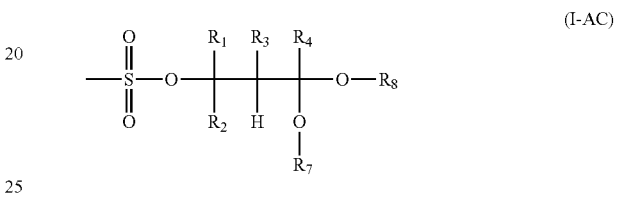

In the formula, each of $R_1$ to $R_4$ represents a hydrogen atom or a substituent. Two or more of $R_1$ to $R_4$ may be bonded to each other to form a ring structure.

Examples of the substituent represented by $R_1$ to $R_4$ include an alkyl group, a cycloalkyl group, an alkenyl group, an alkynyl group, an aryl group, a halogen atom, an alkoxy group, an aryloxy group, an alkanolyl group, an alkoxycarbonyl group, an aryloxycarbonyl group, an alkylsulfonyloxy group, an arylsulfonyloxy group, an alkylsulfonyl group, an arylsulfonyl group, a cyano group, an alkylthioxy group, an arylthioxy group, and a heterocyclic group.

Each of $R_1$ to $R_3$ is preferably a hydrogen atom, an alkyl group, or an alkoxy group.

$R_4$ is preferably a hydrogen atom, an alkyl group, an aryl group, or a cyano group.

The alkyl group is preferably an alkyl group having 1 to 30 carbon atoms, and examples thereof include a methyl group, an ethyl group, a propyl group, a butyl group, a hexyl group, an octyl group, a decyl group, a dodecyl group, an octadecyl group, an isopropyl group, an isobutyl group, a sec-butyl group, a t-butyl group, a 1-ethylpentyl group, a trifluoromethyl group, a 2-ethylhexyl group, a phenacyl group, a 1-naphthoylmethyl group, a 2-naphthoylmethyl group, a 4-methylsulfanylphenacyl group, a 4-phenylsulfanylphenacyl group, a 4-dimethylaminophenacyl group, a 4-cyanophenacyl group, a 4-methylphenacyl group, a 2-methylphenacyl group, a 3-fluorophenacyl group, a 3-trifluoromethylphenacyl group, and a 3-nitrophenacyl group.

The cycloalkyl group may have a monocycle or a polycycle. The cycloalkyl group having a monocycle is preferably a cyclopentyl group, a cyclohexyl group, a cyclooctyl group, or the like. The cycloalkyl group having a polycycle is preferably a norbornyl group, a tricyclodecanyl group, a tetracyclodecanyl group, a tetracyclododecanyl group, an adamantyl group, or the like. The cycloalkyl group is preferably a cycloalkyl group having 3 to 8 carbon atoms, and, more preferably, for example, a cyclopentyl group and a cyclohexyl group.

The alkenyl group is preferably an alkenyl group having 2 to 10 carbon atoms, and examples thereof include a vinyl group, an allyl group, and a styryl group.

The alkynyl group is preferably an alkynyl group having 2 to 10 carbon atoms, and examples thereof include an ethynyl group, a propynyl group, and a propargyl group.

The aryl group is preferably an aryl group having 6 to 30 carbon atoms, and examples thereof include a phenyl group, a biphenyl group, a 1-naphthyl group, a 2-naphthyl group, a 9-anthryl group, a 9-phenanthryl group, a 1-pyrenyl group, a 5-naphthacenyl group, a 1-indenyl group, a 2-azulenyl group, a 9-fluorenyl group, a terphenyl group, a quaterphenyl group, an o-, m-, or p-tolyl group, a xylyl group, an o-, m-, or p-cumenyl group, a mesityl group, a pentalenyl group, a binaphthalenyl group, a ternaphthalenyl group, a quaternaphthalenyl group, a heptalenyl group, a biphenylenyl group, an indacenyl group, a fluoranthenyl group, an acenaphthylenyl group, an aceanthrylenyl group, a phenalenyl group, a fluorenyl group, an anthryl group, a bianthracenyl group, a teranthracenyl group, a quateranthracenyl group, an anthraquinolyl group, a phenanthryl group, a triphenylenyl group, a pyrenyl group, a chrysenyl group, a naphthacenyl group, a pleiadenyl group, a picenyl group, a perylenyl group, a pentaphenyl group, a pentacenyl group, a tetraphenylenyl group, a hexaphenyl group, a hexacenyl group, a rubicenyl group, a coronenyl group, a trinaphthylenyl group, a heptaphenyl group, a heptacenyl group, a pyranthrenyl group, and an ovalenyl group.

The halogen atom includes a fluorine atom, a chlorine atom, a bromine atom, and an iodine atom.

Examples of the alkoxy group include a methoxy group, an ethoxy group, a propoxy group, an n-butoxy group, a trifluoromethoxy group, a hexyloxy group, a t-butoxy group, a 2-ethylhexyloxy group, a cyclohexyloxy group, a decyloxy group, and a dodecyloxy group.

Examples of the aryloxy group include a phenyloxy group, a 1-naphthyloxy group, a 2-naphthyloxy group, a tolyloxy group, a methoxyphenyloxy group, a naphthyloxy group, a chlorophenyloxy group, a trifluoromethylphenyloxy group, a cyanophenyloxy group, and a nitrophenyloxy group.

The alkanoyl group is preferably an alkanoyl group having 2 to 20 carbon atoms, and examples thereof include an acetyl group, a propanoyl group, a butanoyl group, a trifluoromethylcarbonyl group, a pentanoyl group, a benzoyl group, a 1-naphthoyl group, a 2-naphthoyl group, a 4-methylsulfanylbenzoyl group, a 4-phenylsulfanylbenzoyl group, a 4-dimethylaminobenzoyl group, a 4-diethylaminobenzoyl group, a 2-chlorobenzoyl group, a 2-methylbenzoyl group, a 2-methoxybenzoyl group, a 2-butoxybenzoyl group, a 3-chlorobenzoyl group, a 3-trifluoromethylbenzoyl group, a 3-cyanobenzoyl group, a 3-nitrobenzoyl group, a 4-fluorobenzoyl group, a 4-cyanobenzoyl group, and a 4-methoxybenzoyl group.

The alkoxycarbonyl group is preferably an alkoxycarbonyl group having 2 to 20 carbon atoms, and examples thereof include a methoxycarbonyl group, an ethoxycarbonyl group, a propoxycarbonyl group, a butoxycarbonyl group, a hexyloxycarbonyl group, an octyloxycarbonyl group, a decyloxycarbonyl group, an octadecyloxycarbonyl group, and a trifluoromethyloxycarbonyl group.

Examples of the aryloxycarbonyl group include a phenoxycarbonyl group, a 1-naphthyloxycarbonyl group, a 2-naphthyloxycarbonyl group, a 4-methylsulfanylphenyloxycarbonyl group, a 4-phenylsulfanylphenyloxycarbonyl group, a 4-dimethylaminophenyloxycarbonyl group, a 4-diethylaminophenyloxycarbonyl group, a 2-chlorophenyloxycarbonyl group, a 2-methylphenyloxycarbonyl group, a 2-methoxyphenyloxycarbonyl group, a 2-butoxyphenyloxycarbonyl group, a 3-chlorophenyloxycarbonyl group, a 3-trifluoromethylphenyloxycarbonyl group, a 3-cyanophenyloxycarbonyl group, a 3-nitrophenyloxycarbonyl group, a 4-fluorophenyloxycarbonyl group, a 4-cyanophenyloxycarbonyl group, and a 4-methoxyphenyloxycarbonyl group.

The alkylsulfonyloxy group is preferably an alkylsulfonyloxy group having 1 to 20 carbon atoms, and examples thereof include a methylsulfonyloxy group, an ethylsulfonyloxy group, a propylsulfonyloxy group, an isopropylsulfonyloxy group, a butylsulfonyloxy group, a hexylsulfonyloxy group, a cyclohexylsulfonyloxy group, an octylsulfonyloxy group, a 2-ethylhexylsulfonyloxy group, a decanoylsulfonyloxy group, a dodecanoylsulfonyloxy group, an octadecanoylsulfonyloxy group, a cyanomethylsulfonyloxy group, a methoxymethylsulfonyloxy group, and a perfluoroalkylsulfonyloxy group.

The arylsulfonyloxy group is preferably an arylsulfonyloxy group having 6 to 30 carbon atoms, and examples thereof include a phenylsulfonyloxy group, a 1-naphthylsulfonyloxy group, a 2-naphthylsulfonyloxy group, a 2-chlorophenylsulfonyloxy group, a 2-methylphenylsulfonyloxy group, a 2-methoxyphenylsulfonyloxy group, a 2-butoxyphenylsulfonyloxy group, a 3-chlorophenylsulfonyloxy group, a 3-trifluoromethylphenylsulfonyloxy group, a 3-cyanophenylsulfonyloxy group, a 3-nitrophenylsulfonyloxy group, a 4-fluorophenylsulfonyloxy group, a 4-cyanophenylsulfonyloxy group, a 4-methoxyphenylsulfonyloxy group, a 4-methylsulfanylphenylsulfonyloxy group, a 4-phenylsulfanylphenylsulfonyloxy group, and a 4-dimethylaminophenylsulfonyloxy group.

The alkylsulfonyl group is preferably an alkylsulfonyl group having 1 to 20 carbon atoms, and examples thereof include a methylsulfonyl group, an ethylsulfonyl group, a propylsulfonyl group, an isopropylsulfonyl group, a butylsulfonyl group, a hexylsulfonyl group, a cyclohexylsulfonyl group, an octylsulfonyl group, a 2-ethylhexylsulfonyl group, a decanoylsulfonyl group, a dodecanoylsulfonyl group, an octadecanoylsulfonyl group, a cyanomethylsulfonyl group, a methoxymethylsulfonyl group, and a perfluoroalkylsulfonyl group.

The arylsulfonyl group is preferably an arylsulfonyl group having 6 to 30 carbon atoms, and examples thereof include a phenylsulfonyl group, a 1-naphthylsulfonyl group, a 2-naphthylsulfonyl group, a 2-chlorophenylsulfonyl group, a 2-methylphenylsulfonyl group, a 2-methoxyphenylsulfonyl group, a 2-butoxyphenylsulfonyl group, a 3-chlorophenylsulfonyl group, a 3-trifluoromethylphenylsulfonyl group, a 3-cyanophenylsulfonyl group, a 3-nitrophenylsulfonyl group, a 4-fluorophenylsulfonyl group, a 4-cyanophenylsulfonyl group, a 4-methoxyphenylsulfonyl group, a 4-methylsulfanylphenylsulfonyl group, a 4-phenylsulfanylphenylsulfonyl group, and a 4-dimethylaminophenylsulfonyl group.

Examples of the alkylthioxy group include a methylthioxy group, an ethylthioxy group, a propylthioxy group, an n-butylthioxy group, a trifluoromethylthioxy group, a hexylthioxy group, a t-butylthioxy group, a 2-ethylhexylthioxy group, a cyclohexylthioxy group, a decylthioxy group, and a dodecylthioxy group.

Examples of the arylthioxy group include a phenylthioxy group, a 1-naphthylthioxy group, a 2-naphthylthioxy group, a tolylthioxy group, a methoxyphenylthioxy group, a naphthylthioxy group, a chlorophenylthioxy group, a trifluoromethylphenylthioxy group, a cyanophenylthioxy group, and a nitrophenylthioxy group.

The heterocyclic group is preferably an aromatic or aliphatic heterocyclic group containing a nitrogen atom, an oxygen atom, a sulfur atom, or a phosphorus atom.

Examples of the heterocyclic group include a thienyl group, a benzo[b]thienyl group, a naphtho[2,3-b]thienyl group, a thianthrenyl group, a furyl group, a pyranyl group, an isobenzofuranyl group, a chromenyl group, a xanthenyl group, a phenoxathiinyl group, a 2H-pyrrolyl group, a pyrrolyl group, an imidazolyl group, a pyrazolyl group, a pyridyl group, a pyrazinyl group, a pyrimidinyl group, a pyridazinyl group, an indolizinyl group, an isoindolyl group, a 3H-indolyl group, an indolyl group, a 1H-indazolyl group, a purinyl group, a 4H-quinolizinyl group, an isoquinolyl group, a quinolyl group, a phthalazinyl group, a naphthyridinyl group, a quinoxalinyl group, a quinazolinyl group, a cinnolinyl group, a pteridinyl group, a 4aH-carbazolyl group, a carbazolyl group, a β-carbolinyl group, a phenanthridinyl group, an acridinyl group, a perimidinyl group, a phenanthrolinyl group, a phenazinyl group, a phenarsazinyl group, an isothiazolyl group, a phenothiazinyl group, an isoxazolyl group, a furazanyl group, a phenoxazinyl group, an isochromanyl group, a chromanyl group, a pyrrolidinyl group, a pyrrolinyl group, an imidazolidinyl group, an imidazolinyl group, a pyrazolidinyl group, a pyrazolinyl group, a piperidyl group, a piperazinyl group, an indolinyl group, an isoindolinyl group, a quinuclidinyl group, a morpholinyl group, and a thioxanthryl group.

Examples of the substituent which any one of $R_1$ to $R_4$ may have include a halogen atom such as a fluorine atom, a chlorine atom, a bromine atom, and an iodine atom; an alkoxy group such as a methoxy group, an ethoxy group, and a tert-butoxy group; an aryloxy group such as a phenoxy group and a p-tolyloxy group; an alkoxycarbonyl group such as a methoxycarbonyl group, a butoxycarbonyl group, and a phenoxycarbonyl group; an acyloxy group such as an acetoxy group, a propionyloxy group, and a benzoyloxy group; an acyl group such as an acetyl group, a benzoyl group, an isobutyryl group, an acryloyl group, a methacryloyl group, and a methoxalyl group; an alkylsulfanyl group such as a methylsulfanyl group and a tert-butylsulfanyl group; an arylsulfanyl group such as a phenylsulfanyl group and a p-tolylsulfanyl group; an alkylamino group such as a methylamino group and a cyclohexylamino group; a dialkylamino group such as a dimethylamino group, a diethylamino group, a morpholino group, and a piperidino group; an arylamino group such as phenylamino group and p-tolylamino group: an alkyl group such as a methyl group, an ethyl group, a tert-butyl group, and a dodecyl group; an aryl group such as a phenyl group, a p-tolyl group, a xylyl group, a cumenyl group, a naphthyl group, an anthryl group, and a phenanthryl group; a hydroxy group; a carboxy group; a formyl group; a mercapto group; a sulfo group; a mesyl group; a p-toluenesulfonyl group; an amino group; a nitro group; a cyano group; a trifluoromethyl group; a trichloromethyl group; a trimethylsilyl group; a phosphinico group; a phosphono group; a trimethylammoniumyl group; a dimethylsulfoniumyl group; and a triphenylphenancylphosphoniumyl group.

As described above, two or more members of $R_1$ to $R_4$ may be bonded to each other to form a ring. This ring may be an aliphatic or aromatic hydrocarbon ring or may be a heterocycle containing a heteroatom. Further, these $R_1$ to $R_4$ may also form a fused ring.

Examples of the aliphatic or aromatic hydrocarbon ring include those having a 6-membered, 5-membered or 7-membered ring. This hydrocarbon ring is preferably a hydrocarbon ring having a 6-membered or 5-membered ring, and particularly preferably a hydrocarbon ring having a 5-membered ring.

Examples of the heterocycle include those containing a sulfur atom, an oxygen atom, or a nitrogen atom as the heteroatom. This heterocycle more preferably contains a sulfur atom as the heteroatom.

Examples of the fused ring include a fused ring formed of only a hydrocarbon ring. Examples of the fused polycyclic ring include a fused ring formed by fusing 2 to 4 benzene rings, and a fused ring formed by fusing a benzene ring and a 5-membered unsaturated ring.

The fused ring may be a fused ring containing at least one heterocycle. Examples of the fused ring include a fused ring formed by fusing a benzene ring and a 5-membered heterocycle, and a fused ring formed by fusing a benzene ring and a 6-membered heterocycle.

Examples of the ring which can be formed by $R_1$ to $R_4$ include a benzene ring, a naphthalene ring, an anthracene ring, a phenanthrene ring, a fluorene ring, a triphenylene ring, a naphthacene ring, a biphenyl ring, a pyrrole ring, a furan ring, a thiophene ring, a dithiolane ring, an oxirane ring, a dioxirane ring, a thiirane ring, a pyrrolidine ring, a piperidine ring, an imidazole ring, an isoxazole ring, a benzothiazole ring, an oxazole ring, a thiazole ring, a benzothiazole ring, a benzimidazole ring, a benzoxazole ring, a pyridine ring, a pyrazine ring, a pyrimidine ring, a pyridazine ring, an indolizine ring, an indole ring, a benzofuran ring, a benzothiophene ring, a benzodithiole ring, an isobenzofuran ring, a quinolizine ring, a quinoline ring, a phthalazine ring, a naphthyridine ring, a quinoxaline ring, a quinazoline ring, an isoquinoline ring, a carbazole ring, a phenanthridine ring, an acridine ring, a phenanthroline ring, a thianthrene ring, a chromene ring, a xanthene ring, a phenoxathiin ring, a phenothiazine ring, and a phenazine ring. Among those, a dithiolane ring, a benzodithiole ring, a benzothiazole ring, a benzimidazole ring, and a benzoxazole ring are particularly preferable.

Each of $R_7$ and $R_8$ represents a substituent. $R_7$ and $R_8$ may be bonded to each other to form a cyclic acetal structure.

The structure represented by General Formula (I-AC) can generate sulfonic acid by the action of an acid. The mechanism thereof is not necessarily clear, but the present inventors have considered that the reaction proceeds in accordance with the following scheme. Further, in the following scheme, the moiety represented by "○" means a bonding site of the structure represented by General Formula (I-AC).

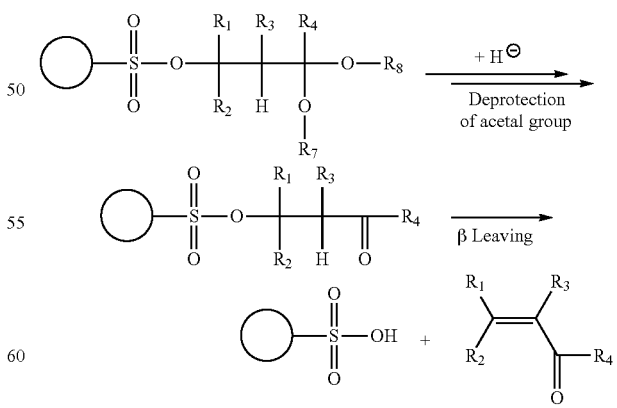

Hereafter, the structure represented by General Formula (I-AC) will be described in detail.

Examples of $R_1$ to $R_4$ in General Formula (1-AC) include those described in the following chemical formulae.

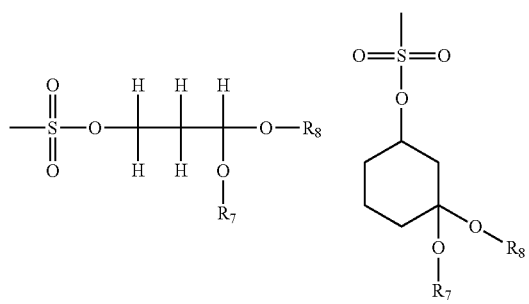
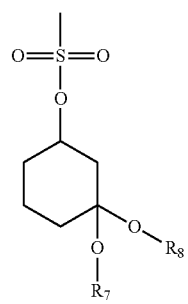
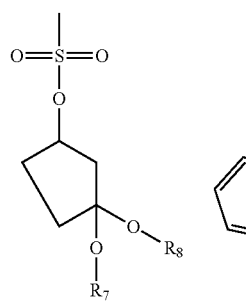
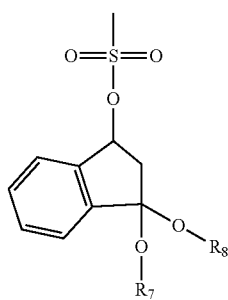
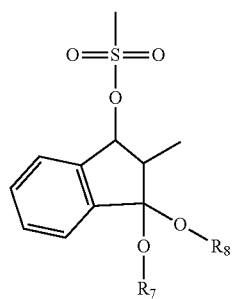
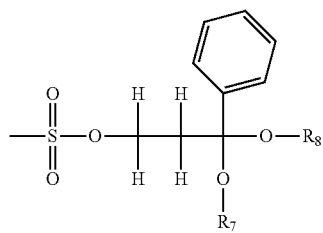
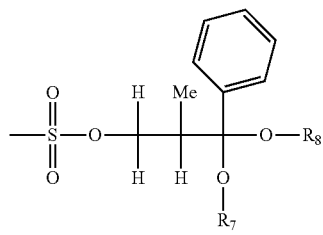
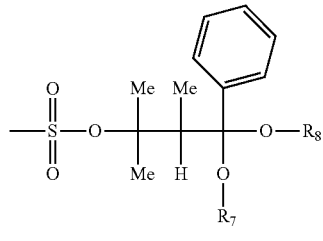
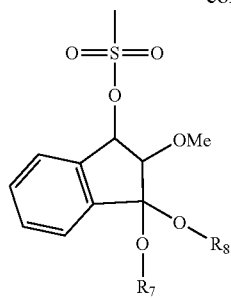
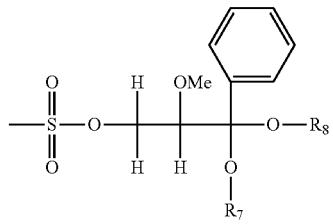
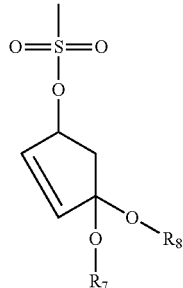
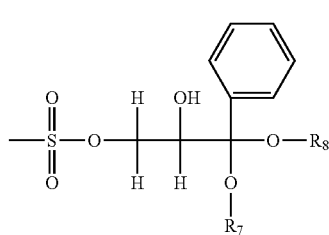
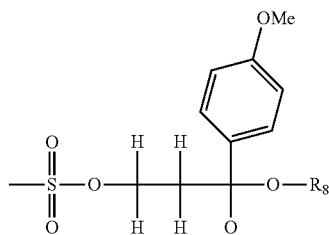
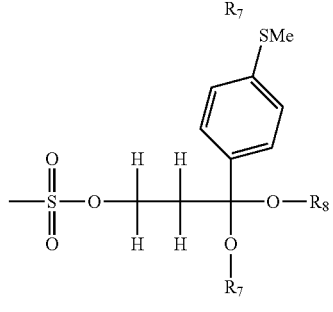

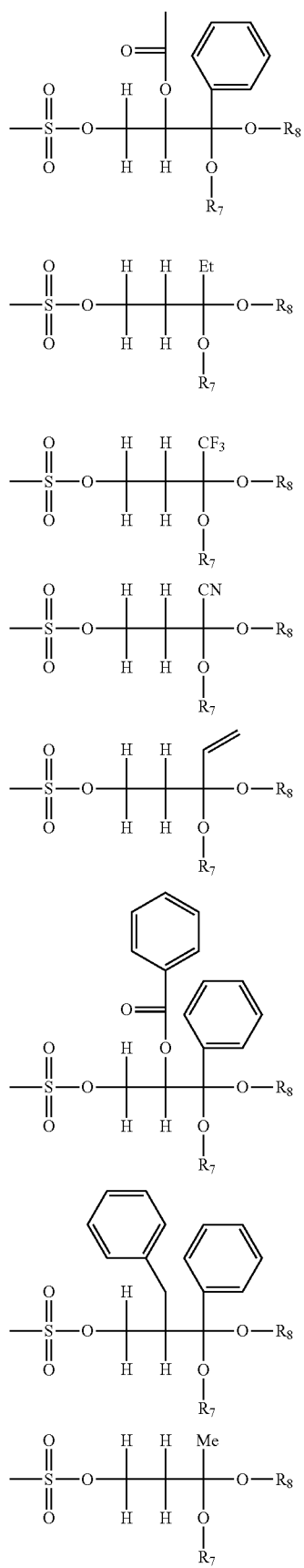
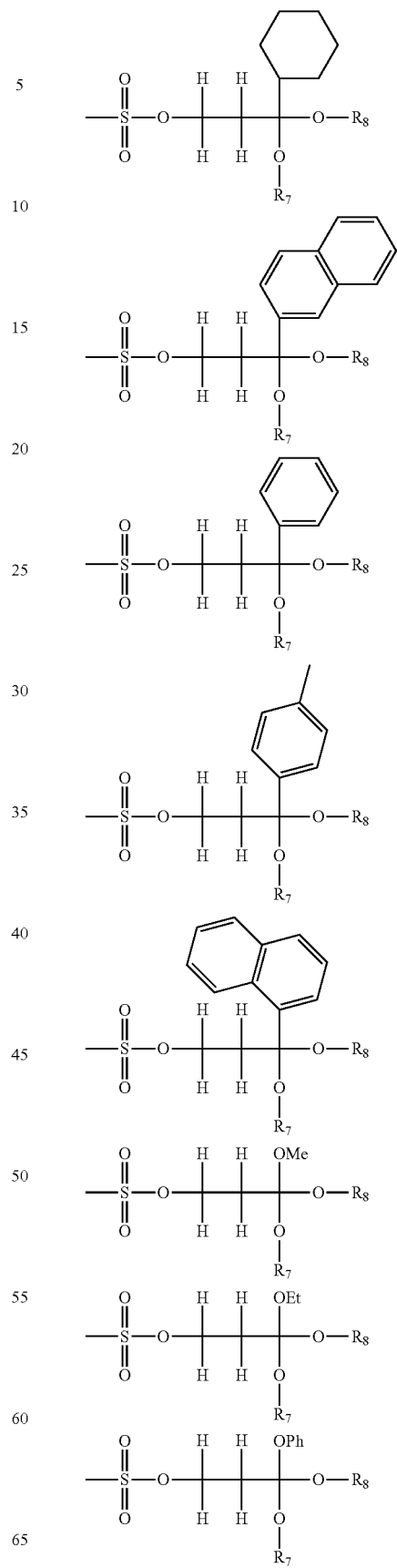

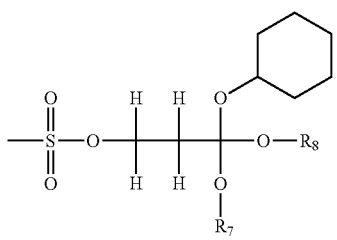

In Formula (I-AC), each of $R_7$ and $R_8$ represents a substituent. Examples of this substituent include an organic group and a silyl group. Examples of this organic group include an alkyl group, a cycloalkyl group, an alkenyl group, an alkynyl group, an aryl group, an alkanolyl group, an alkoxycarbonyl group, an aryloxycarbonyl group, an alkylsulfonyl group, an arylsulfonyl group, an alkylthiocarbonyl group, an arylthiocarbonyl group, and a dialkylaminocarbonyl group. These organic groups may further have a substituent.

Each of $R_7$ and $R_8$ is preferably an alkyl group. Further, as will be described later, it is more preferable that $R_7$ and $R_8$ are bonded to each other to form a cyclic acetal structure.

Examples of the alkyl group, the cycloalkyl group, the alkenyl group, the alkynyl group, the aryl group, the alkanolyl group, the alkoxycarbonyl group, the aryloxycarbonyl group, the alkylsulfonyl group, the arylsulfonyl group, the alkylthiocarbonyl group, and the arylthiocarbonyl group are the same as those described above for $R_1$ to $R_4$.

Examples of the dialkylaminocarbonyl group which may have a substituent include a dimethylaminocarbonyl group, a diethylaminocarbonyl group, a dipropylaminocarbonyl group, and a dibutylaminocarbonyl group.

It is preferable that $R_7$ and $R_8$ are bonded to each other to form a cyclic acetal structure, by which out gas performance can further be improved. The cyclic acetal structure may have an aliphatic or aromatic hydrocarbon ring or a heterocycle containing a heteroatom, as a substituent. Further, the hydrocarbon ring and/or the heterocycle may form a fused ring with the cyclic acetal.

Examples of the aliphatic or aromatic hydrocarbon ring, the heterocycle, and the fused ring include the same as those described above for $R_1$ to $R_4$ in General Formula (I-AC). Examples of the ring structure which can be formed by $R_7$ and $R_8$ include the same as those described above for $R_1$ to $R_4$ in General Formula (I-AC).

Examples of $R_7$ and $R_8$ in General Formula (I-AC) include those described in the following chemical formulae.

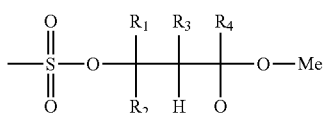

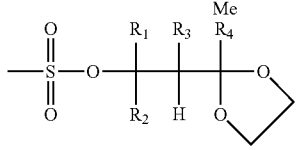

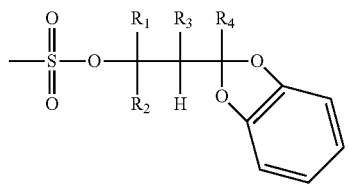

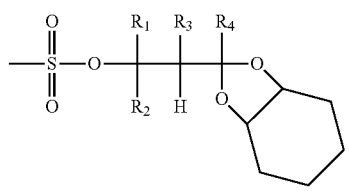

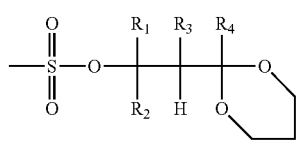

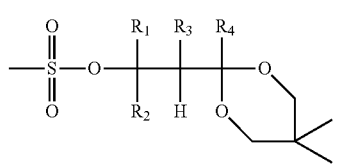

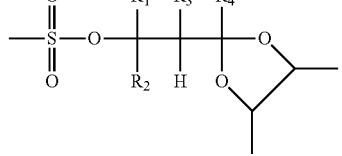

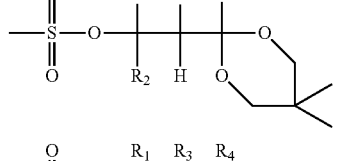

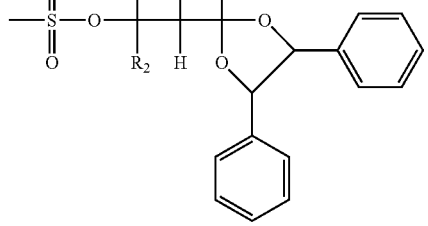

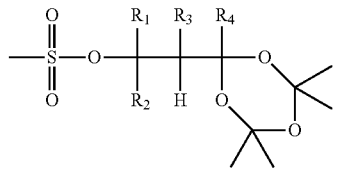

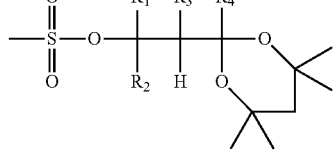

-continued

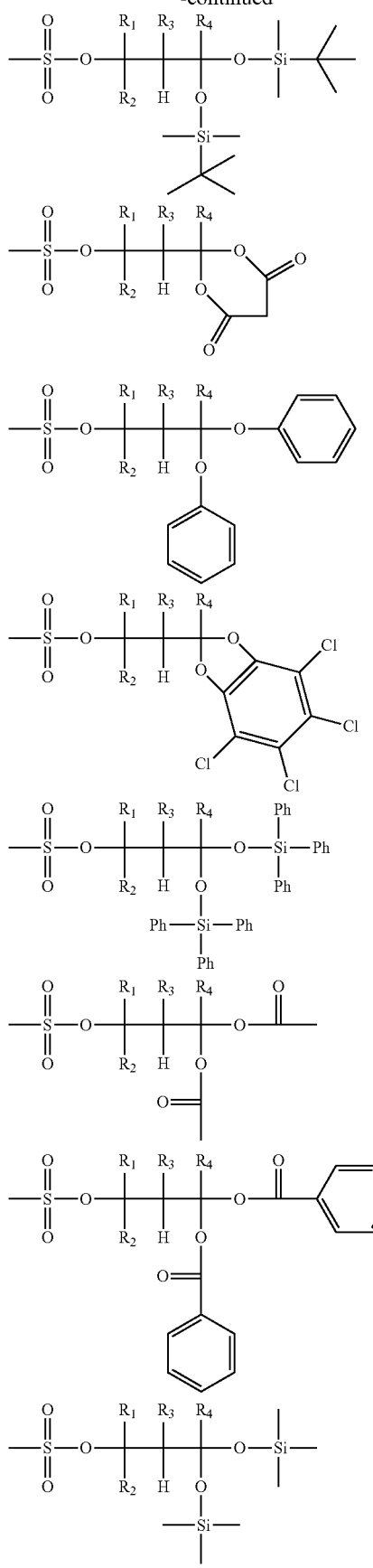

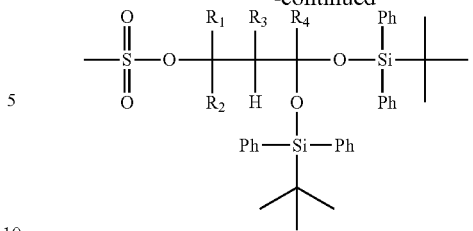

At least some of the repeating units (a) are preferably repeating units represented by General Formula (II-AC). That is, at least some of the repeating units (a) preferably include the structure represented by General Formula (I-AC) in a form represented by General Formula (II-AC).

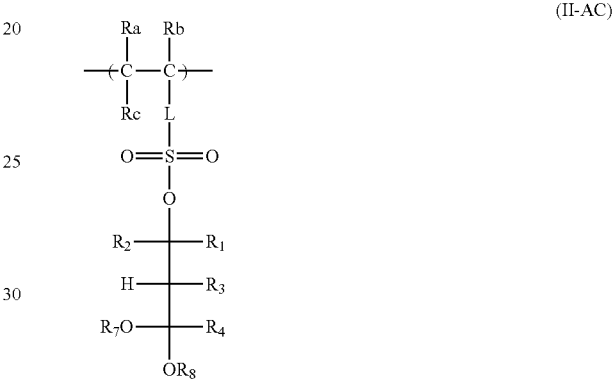

(II-AC)

In General Formula (II-AC), Ra and Rb each independently represent a hydrogen atom, an alkyl group, or a cyano group.

Rc represents a hydrogen atom or a substituent. L represents a single bond or a linking group. Further, in a case where Rc is the substituent and L is the linking group, Rc and L may be bonded to each other to form a ring structure.

$R_1$ to $R_4$, $R_7$, and $R_8$ each have the same definitions as those described above for General Formula (I-AC).

In a case where at least some of the repeating units (a) are the repeating units represented by General Formula (II-AC), sulfonic acid can be generated in the form bonded to a resin. Accordingly, in this case, it is difficult for the generated sulfonic acid to be diffused in the composition. Therefore, in this case, it is possible to further improve the resolving power, the roughness characteristics, and the like of the actinic ray-sensitive or radiation-sensitive resin composition.

Each of Ra and Rb represent a hydrogen atom, an alkyl group, or a cyano group, as described above. This alkyl group may further have a substituent. Examples of this substituent include for example, a halogen atom such as a fluorine atom and a chlorine atom, and a hydroxy group. Examples of the alkyl group of Ra or Rb include a methyl group, a chloromethyl group, a trifluoromethyl group, and a hydroxymethyl group. Each of Ra and Rb is preferably a hydrogen atom or a methyl group, and more preferably a hydrogen atom.

Rc represents a hydrogen atom or a substituent, as described above. Examples of this substituent include a hydrogen atom, an alkyl group, a cycloalkyl group, an alkenyl group, an alkynyl group, an aryl group, an alkanolyl group, an alkoxycarbonyl group, an aryloxycarbonyl group, an alkylsulfonyl group, an arylsulfonyl group, an alkylthiocarbonyl group, an arylthiocarbonyl group, a heterocyclic group, a (di)alkylaminocarbonyl group, and an aminothiocarbonyl group.

L represents a single bond or a linking group, as described above.

This linking group is preferably a single bond, an arylene group, an alkylene group, a cycloalkylene group, —O—, —S—, —SO$_2$—, —CO—, —N(R$_{33}$)—, or a combination thereof. This linking group is more preferably a single bond, an arylene group, an alkylene group, —O—, —SO$_2$—, —CO—, —N(R$_{33}$)—, or a combination thereof. Here, R$_{33}$ represents a hydrogen atom, an alkyl group, a cycloalkyl group, an alkenyl group, an aryl group, or an aralkyl group.

The resin (A) preferably has a repeating unit (b) represented by General Formula (2), in addition to the repeating unit (a).

(Repeating Unit (b))

Preferred examples of the repeating unit (b) include a structure represented by General Formula (2).

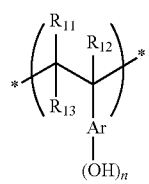

(2)

In the formula,

R$_{11}$ and R$_{12}$ each independently represent a hydrogen atom, an alkyl group, a cycloalkyl group, a halogen atom, a cyano group, or an alkoxycarbonyl group.

R$_{13}$ represents a hydrogen atom, an alkyl group, a cycloalkyl group, a halogen atom, a cyano group, or an alkoxycarbonyl group, or is bonded to Ar below to form a ring structure.

Ar represents an aromatic cyclic group.

n represents an integer of 1 to 4.

The alkyl group as each of R$_{11}$ to R$_{13}$ is, for example, an alkyl group having 20 or less carbon atoms, such as a methyl group, an ethyl group, a propyl group, an isopropyl group, an n-butyl group, a sec-butyl group, a hexyl group, a 2-ethylhexyl group, an octyl group, or a dodecyl group, and preferably an alkyl group having 8 or less carbon atoms. These alkyl groups may have a substituent.

Examples of the alkyl group contained in the alkoxycarbonyl group as one of R$_{11}$ to R$_{13}$ include the same as the alkyl groups mentioned as the alkyl group of each of R$_{11}$ to R$_{13}$.

The cycloalkyl group as each of R$_{11}$ to R$_{13}$ may be monocyclic or polycyclic. Preferred examples of the cycloalkyl group include monocyclic cycloalkyl groups having 3 to 8 carbon atoms, such as a cyclopropyl group, a cyclopentyl group, and a cyclohexyl group. These cycloalkyl groups may have a substituent.

Examples of the ring which can be formed by the bonding of R$_{13}$ and Ar include a 5- or 6-membered ring.

The aromatic cyclic group as Ar preferably has 6 to 14 carbon atoms, and specific examples thereof include a benzene ring group and a naphthalene ring group.

The respective groups may have substituents. Examples of the substituents include an alkyl group, a cycloalkyl group, an aryl group, an amino group, an amido group, a ureido group, a urethane group, a hydroxy group, a carboxy group, a halogen atom, an alkoxy group, a thioether group, an acyl group, an acyloxy group, an alkoxycarbonyl group, a cyano group, and a nitro group. These substituents preferably have 8 or less carbon atoms.

Specific examples of the repeating unit represented by General Formula (2) are shown below, but the scope of the present invention is not limited thereto.

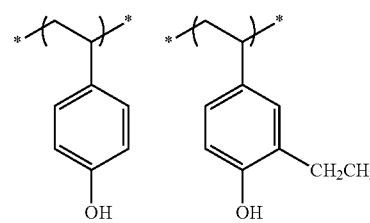

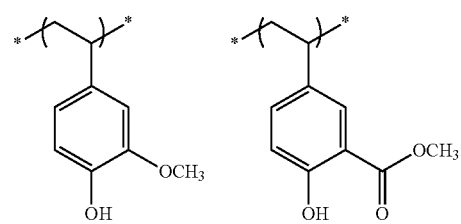

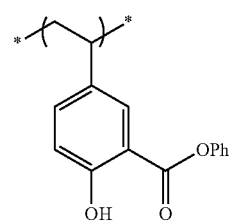

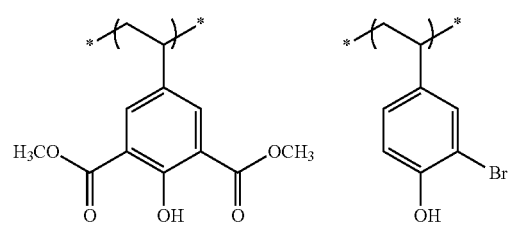

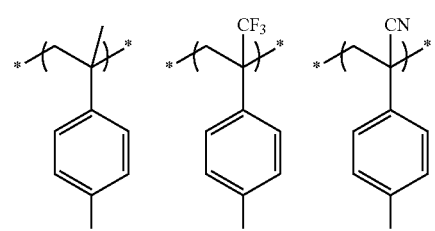

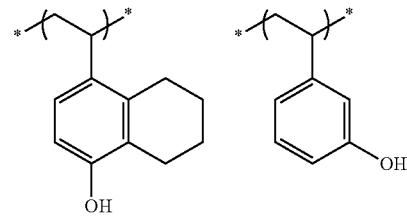

-continued

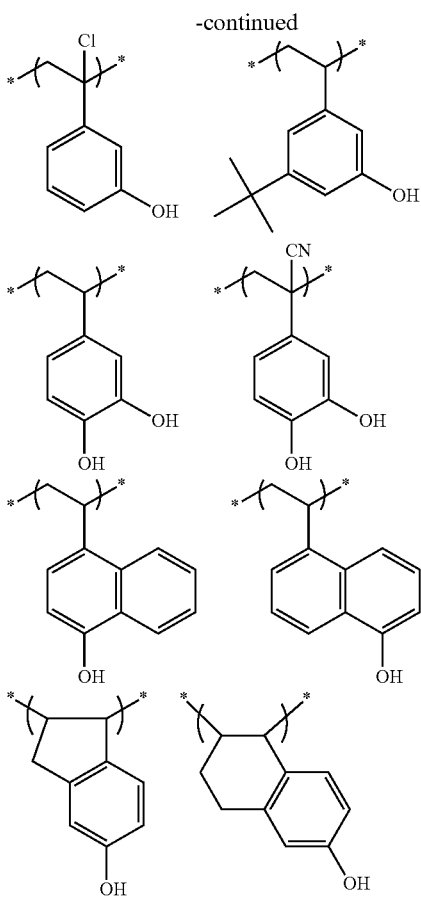

The resin (A) may have a repeating unit (c), in addition to the repeating units (a) and (b).

(Repeating Unit (c))

The repeating unit (c) may be a repeating unit having a lactone structure or a sultone structure as a polar group.

The repeating unit having a lactone structure is more preferably a repeating unit represented by General Formula (AII).

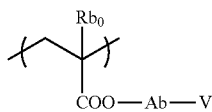

(AII)

In General Formula (AII), $Rb_0$ represents a hydrogen atom, a halogen atom, or an alkyl group (preferably having 1 to 4 carbon atoms) which may have a substituent.

Preferred examples of the substituent which the alkyl group of $Rb_0$ may have include a hydroxyl group and a halogen atom. Examples of the halogen atom of $Rb_0$ include a fluorine atom, a chlorine atom, a bromine atom, and an iodine atom. $Rb_0$ is preferably a hydrogen atom, a methyl group, a hydroxymethyl group, or a trifluoromethyl group, and particularly preferably a hydrogen atom or a methyl group.

Ab represents a single bond, an alkylene group, a divalent linking group having a monocyclic or polycyclic cycloalkyl structure, an ether bond, an ester bond, a carbonyl group, or a divalent linking group formed by combining these. Ab is preferably a single bond or a divalent linking group represented by -$Ab_1$-$CO_2$—.

$Ab_1$ is a linear or branched alkylene group or a monocyclic or polycyclic cycloalkylene group and is preferably a methylene group, an ethylene group, a cyclohexylene group, an adamantylene group or a norbornylene group.

V represents a group having a lactone structure.

As the group having a lactone structure, any group may be used as long as it has a lactone structure, but the structure is preferably a 5- to 7-membered ring lactone structure, and more preferably a 5- to 7-membered ring lactone structure to which another ring structure is fused in the form of forming a bicyclo structure or a spiro structure. The resin (A) still more preferably has a repeating unit having a lactone structure represented by any one of General Formulae (LC1-1) to (LC1-17). Further, the lactone structure may be bonded directly to the main chain. The lactone structures are preferably (LC1-1), (LC1-4), (LC1-5), (LC1-6), (LC1-8), (LC1-13), (LC1-14).

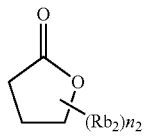

LC1-1

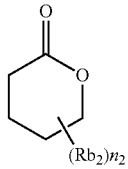

LC1-2

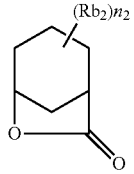

LC1-3

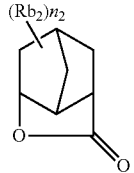

LC1-4

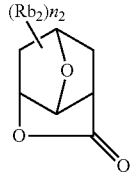

LC1-5

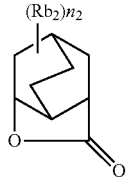

LC1-6

-continued

LC1-7 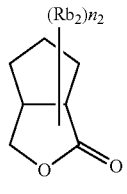

LC1-8 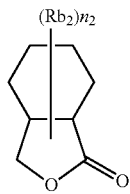

LC1-15 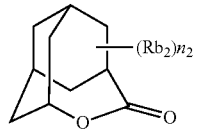

LC1-9 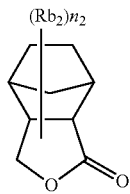

LC1-16 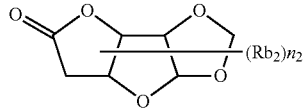

LC1-10 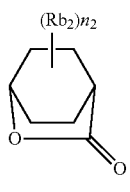

LC1-17

LC1-11 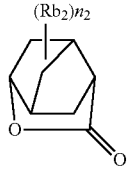

The lactone structural moiety may or may not have a substituent (Rb$_2$). Preferred examples of the substituent (Rb$_2$) include an alkyl group having 1 to 8 carbon atoms, a cycloalkyl group having 4 to 7 carbon atoms, an alkoxy group having 1 to 8 carbon atoms, an alkoxycarbonyl group having 2 to 8 carbon atoms, a carboxyl group, a halogen atom, a hydroxyl group, a cyano group, and an acid-decomposable group. Among these, an alkyl group having 1 to 4 carbon atoms, a cyano group, and an acid-decomposable group are more preferable. n$_2$ represents an integer of 0 to 4. In a case where n$_2$ is 2 or more, the substituents (Rb$_2$) which are present in plural numbers may be the same as or different from each other, and further, the substituents (Rb$_2$) which are present in plural numbers may be bonded to each other to form a ring.

LC1-12 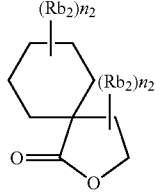

The repeating unit having a lactone structure usually has an optical isomer, and any optical isomer may be used. Further, one kind of optical isomer may be used singly or a plurality of optical isomers may be mixed and used. In a case of mainly using one kind of optical isomer, the optical purity (ee) thereof is preferably 90% or more, and more preferably 95% or more.

The resin (A) may or may not contain a repeating unit having a lactone structure, but in a case where the resin (A) contains the repeating unit having a lactone structure, the content of the repeating unit in the resin (A) is preferably in the range of 1% to 70% by mole, more preferably in the range of 3% to 50% by mole, and still more preferably in the range of 5% to 45% by mole, with respect to the total content of all repeating units.

LC1-13 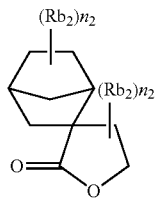

Specific examples of the repeating unit having a lactone structure in the resin (A) are shown below, but the present invention is not limited thereto. In the formulae, Rx represents H, CH$_3$, CH$_2$OH, or CF$_3$.

LC1-14 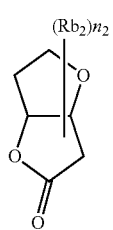

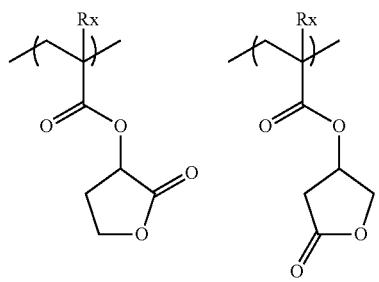

LC1-14 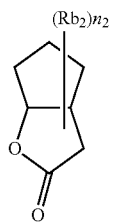

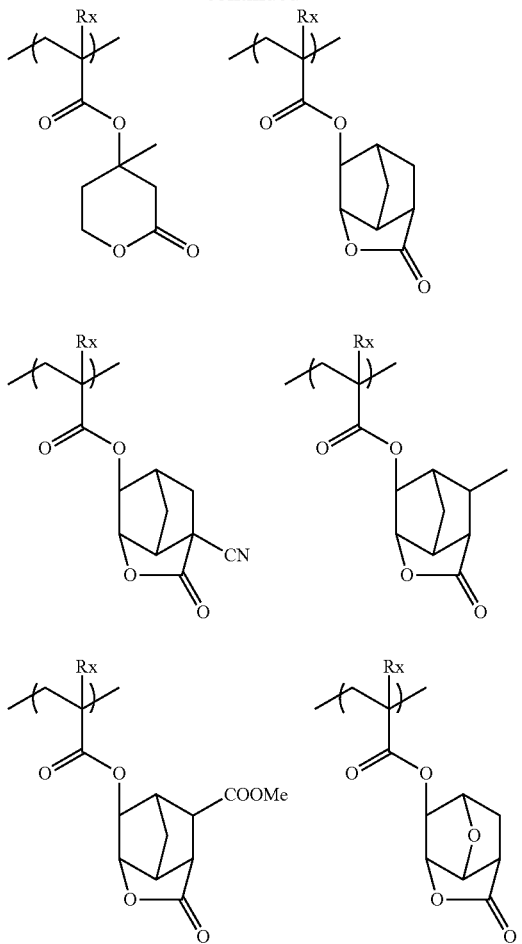
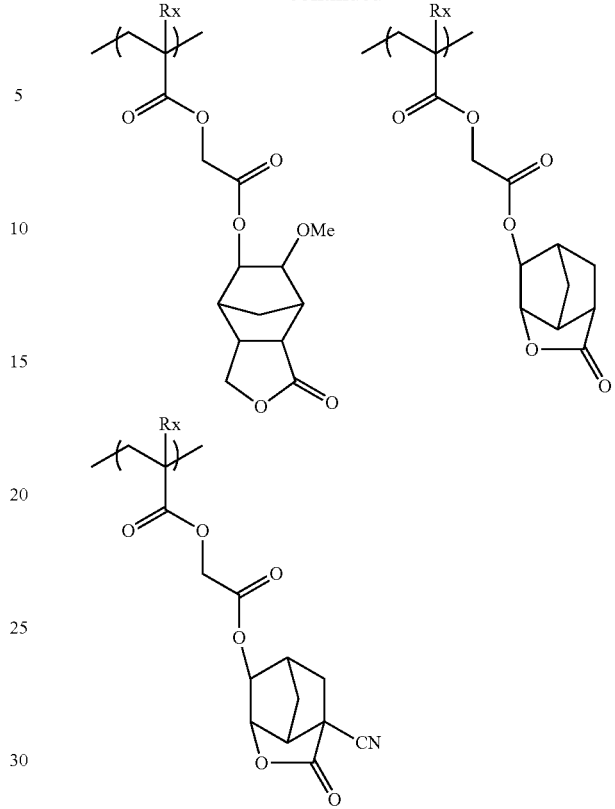

Moreover, the sultone structure included in the resin (A) is preferably General Formula (SL-1) or (SL-2). $Rb_2$ and $n_2$ in the formulae have the same definitions as in General Formulae (LC1-1) to (LC1-17).

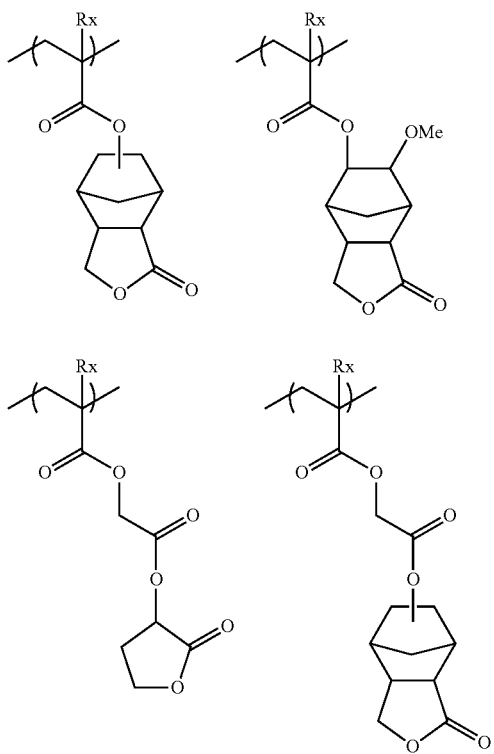

The repeating unit including a sultone structure contained in the resin (A) is preferably the above-mentioned repeating unit having a lactone structure, in which the lactone structure is substituted with a sultone structure.

Furthermore, it is also one of particularly preferred aspects that the polar group which can be contained in the repeating unit (c) is an acidic group. Preferred acidic groups include a carboxylic acid group, a sulfonic acid group, a fluorinated alcohol group (such as hexafluoroisopropanol group), a sulfonamido group, a sulfonylimido group, an (alkylsulfonyl)(alkylcarbonyl)methylene group, an (alkylsulfonyl)(alkylcarbonyl)imido group, a bis(alkylcarbonyl)methylene group, a bis(alkylcarbonyl)imido group, a bis(alkylsulfonyl)methylene group, a bis(alkylsulfonyl)imido group, a tris(alkylcarbonyl)methylene group, and a tris (alkylsulfonyl)methylene group. Among those, the repeating unit (c) is more preferably a repeating unit having a carboxyl group. As the repeating unit having an acidic group, all of a repeating unit where an acidic group is directly bonded to the main chain of the resin, such as repeating unit by an acrylic acid or a methacrylic acid, a repeating unit where an acidic group is bonded to the main chain of the resin through a linking group, and a repeating unit where an acidic group is introduced into the polymer chain terminal by using an acidic group-containing polymerization initiator or a chain transfer agent at the polymerization, are preferable. A repeating unit by acrylic acid or methacrylic acid is particularly preferable.

The acidic group which can be contained in the repeating unit (c) may or may not contain an aromatic ring, but in a case where the aromatic ring is contained, it is preferably selected from acidic groups. In a case where the resin (A) contains the repeating unit having an acidic group, the content of the repeating unit having an acidic group in the resin (A) is usually 1% by mole or more.

Specific examples of the repeating unit having an acidic group are shown below, but the present invention is not limited thereto.

In the specific examples, Rx represents H, $CH_3$, $CH_2OH$, or $CF_3$.

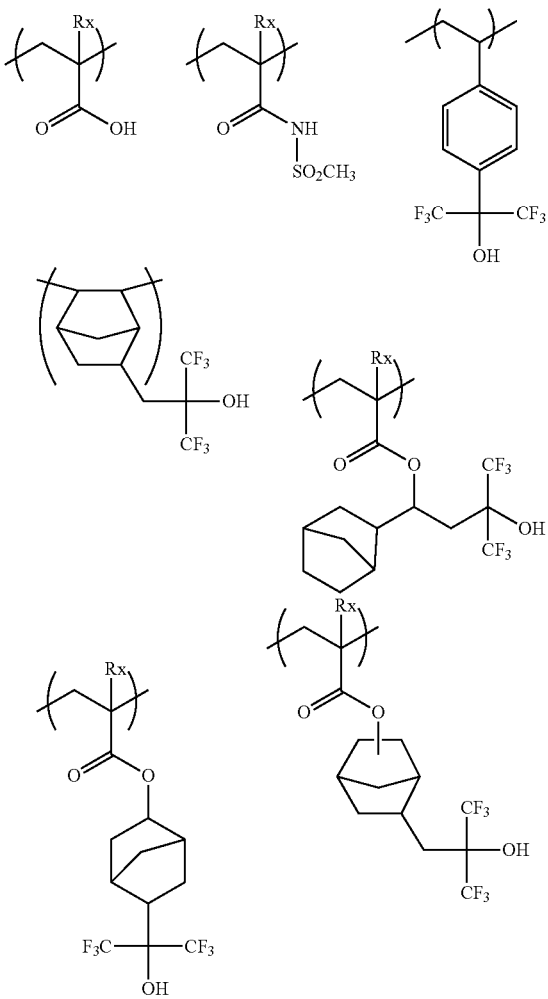

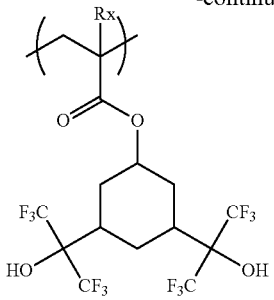

It is also preferable that the resin (A) further has repeating units below (hereinafter also referred to as "other repeating units") as repeating units other than the above repeating units.

Examples of polymerizable monomers for forming other repeating units include styrene, alkyl-substituted styrene, alkoxy-substituted styrene, halogen-substituted styrene, O-alkylated styrene, O-acylated styrene, hydrogenated hydroxystyrene, maleic anhydride, acrylic acid derivatives (acrylic acid, acrylic ester, and the like), methacrylic acid derivatives (methacrylic acid, methacrylic ester, and the like), N-substituted maleimide, acrylonitrile, methacrylonitrile, vinyl naphthalene, vinyl anthracene, and indene, which may have a substituent.

The resin (A) may or may not contain these other repeating units, but in a case where these other repeating units are contained, the content of these other repeating units in the resin (A) is generally 1% to 30% by mole, preferably 1% to 20% by mole, and more preferably 5% to 10% by mole, with respect to all the repeating units constituting the resin (A).

The resin (A) may contain a repeating unit represented by General Formula (IV) or General Formula (V).

(IV)

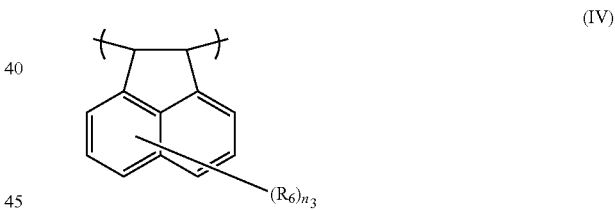

In the formula, $R_6$ represents a hydrogen atom, a hydroxy group, a linear, branched, or cyclic alkyl group having 1 to 10 carbon atoms, an alkoxy group or acyloxy group, a cyano group, a nitro group, an amino group, a halogen atom, an ester group (—OCOR or —COOR: R is an alkyl or fluorinated alkyl group having 1 to 6 carbon atoms), or a carboxyl group.

$n_3$ represents an integer of 0 to 6.

(V)

In the formula,

R₇ represents a hydrogen atom, a hydroxy group, a linear, branched, or cyclic alkyl group having 1 to 10 carbon atoms, an alkoxy group or acyloxy group, a cyano group, a nitro group, an amino group, a halogen atom, an ester group (—OCOR or —COOR: R is an alkyl group or fluorinated alkyl group, having 1 to 6 carbon atoms), or a carboxyl group.

n₄ represents an integer of 0 to 4.

X⁴ represents a methylene group, an oxygen atom, or a sulfur atom. R⁵ may have an aryl group or aralkyl group having 6 to 20 carbon atoms, a hydroxyl group, a linear, branched, or cyclic alkyl group or alkoxy group, an ester group (—OCOR or —COOR: R is an alkyl group having 1 to 6 carbon atoms), a ketone group (—COR: R is an alkyl group having 1 to 6 carbon atoms), a fluorine atom, a trifluoromethyl group, a nitro group, an amino group, or a cyano group.

Specific examples of a repeating unit represented by General Formula (IV) or General Formula (V) are shown below, but not limited thereto.

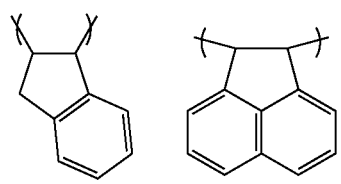

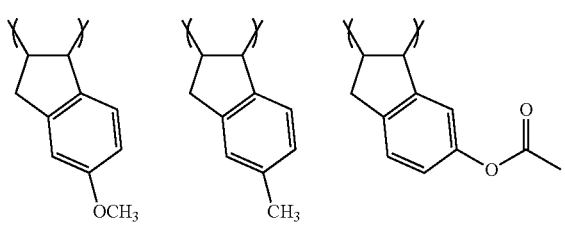

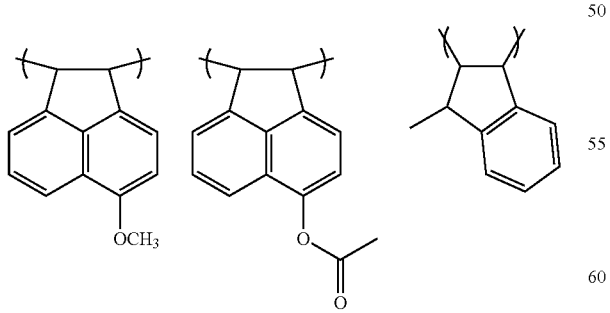

Specific examples of the above-mentioned resin (A) are shown below, but the present invention is not limited thereto.

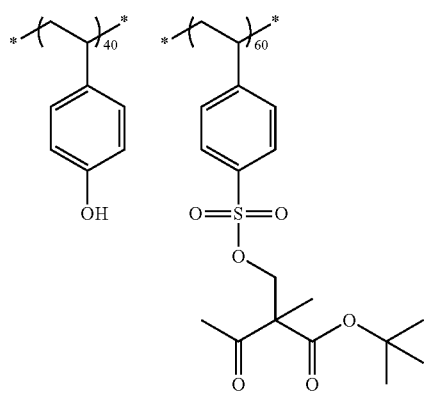

A-1

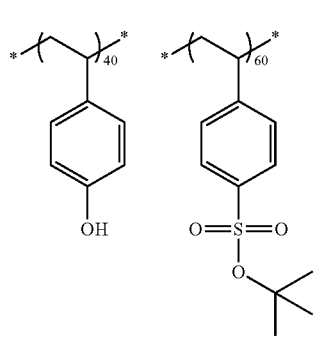

A-2

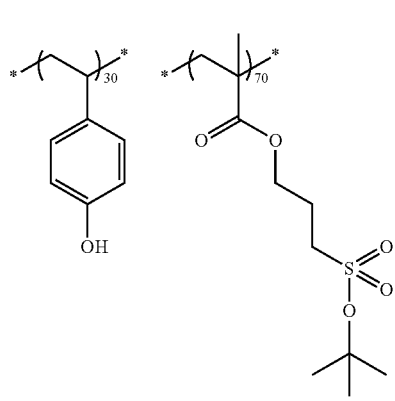

A-3

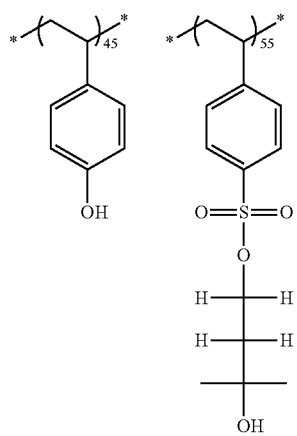

A-4

-continued
A-5
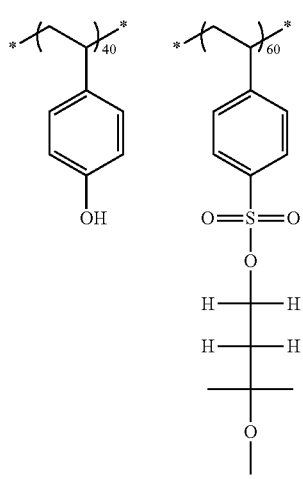 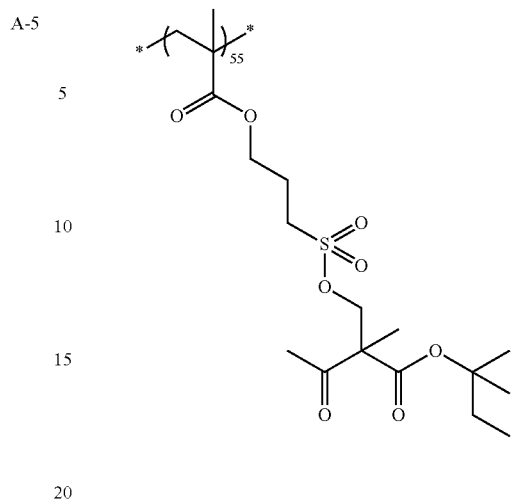
A-6
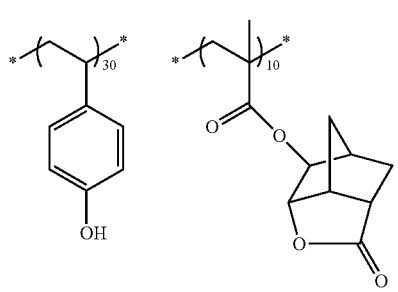 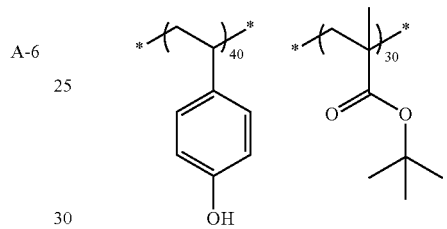
A-8
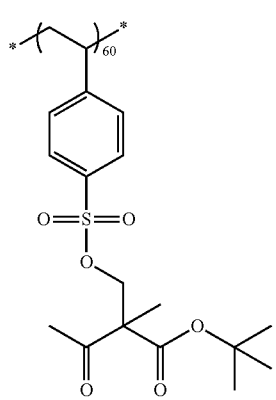 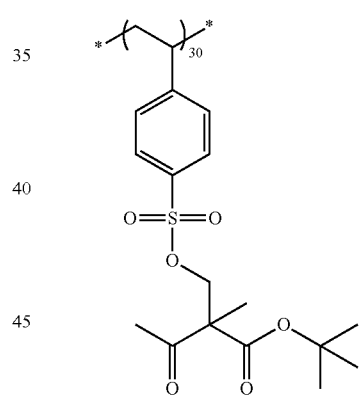
A-7
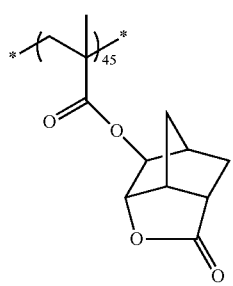 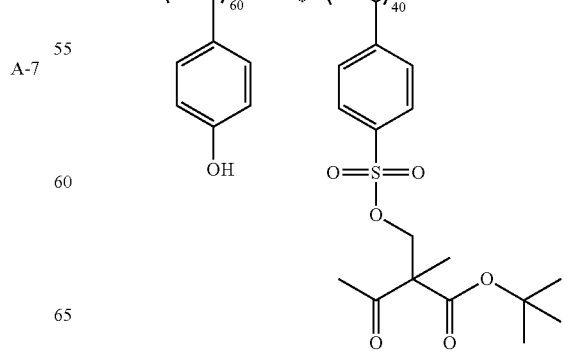
A-9

A-10 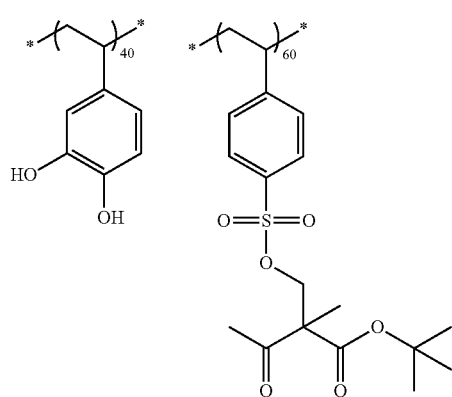
A-11 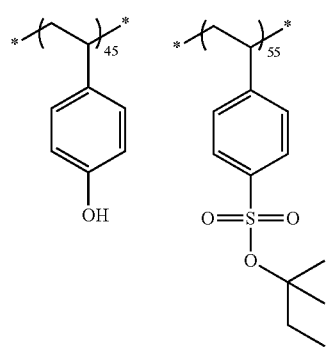
A-12 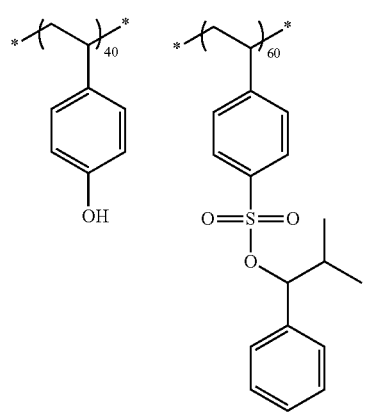
A-13 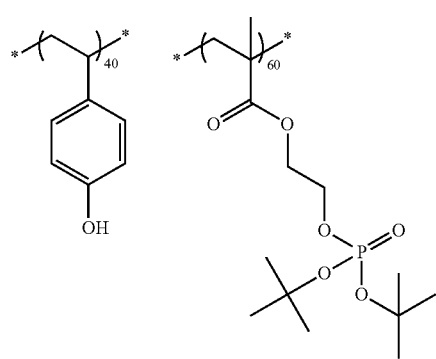
A-14 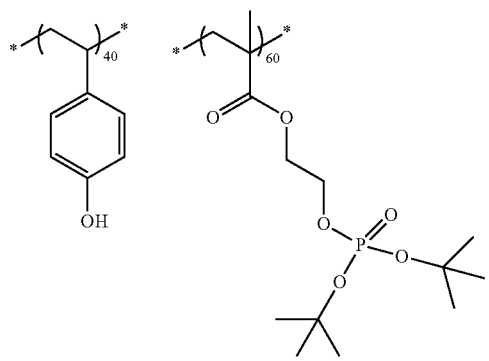
A-15 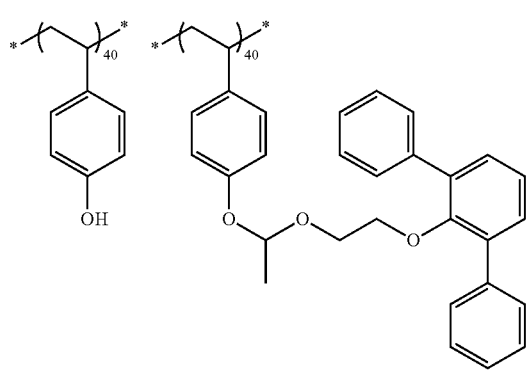
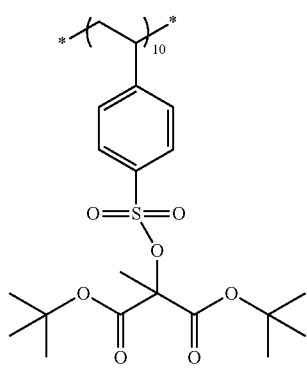
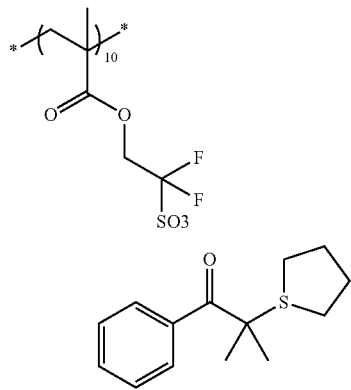

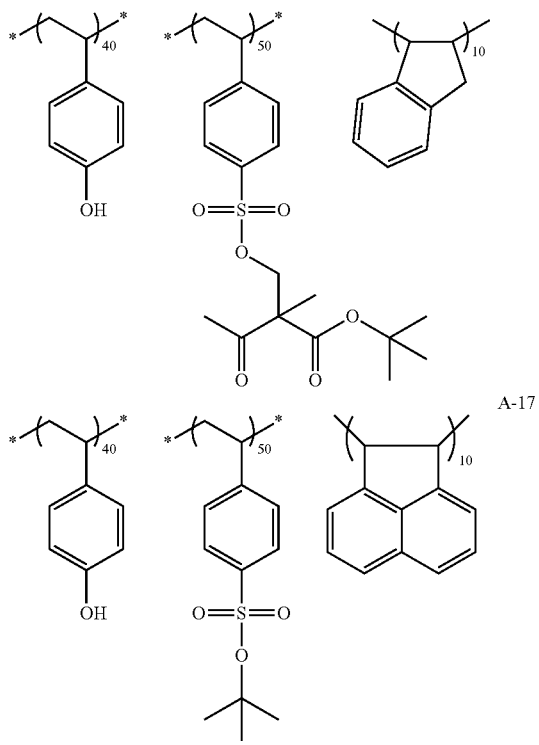

As described above, the resin (A) having an acid-decomposable repeating unit may have, in addition to the repeating unit (a), repeating units (b), (c), or other repeating units, but the content of the repeating unit (a) in the resin is preferably 55% to 100% by mole, more preferably 55% to 90% by mole, and particularly preferably in the range of 55% to 80% by mole, with respect to all the repeating units.

In the resin (A), the molar ratio of the respective repeating structural units contained is appropriately set to control the dry etching resistance of resist, suitability for standard developer, adherence to a substrate, resist profile, and performances generally required of a resist, such as resolution, heat resistance, sensitivity, or the like.

The form of the resin (A) may be any of a random type, a block type, a comb type, and a star type.

The resin (A) can be synthesized, for example, by radical, cationic, or anionic polymerization of unsaturated monomers corresponding to respective structures. It is also possible to obtain a desired resin by polymerizing unsaturated monomers corresponding to precursors of respective structures and then carrying out a polymer reaction.

Examples of the general synthesis method include a batch polymerization method of dissolving unsaturated monomers and a polymerization initiator in a solvent and heating the solution, thereby carrying out the polymerization, and a dropwise-addition polymerization method of adding dropwise a solution containing unsaturated monomers and a polymerization initiator to a heated solvent for 1 to 10 hours, with the dropwise-addition polymerization method being preferable.

Examples of the solvent used for the polymerization include a solvent which can be used in a case of preparing the later-described actinic ray-sensitive or radiation-sensitive resin composition, and it is preferable to carry out the polymerization by using the same solvent as the solvent used in the composition. Thus, generation of particles during storage can be suppressed.

It is preferable that the polymerization reaction is carried out in an inert gas atmosphere such as nitrogen and argon. As the polymerization initiator, commercially available radical initiators (azo-based initiators, peroxides, or the like) are used to initiate the polymerization. As the radical initiator, an azo-based initiator is preferable, and the azo-based initiator having an ester group, a cyano group, or a carboxyl group is preferable. Preferred examples of the initiators include azobisisobutyronitrile, azobisdimethylvaleronitrile, and dimethyl 2,2'-azobis(2-methyl propionate). The polymerization may be carried out in the presence of a chain transfer agent (for example, alkylmercaptan), as desired.

The concentration of the reactant is usually 5% to 70% by mass, and preferably 10% to 50% by mass. The reaction temperature is usually 10° C. to 150° C., preferably 30° C. to 120° C., and more preferably 40° C. to 100° C.

The reaction time is usually 1 to 48 hours, preferably 1 to 24 hours, and more preferably 1 to 12 hours.

After the completion of reaction, the reaction solution is allowed to cool to room temperature and purified. The purification may be carried out by a normal method, for example, a liquid-liquid extraction method of applying water washing or combining it with an appropriate solvent to remove residual monomers or oligomer components: a purification method in a solution state, such as ultrafiltration of extracting and removing only polymers having a molecular weight not more than a specific value; a re-precipitation method of adding dropwise the resin solution in a poor solvent to solidify the resin in the poor solvent and thereby remove residual monomers and the like; and a purification method in a solid state, such as washing of a resin slurry with a poor solvent after separation of the slurry by filtration. For example, the resin is precipitated as a solid by contacting the reaction solution with a solvent in which the resin is sparingly soluble or insoluble (poor solvent) and which is in a volumetric amount of 10 times or less, preferably from 10 to 5 times, the reaction solution.

The solvent used at the operation of precipitation or re-precipitation from the polymer solution (precipitation or re-precipitation solvent) may be sufficient in a case where it is a poor solvent for the polymer, and the solvent which can be used may be appropriately selected from a hydrocarbon, a halogenated hydrocarbon, a nitro compound, an ether, a ketone, an ester, a carbonate, an alcohol, a carboxylic acid, water, a mixed solvent containing such a solvent, and the like, according to the kind of the polymer. Among these, a solvent containing at least an alcohol (in particular, methanol or the like) or water is preferable as the precipitation or re-precipitation solvent.

The amount of the precipitation or re-precipitation solvent used may be appropriately selected by taking into consideration the efficiency, the yield, and the like, but in general, the amount used is from 100 to 10,000 parts by mass, preferably from 200 to 2,000 parts by mass, more preferably from 300 to 1,000 parts by mass, with respect to 100 parts by mass of the polymer solution.

The temperature at the precipitation or re-precipitation can be appropriately selected by taking into consideration the efficiency or the operability but is usually on the order of 0° C. to 50° C., and preferably in the vicinity of room temperature (for example, approximately 20° C. to 35° C.). The precipitation or re-precipitation operation can be carried out using a commonly employed mixing vessel such as stirring tank by a known method such as a batch system, and a continuous system.

The precipitated or re-precipitated polymer is usually subjected to commonly employed solid-liquid separation such as filtration and centrifugation, then dried and used. The filtration is performed using a solvent-resistant filter element preferably under pressure. The drying is performed under atmospheric pressure or reduced pressure (preferably under reduced pressure) at a temperature of approximately 30° C. to 100° C., and preferably approximately 30° C. to 50° C.

Incidentally, after the resin is once precipitated and separated, the resin may be again dissolved in a solvent and then put into contact with a solvent in which the resin is sparingly soluble or insoluble. That is, there may be used a method including, after the completion of radical polymerization reaction, bringing the polymer into contact with a solvent in which the polymer is sparingly soluble or insoluble, to precipitate a resin (step a), separating the resin from the solution (step b), anew dissolving the resin in a solvent to prepare a resin solution A (step c), bringing the resin solution A into contact with a solvent in which the resin is sparingly soluble or insoluble and which is in a volumetric amount of less than 10 times (preferably 5 times or less) the resin solution A, to precipitate a resin solid (step d), and separating the precipitated resin (step e).

It is preferable that the polymerization reaction is carried out in an inert gas atmosphere such as nitrogen and argon. As the polymerization initiator, commercially available radical initiators (azo-based initiators, peroxides, or the like) are used to initiate the polymerization. As the radical initiator, an azo-based initiator is preferable, and the azo-based initiator having an ester group, a cyano group, or a carboxyl group is preferable. Preferred examples of the initiators include azobisisobutyronitrile, azobisdimethylvaleronitrile, and dimethyl 2,2'-azobis(2-methyl propionate). The initiator is added or added in portionwise, depending on the purposes, and after completion of the reaction, the reaction mixture is poured into a solvent, and then a desired polymer is recovered by a method such as powder and solid recovery. The concentration of the reactant is 5% to 50% by mass, and preferably 10% to 30% by mass. The reaction temperature is usually 10° C. to 150° C., preferably 30° C. to 120° C., and more preferably 60° C. to 100° C.

The molecular weight of the resin (A) in the present invention is not particularly limited, but the weight-average molecular weight is preferably in the range of 1,000 to 100,000, more preferably in the range of 1,500 to 60,000, and particularly preferably in the range of 2,000 to 30,000. By setting the weight-average molecular weight to the range of 1,000 to 100,000, deterioration of the heat resistance and the dry etching resistance can be prevented, and deterioration of the developability or of the film forming properties due to increased viscosity can be prevented.

Moreover, the dispersity (Mw/Mn) is preferably 1.00 to 5.00, more preferably 1.00 to 3.50, and still more preferably 1.00 to 2.50. The narrower the molecular-weight distribution of the resin, the more excellent resolution and resist profile are achieved, and the smoother side wall of a resist pattern and the more excellent roughness are obtained.

The resin (A) can be used singly or in combination of two or more kinds thereof. The content of the resin (A) is preferably 20% to 99% by mass, more preferably 30% to 99% by mass, and still more preferably 40% to 99% by mass, with respect to the total solid content in the actinic ray-sensitive or radiation-sensitive resin composition.

[Compound (B) Capable of Generating Acid with Actinic Rays or Radiation]

The actinic ray-sensitive or radiation-sensitive resin composition preferably includes a compound capable of generating an acid with actinic rays or radiation (hereinafter also referred to as a "photoacid generator <<PAG>>").

The photoacid generator may be in a form of a low molecular compound or in a form introduced into a part of a polymer. Further, a combination of the form of a low molecular compound and the form introduced into a part of a polymer may also be used.

In a case where the photoacid generator is in the form of a low molecular compound, the molecular weight thereof is preferably 3,000 or less, more preferably 2,000 or less, and still more preferably 1,000 or less.

In a case where the photoacid generator is in the form introduced into a part of a polymer, it may be introduced into a part of the resin (A) or into a resin other than the resin (A).

In the present invention, it is preferable that the photoacid generator is in the form of a low molecular compound.

Although the photoacid generator is not particularly limited as long as it is a known photoacid generator, the photoacid generator is preferably a compound capable of generating an organic acid, for example, at least one of sulfonic acid, bis(alkylsulfonyl)imide, or tris(alkylsulfonyl)methide, by irradiation with actinic rays or radiation, and preferably electron beams or extreme ultraviolet rays.

More preferred examples of compounds represented by General Formula (ZI), (ZII), and (ZIII) are shown below.

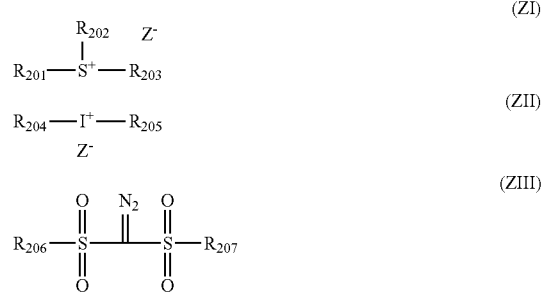

In General Formula (ZI), $R_{201}$, $R_{202}$, and $R_{203}$ each independently represent an organic group.

The number of carbon atoms in the organic group as $R_{201}$, $R_{202}$, and $R_{203}$ is generally 1 to 30, and preferably 1 to 20.

In addition, two members out of $R_{201}$, ..., or $R_{203}$ may be bonded to each other to form a ring structure, and the ring may contain therein an oxygen atom, a sulfur atom, an ester bond, an amide bond, or a carbonyl group. Examples of the group formed by the bonding of two members out of $R_{201}$, ..., or $R_{203}$ include an alkylene group (for example, a butylene group and a pentylene group).

$Z^-$ represents a non-nucleophilic anion (anion having an extremely low ability of causing a nucleophilic reaction).

Examples of the non-nucleophilic anion include a sulfonate anion (such as an aliphatic sulfonate anion, an aromatic sulfonate anion, and a camphor sulfonate anion), a carboxylate anion (such as an aliphatic carboxylate anion, an aromatic carboxylate anion, and an aralkyl carboxylate anion), a sulfonylimide anion, a bis(alkylsulfonyl)imide anion, and a tris(alkylsulfonyl)methide anion.

The aliphatic moiety in the aliphatic sulfonate anion and aliphatic carboxylate anion may be an alkyl group or a cycloalkyl group, and preferred examples thereof include a linear or branched alkyl group having 1 to 30 carbon atoms and a cycloalkyl group having 3 to 30 carbon atoms.

Preferred examples of the aromatic group in the aromatic sulfonate anion and aromatic carboxylate anion include an aryl group having 6 to 14 carbon atoms, such as a phenyl group, a tolyl group, and a naphthyl group.

The alkyl group, the cycloalkyl group, and the aryl group mentioned above may have a substituent. Specific examples of the substituent include a nitro group, a halogen atom such as fluorine atom, a carboxyl group, a hydroxyl group, an amino group, a cyano group, an alkoxy group (preferably having 1 to 15 carbon atoms), a cycloalkyl group (preferably having 3 to 15 carbon atoms), an aryl group (preferably having 6 to 14 carbon atoms), an alkoxycarbonyl group (preferably having 2 to 7 carbon atoms), an acyl group (preferably having 2 to 12 carbon atoms), an alkoxycarbonyloxy group (preferably having 2 to 7 carbon atoms), an alkylthio group (preferably having 1 to 15 carbon atoms), an alkylsulfonyl group (preferably having 1 to 15 carbon atoms), an alkyliminosulfonyl group (preferably having 1 to 15 carbon atoms), an aryloxysulfonyl group (preferably having 6 to 20 carbon atoms), an alkylaryloxysulfonyl group (preferably having 7 to 20 carbon atoms), a cycloalkylaryloxysulfonyl group (preferably having 10 to 20 carbon atoms), an alkyloxyalkyloxy group (preferably having 5 to 20 carbon atoms), and a cycloalkylalkyloxyalkyloxy group (preferably having 8 to 20 carbon atoms). The aryl group or the ring structure which is contained in each group may further have an alkyl group (preferably having 1 to 15 carbon atoms) as a substituent.

Preferred examples of the aralkyl group in the aralkyl carboxylate anion include an aralkyl group having 7 to 12 carbon atoms, such as a benzyl group, a phenethyl group, a naphthylmethyl group, a naphthylethyl group, and a naphthylbutyl group.

Examples of the sulfonylimide anion include a saccharin anion.

The alkyl group in the bis(alkylsulfonyl)imide anion and the tris(alkylsulfonyl)methide anion is preferably an alkyl group having 1 to 5 carbon atoms. Examples of the substituent of this alkyl group include a halogen atom, a halogen atom-substituted alkyl group, an alkoxy group, an alkylthio group, an alkyloxysulfonyl group, an aryloxysulfonyl group, and a cycloalkylaryloxysulfonyl group, with the fluorine atom and the fluorine atom-substituted alkyl group being preferable.

Furthermore, the alkyl groups in the bis(alkylsulfonyl) imide anion may be bonded to each other to form a ring structure. Thus, the acid strength is increased.

Other examples of the non-nucleophilic anion include fluorinated phosphorus (for example, $PF_6^-$), fluorinated boron (for example, $BF_4^-$), and fluorinated antimony (for example, $SbF_6^-$).

The non-nucleophilic anion is preferably an aliphatic sulfonate anion substituted with a fluorine atom at least at the α-position of the sulfonic acid, an aromatic sulfonate anion substituted with a fluorine atom or a fluorine atom-containing group, a bis(alkylsulfonyl)imide anion in which the alkyl group is substituted with a fluorine atom, or a tris(alkylsulfonyl)methide anion in which the alkyl group is substituted with a fluorine atom. The non-nucleophilic anion is more preferably a perfluoroaliphatic sulfonate anion (still more preferably having 4 to 8 carbon atoms) or a fluorine atom-containing benzenesulfonate anion, and still more preferably a nonafluorobutanesulfonate anion, a perfluorooctanesulfonate anion, a pentafluorobenzenesulfonate anion, or a 3,5-bis(trifluoromethyl)benzenesulfonate anion.

From the viewpoint of the acid strength, the pKa of the acid generated is preferably −1 or less so as to improve the sensitivity.

Moreover, an anion represented by General Formula (AN1) may also be a preferred aspect of the non-nucleophilic anion.

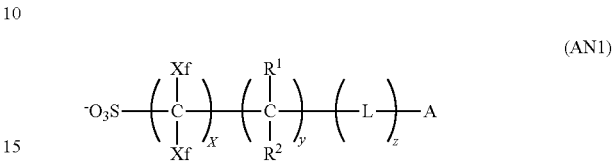

(AN1)

In the formula,

Xf's each independently represent a fluorine atom or an alkyl group substituted with at least one fluorine atom.

$R^1$ and $R^2$ each independently represent a hydrogen atom, a fluorine atom or an alkyl group, and $R^1$'s or $R^2$'s in a case where a plurality of $R^1$'s or $R^2$'s are present may be the same as or different from each other.

L represents a divalent linking group, and L's in a case where a plurality of L's are present may be the same as or different from each other.

A represents a cyclic organic group.

x represents an integer of 1 to 20, y represents an integer of 0 to 10, and z represents an integer of 0 to 10.

General Formula (AN1) will be described in more detail.

The alkyl group in the fluorine atom-substituted alkyl group of Xf is preferably an alkyl group having 1 to 10 carbon atoms, and more preferably an alkyl group having 1 to 4 carbon atoms. Further, the fluorine atom-substituted alkyl group of Xf is preferably a perfluoroalkyl group.

Xf is preferably a fluorine atom or a perfluoroalkyl group having 1 to 4 carbon atoms. Specific examples of Xf include a fluorine atom, $CF_3$, $C_2F_5$, $C_3F_7$, $C_4F_9$, $CH_2CF_3$, $CH_2CH_2CF_3$, $CH_2C_2F_5$, $CH_2CH_2C_2F_5$, $CH_2C_3F_7$, $CH_2CH_2C_3F_7$, $CH_2C_4F_9$, and $CH_2CH_2C_4F_9$, and among these, the fluorine atom and $CF_3$ are preferable. In particular, it is preferable that both Xf's are fluorine atoms.

The alkyl group of each of $R^1$ and $R^2$ may have a substituent (preferably a fluorine atom) and is preferably an alkyl group having 1 to 4 carbon atoms, and more preferably a perfluoroalkyl group having 1 to 4 carbon atoms. Specific examples of the alkyl group having a substituent of $R^1$ and $R^2$ include $CF_3$, $C_2F_5$, $C_3F_7$, $C_4F_9$, $C_5F_{11}$, $C_6F_{13}$, $C_7F_{15}$, $C_8F_{17}$, $CH_2CF_3$, $CH_2CH_2CF_3$, $CH_2C_2F_5$, $CH_2CH_2C_2F_5$, $CH_2C_3F_7$, $CH_2CH_2C_3F_7$, $CH_2C_4F_9$, and $CH_2CH_2C_4F_9$, and among these, $CF_3$ is preferable.

$R^1$ and $R^2$ are each preferably a fluorine atom or $CF_3$.

x is preferably 1 to 10, and more preferably 1 to 5.

y is preferably 0 to 4, and more preferably 0.

z is preferably 0 to 5, and more preferably 0 to 3.

The divalent linking group of L is not particularly limited and examples thereof include —COO—, —OCO—, —CO—, —O—, —S—, —SO—, —SO₂—, an alkylene group, a cycloalkylene group, an alkenylene group, and a linking group formed by combining a plurality thereof. A linking group having a total carbon number of 12 or less is preferable. Among these, —COO—, —OCO—, —CO—, and —O— are preferable, and —COO— and —OCO— are more preferable.

The cyclic organic group of A is not particularly limited as long as it has a cyclic structure, and examples thereof include an alicyclic group, an aryl group, and a heterocyclic group (including not only those having aromaticity but also those having no aromaticity).

The alicyclic group may be monocyclic or polycyclic and is preferably a monocyclic cycloalkyl group such as a cyclopentyl group, a cyclohexyl group, and a cyclooctyl group, or a polycyclic cycloalkyl group such as a norbornyl group, a tricyclodecanyl group, a tetracyclodecanyl group, a tetracyclododecanyl group, and an adamantyl group. Among those, an alicyclic group having a bulky structure having 7 or more carbon atoms, such as a norbornyl group, a tricyclodecanyl group, a tetracyclodecanyl group, a tetracyclododecanyl group, and an adamantyl group, is preferable from the viewpoint that the diffusion in the film in a heating step after exposure can be suppressed and MEEF can be improved.

Examples of the aryl group include a benzene ring, a naphthalene ring, a phenanthrene ring, and an anthracene ring.

Examples of the heterocyclic group include those derived from a furan ring, a thiophene ring, a benzofuran ring, a benzothiophene ring, a dibenzofuran ring, a dibenzothiophene ring, and a pyridine ring. Among these, heterocyclic groups derived from a furan ring, a thiophene ring and a pyridine ring are preferable.

Moreover, other examples of the cyclic organic group include a lactone structure, and specific examples thereof include lactone structures represented by General Formulae (LC1-1) to (LC1-17).

LC1-1

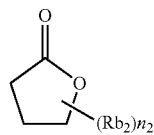

LC1-2

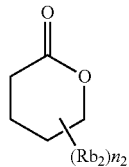

LC1-3

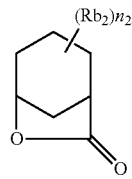

LC1-4

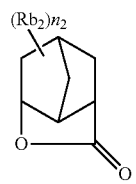

LC1-5

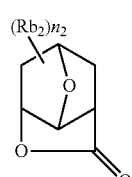

-continued

LC1-6

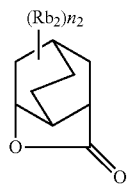

LC1-7

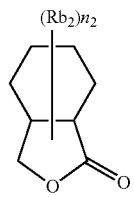

LC1-8

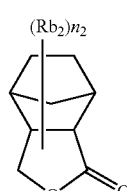

LC1-9

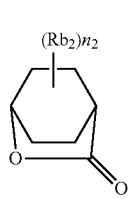

LC1-10

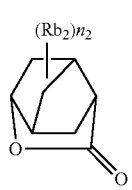

LC1-11

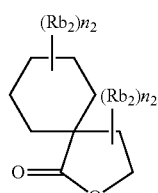

LC1-12

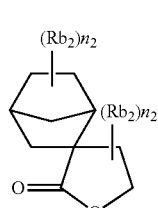

LC1-13

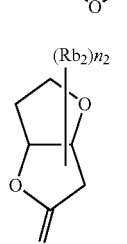

-continued

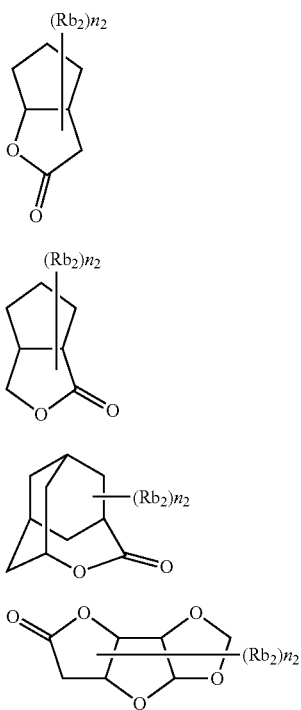

LC1-14

LC1-15

LC1-16

LC1-17

The cyclic organic group may have a substituent, and examples of the substituent include an alkyl group (may be in any one of linear, branched, and cyclic forms; preferably having 1 to 12 carbon atoms), a cycloalkyl group (may be in any one of monocyclic, polycyclic, and spirocyclic forms; preferably having 3 to 20 carbon atoms), an aryl group (preferably having 6 to 14 carbon atoms), a hydroxy group, an alkoxy group, an ester group, an amido group, a urethane group, a ureido group, a thioether group, a sulfonamido group, and a sulfonic acid ester group. Incidentally, the carbon constituting the cyclic organic group (the carbon contributing to ring formation) may be a carbonyl carbon.

Examples of the organic group of $R_{201}$, $R_{202}$, and $R_{203}$ include an aryl group, an alkyl group, and a cycloalkyl group.

At least one of three members $R_{201}$, $R_{202}$, or $R_{203}$ is preferably an aryl group, and it is more preferable that all of these three members are an aryl group. The aryl group may be a heteroaryl group such as indole residue and pyrrole residue, other than a phenyl group, a naphthyl group and the like. The alkyl group and the cycloalkyl group of $R_{201}$ to $R_{203}$ may be preferably a linear or branched alkyl group having 1 to 10 carbon atoms and a cycloalkyl group having 3 to 10 carbon atoms. More preferred examples of the alkyl group include a methyl group, an ethyl group, an n-propyl group, an i-propyl group, and an n-butyl group. More preferred examples of the cycloalkyl group include a cyclopropyl group, a cyclobutyl group, a cyclopentyl group, a cyclohexyl group, and a cycloheptyl group. These groups may further have a substituent, and examples of the substituent include, but are not limited to, a nitro group, a halogen atom such as fluorine atom, a carboxyl group, a hydroxyl group, an amino group, a cyano group, an alkoxy group (preferably having 1 to 15 carbon atoms), a cycloalkyl group (preferably having 3 to 15 carbon atoms), an aryl group (preferably having 6 to 14 carbon atoms), an alkoxycarbonyl group (preferably having 2 to 7 carbon atoms), an acyl group (preferably having 2 to 12 carbon atoms), and an alkoxycarbonyloxy group (preferably having 2 to 7 carbon atoms).

Moreover, in a case where two members out of $R_{201}$ to $R_{203}$ are bonded to form a ring structure, the ring structure is preferably a structure represented by General Formula (A1).

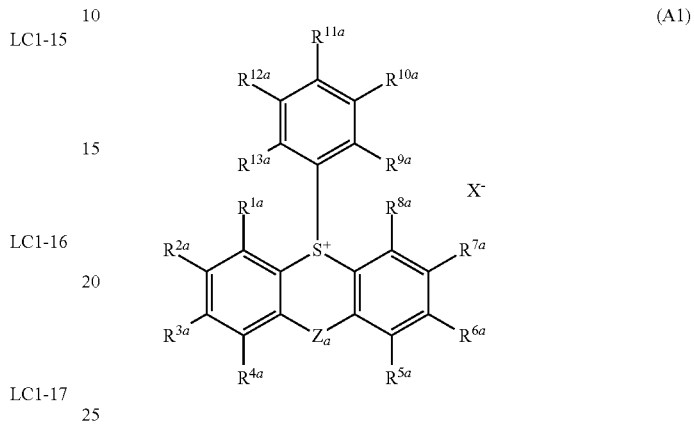

(A1)

In General Formula (A1),
$R^{1a}$ to $R^{13a}$ each independently represent a hydrogen atom or a substituent.

It is preferable that from one to three members out of $R^{1a}$ to $R^{13a}$ are not a hydrogen atom; and it is more preferable that any one of $R^{9a}$ to $R^{13a}$ is not a hydrogen atom.

Za represents a single bond or a divalent linking group.
$X^-$ has the same definition as $Z^-$ in General Formula (ZI).

Specific examples of $R^{1a}$ to $R^{13a}$ in a case where these are not each a hydrogen atom include a halogen atom, a linear, branched, or cyclic alkyl group, an alkenyl group, an alkynyl group, an aryl group, a heterocyclic group, a cyano group, a nitro group, a carboxyl group, an alkoxy group, an aryloxy group, a silyloxy group, a heterocyclic oxy group, an acyloxy group, a carbamoyloxy group, an alkoxycarbonyloxy group, an aryloxycarbonyloxy group, an amino group (including an anilino group), an ammonio group, an acylamino group, an aminocarbonylamino group, an alkoxycarbonylamino group, an aryloxycarbonylamino group, a sulfamoylamino group, alkyl and arylsulfonylamino groups, a mercapto group, an alkylthio group, an arylthio group, a heterocyclic thio group, a sulfamoyl group, a sulfo group, alkyl- and arylsulfinyl groups, alkyl- and arylsulfonyl groups, an acyl group, an aryloxycarbonyl group, an alkoxycarbonyl group, a carbamoyl group, aryl- and heterocyclic azo groups, an imido group, a phosphino group, a phosphinyl group, a phosphinyloxy group, a phosphinylamino group, a phosphono group, a silyl group, a hydrazino group, a ureido group, a boronic acid group (—B(OH)$_2$), a phosphato group (—OPO(OH)$_2$), a sulfato group (—OSO$_3$H), and other known substituents.

In a case where $R^{1a}$ to $R^{13a}$ are not a hydrogen atom, $R^{1a}$ to $R^{13a}$ are each preferably a linear, branched, or cyclic alkyl group substituted with a hydroxyl group.

Examples of the divalent linking group of Za include an alkylene group, an arylene group, a carbonyl group, a sulfonyl group, a carbonyloxy group, a carbonylamino group, a sulfonylamido group, an ether bond, a thioether bond, an amino group, a disulfide group, —(CH$_2$)$_n$—CO—, —(CH$_2$)$_n$—SO$_2$—, —CH=CH—, an aminocarbonylamino group, and an aminosulfonylamino group (n is an integer of 1 to 3).

Incidentally, in a case where at least one of $R_{201}$, $R_{202}$, or $R_{203}$ is not an aryl group, the preferred structure includes a cation structure such as the compounds described in paragraphs 0046 to 0048 of JP2004-233661A and paragraphs 0040 to 0046 of JP2003-35948A, the compounds exemplified as Formulae (I-1) to (I-70) in US2003/0224288A1, and the compounds exemplified as Formulae (IA-1) to (IA-54) and Formulae (IB-1) to (IB-24) in US2003/0077540A1.

In General Formulae (ZII) and (ZIII), $R_{204}$ to $R_{207}$ each independently represent an aryl group, an alkyl group, or a cycloalkyl group.

The aryl group, the alkyl group, and the cycloalkyl group of $R_{204}$ to $R_{207}$ are the same as those mentioned as the aryl group, the alkyl group, and the cycloalkyl group of $R_{201}$ to $R_{203}$ in the compound (ZI) above.

The aryl group, the alkyl group, and the cycloalkyl group of $R_{204}$ to $R_{207}$ may have a substituent. Examples of the substituent include those of the substituent which may be substituted on the aryl group, the alkyl group, and the cycloalkyl group of $R_{201}$ to $R_{203}$ in the compound (ZI).

$Z^-$ represents a non-nucleophilic anion, and examples thereof include the same the non-nucleophilic anions as those of $Z^-$ in General Formula (ZI).

Other examples of the photoacid generator include compounds represented by General Formula (ZIV), (ZV), and (ZVI).

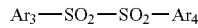

(ZIV)

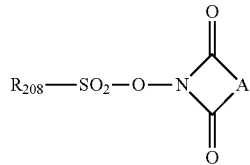

(ZV)

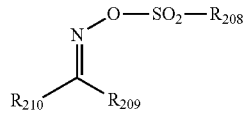

(ZVI)

In General Formulae (ZIV) to (ZVI), $Ar_3$ and $Ar_4$ each independently represent an aryl group.

$R_{208}$, $R_{209}$, and $R_{210}$ each independently represent an alkyl group, a cycloalkyl group, or an aryl group.

A represents an alkylene group, an alkenylene group, or an arylene group.

Specific examples of the aryl group of $Ar_3$, $Ar_4$, $R_{208}$, $R_{209}$, and $R_{210}$ are the same as the specific examples of the aryl group of $R_{201}$, $R_{202}$, and $R_{203}$ in General Formula (ZI).

Specific examples of the alkyl group and the cycloalkyl group of $R_{208}$, $R_{209}$, and $R_{210}$ are the same as the specific examples of the alkyl group and the cycloalkyl group of $R_{201}$, $R_{202}$, and $R_{203}$ in General Formula (ZI).

Examples of the alkylene group of A include an alkylene group having 1 to 12 carbon atoms (for example, a methylene group, an ethylene group, a propylene group, an isopropylene group, a butylene group, and an isobutylene group); examples of the alkenylene group of A include an alkenylene group having 2 to 12 carbon atoms (for example, an ethenylene group, a propenylene group, and a butenylene group); and examples of the arylene group of A include an arylene group having 6 to 10 carbon atoms (for example, a phenylene group, a tolylene group, and a naphthylene group).

In the present invention, from the viewpoint of preventing the acid generated by exposure from diffusing to the unexposed area and improving the resolution, the photoacid generator is preferably a compound capable of generating an acid in a size with a volume of 130 Å$^3$ or more (more preferably a sulfonic acid), more preferably a compound capable of generating an acid in a size with a volume of 190 Å$^3$ or more (more preferably a sulfonic acid), still more preferably a compound capable of generating an acid in a size with a volume of 270 Å$^3$ or more (more preferably sulfonic acid), and particularly preferably a compound capable of generating an acid in a size with a volume of 400 Å$^3$ or more (more preferably sulfonic acid), upon irradiation with electron beams or extreme ultraviolet rays. However, from the viewpoint of the sensitivity or the solubility in the coating solvent, the volume above is preferably 2,000 Å$^3$ or less, and more preferably 1,500 Å$^3$ or less. The value of the volume above was determined using "WinMOPAC" produced by Fujitsu Limited. That is, first, the chemical structure of the acid in each compound is input, next, using this structure as an initial structure, the most stable steric conformation of each acid is determined by molecular force field calculation according to an MM3 method, and then, molecular orbital calculation using a PM3 method is performed with respect to the most stable steric conformation, whereby the "accessible volume" of each acid can be calculated.

In the present invention, a photoacid generator capable of generating acids exemplified below upon irradiation with actinic rays or radiation is preferable. Further, in some of these extensive studies, the calculated value of volume (unit: Å$^3$) is shown together. Incidentally, the calculated value obtained here is a volume value of an acid where a proton is bonded to the anion moiety.

585 Å$^3$

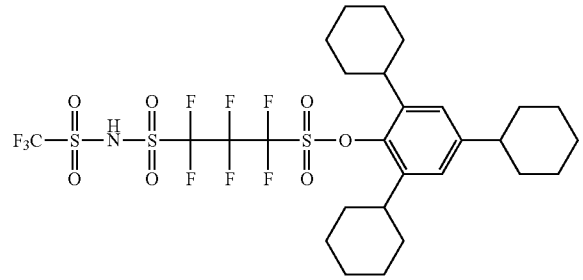

585 Å$^3$

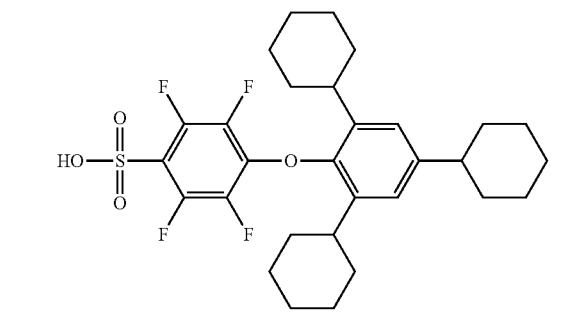

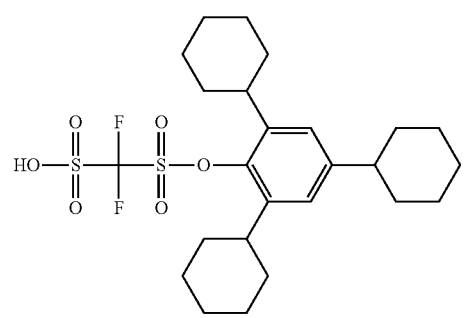 525 Å³
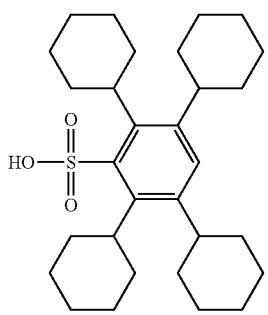 529 Å³
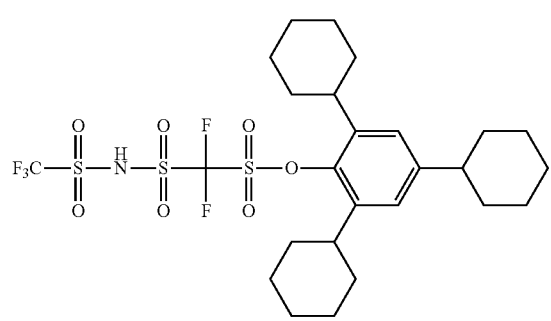 554 Å³
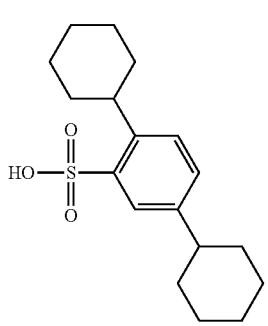 336 Å³
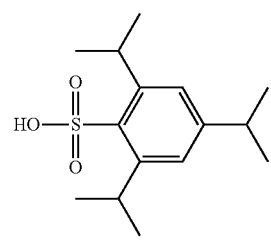 303 Å³
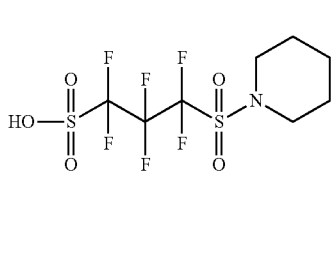 244 Å³
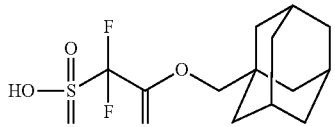 271 Å³
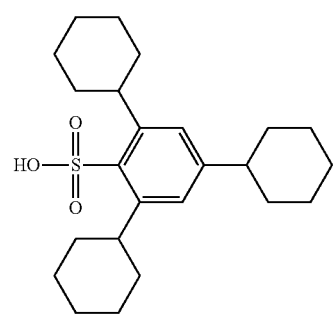 437 Å³
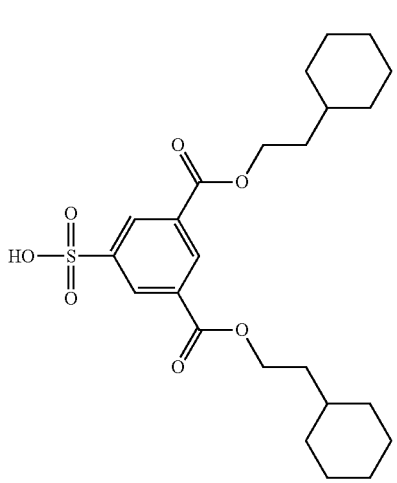 457 Å³
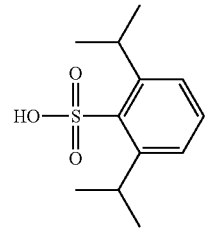 244 Å³

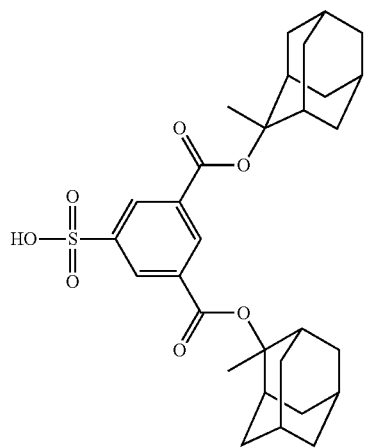
511 Å³
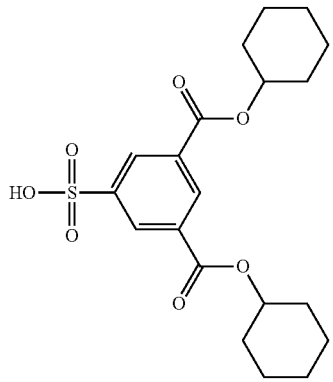
380 Å³
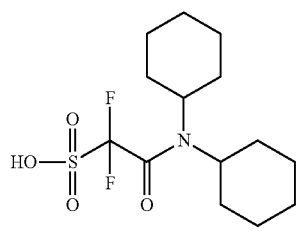
311 Å³
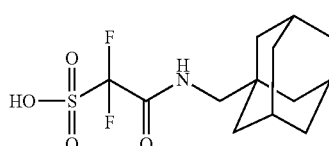
277 Å³
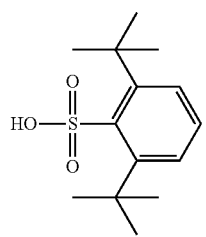
280 Å³
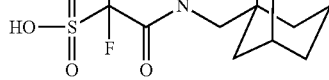
357 Å³
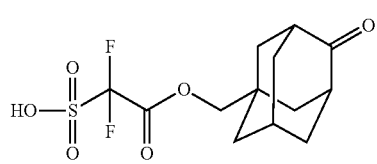
266 Å³
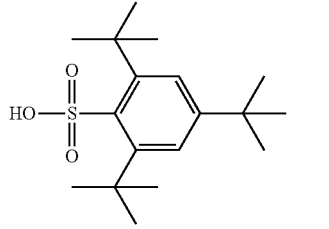
347 Å³
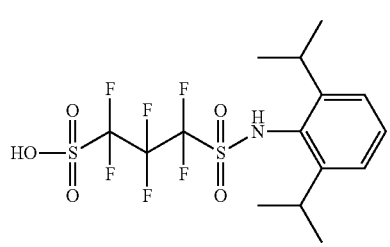
339 Å³
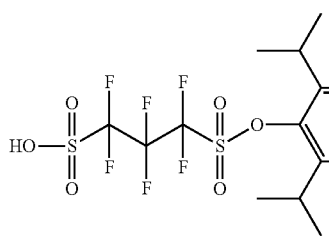
380 Å³
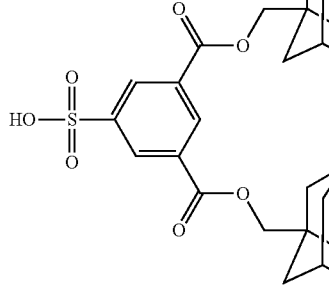
519 Å³

291 Å³
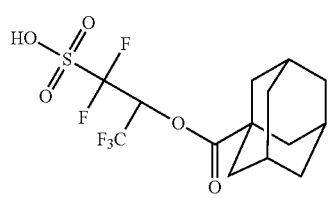
297 Å³
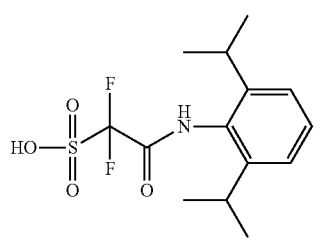
277 Å³
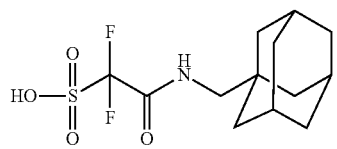
281 Å³
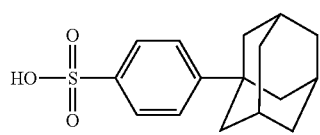
310 Å³
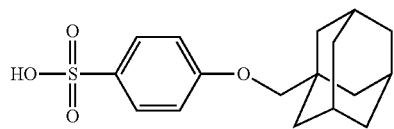
309 Å³
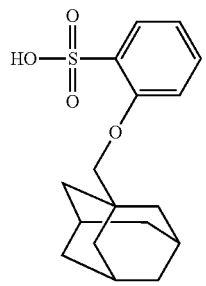
270 Å³
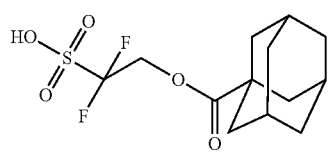
393 Å³
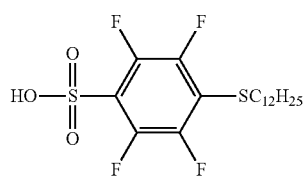
350 Å³
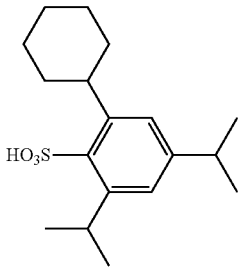
311 Å³
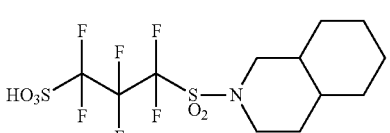
250 Å³
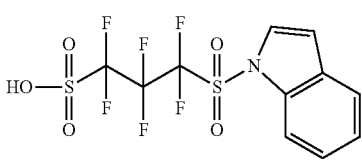
535 Å³
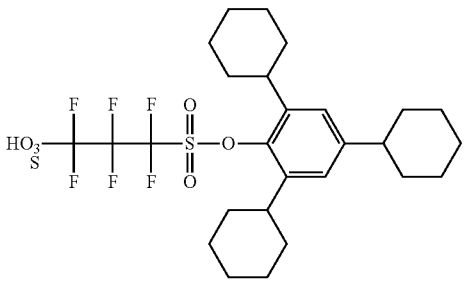
290 Å³
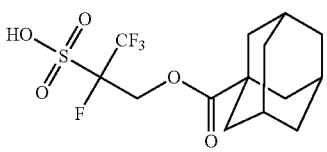
315 Å³
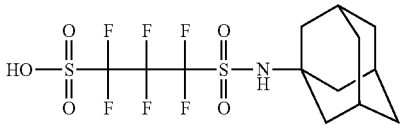
With regard to the photoacid generator, reference can be made to paragraphs [0368] to [0377] of JP2014-41328A, and paragraphs [0240] to [0262] of JP2013-228681A ([0339] of the corresponding US2015/004533A), the contents of which are incorporated herein. Further, the following compounds can be included as the specific preferred examples, but are not limited thereto.

(z1)
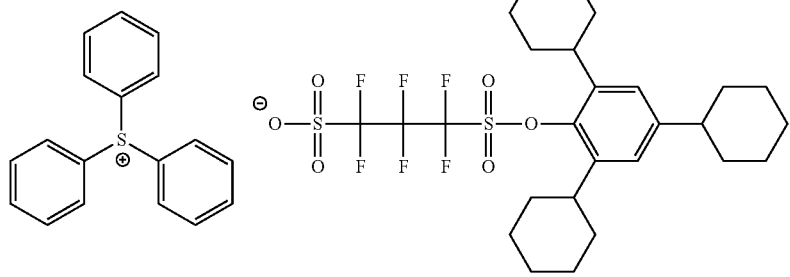
(z2)
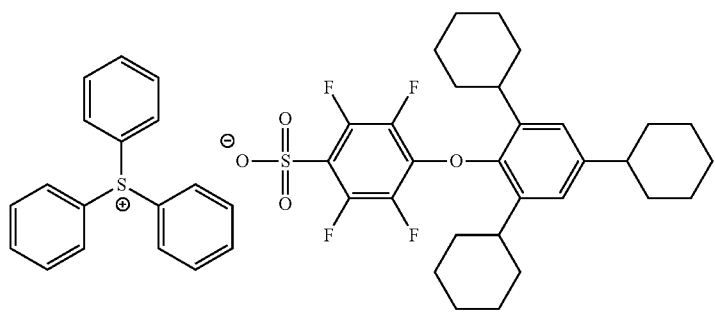
(z3)
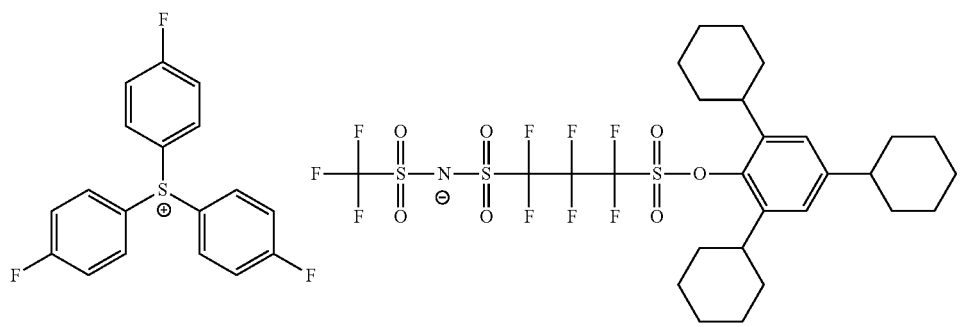
(z4)
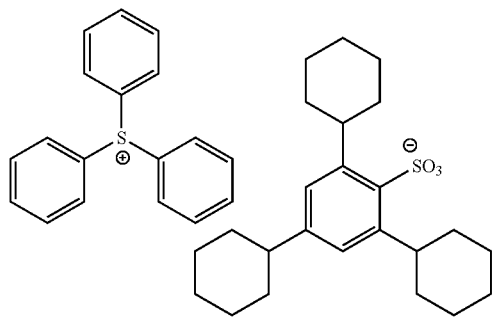
(z5)
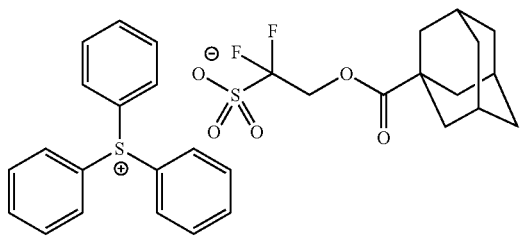
(z6)
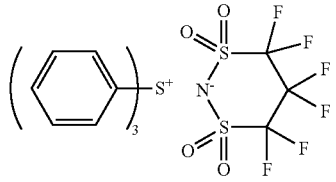
(z7)
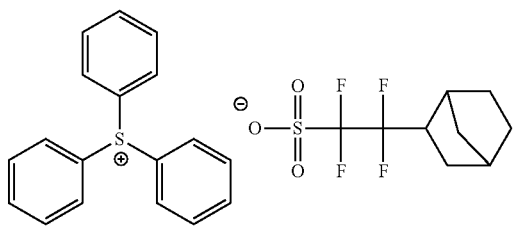

-continued
(z8)
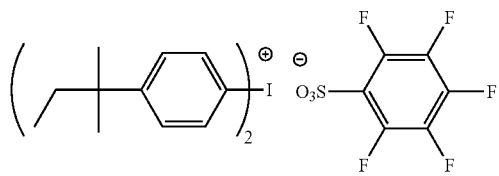
(z9)
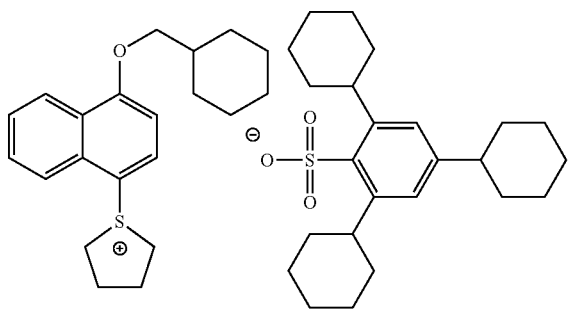
(z10)
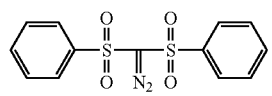
(z11)
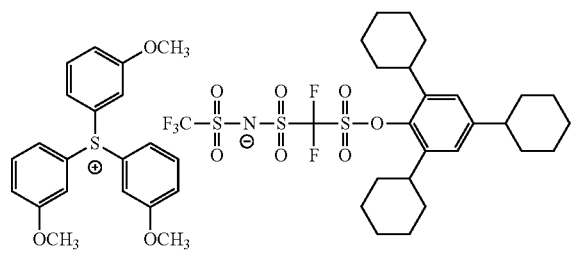
(z12)
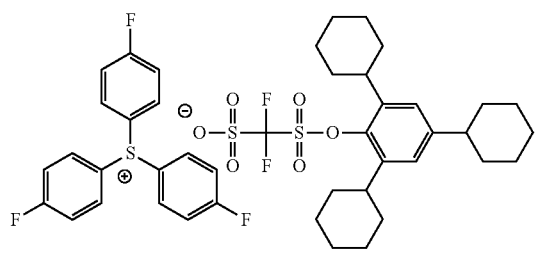
(z13)
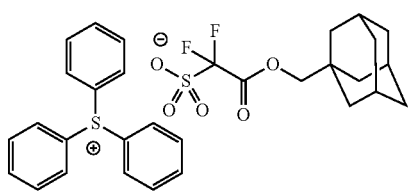
(z14)
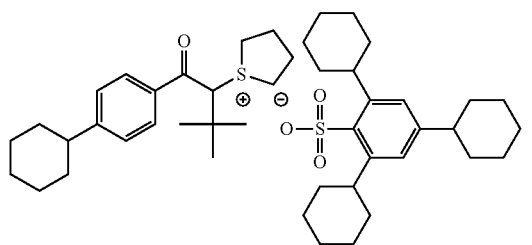
(z15)
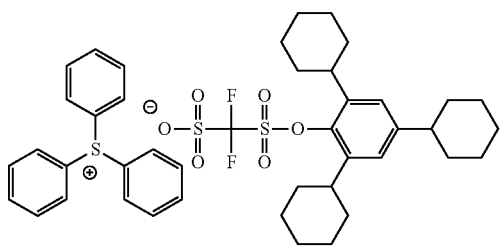
(z16)
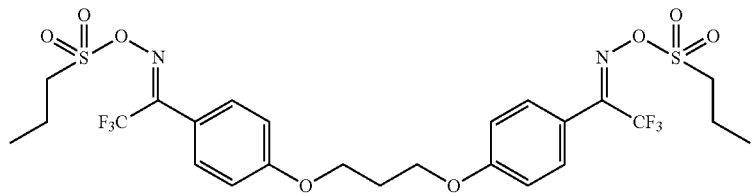
(z17)
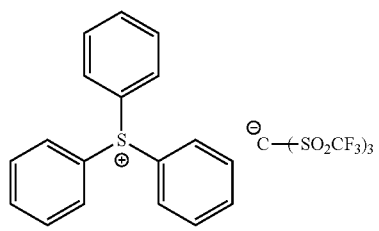

-continued
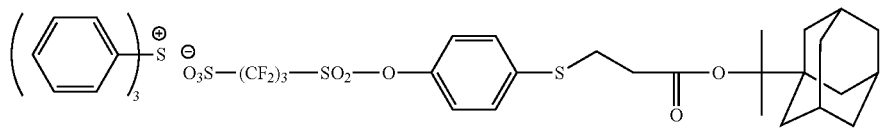 (z18)
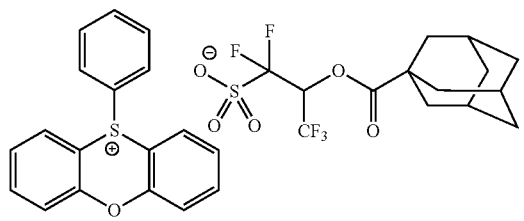 (z19)
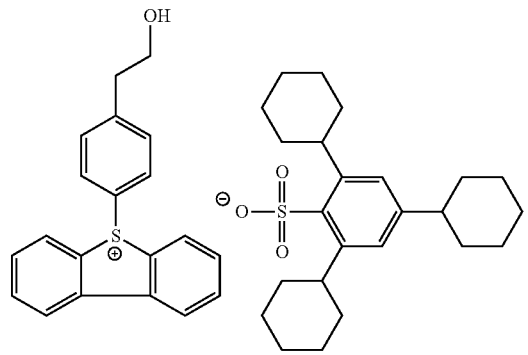 (z20)
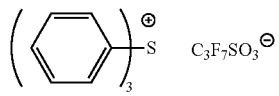 (z21)
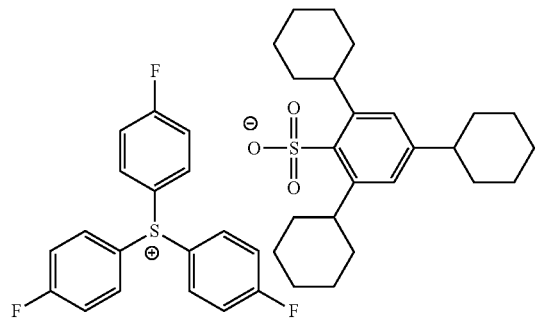 (z22)
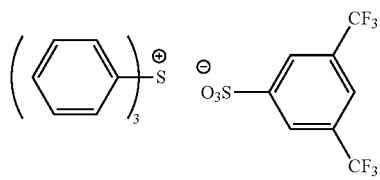 (z23)
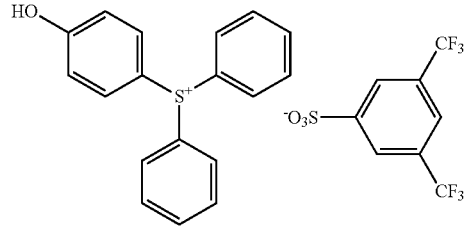 (z24)
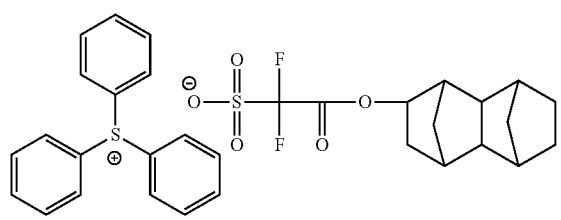 (z25)
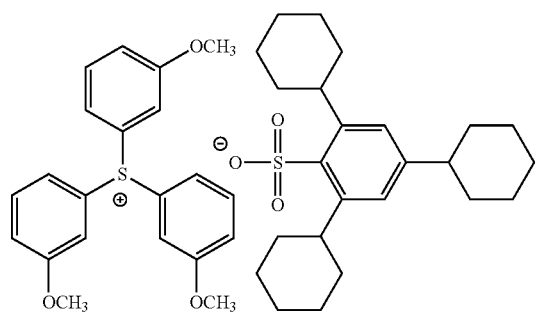 (z26)

(z27)
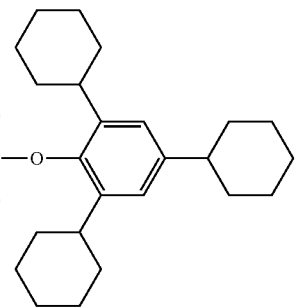
(z28)
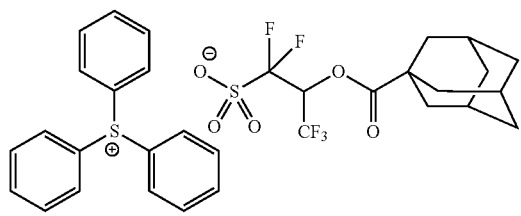
(z29)
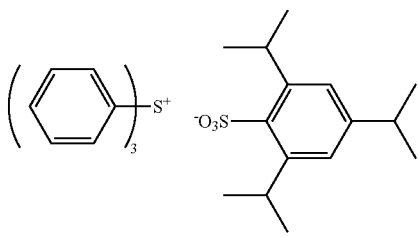
(z30)
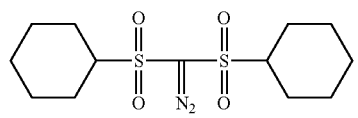
B-1
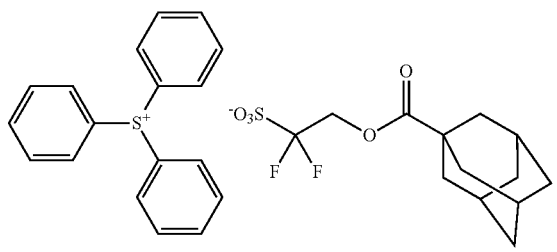
B-2
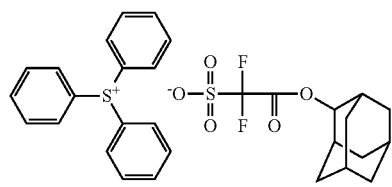
B-3
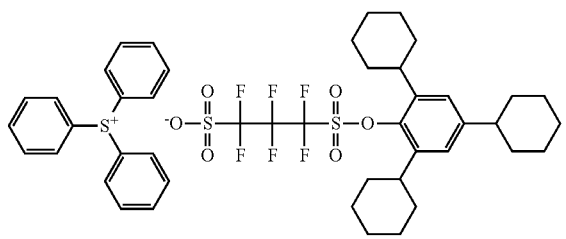
B-4
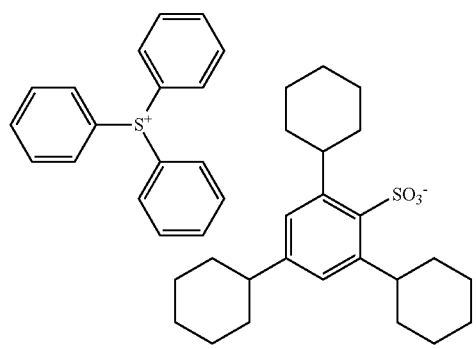
B-5
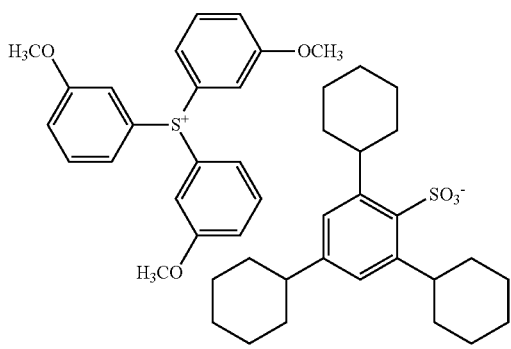

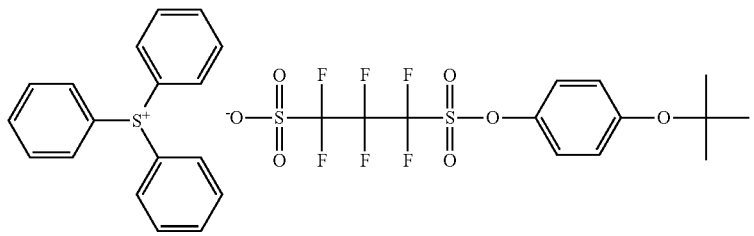
B-6

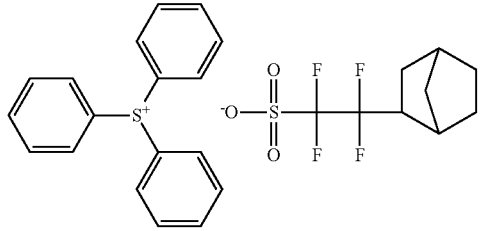
B-7

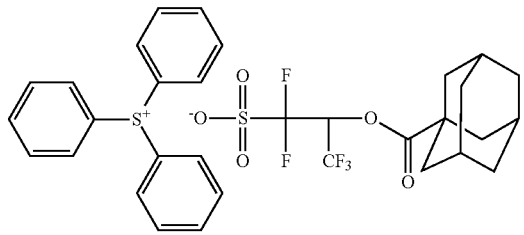
B-8

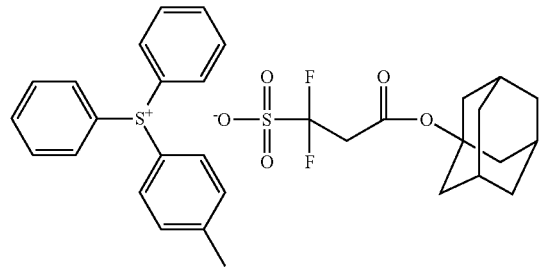
B-9

The photoacid generators may be used singly or in combination of two or more kinds thereof.

The content of the photoacid generator in the actinic ray-sensitive or radiation-sensitive resin composition is preferably 0.1% to 50% by mass, more preferably 5% to 50% by mass, and still more preferably 8% to 40% by mass, with respect to the total solid content of the composition. In particular, in order to satisfy both high sensitivity and high resolution upon exposure using electron beams or extreme ultraviolet rays, the content of the photoacid generator is preferably high, more preferably 10% to 40% by mass, and most preferably 10% to 35% by mass.

[Basic Compound (C')]

The actinic ray-sensitive or radiation-sensitive resin composition used in the step (1) of the present invention may further include a basic compound (C'), in addition to the resin (A). The basic compound (C') is preferably a compound having higher basicity, as compared with phenol. Further, this basic compound is preferably an organic basic compound, and more preferably a nitrogen-containing basic compound.

The usable nitrogen-containing basic compound is not particularly limited, but for example, the compounds which are classified into the following (Q1) to (Q5) can be used.

(Q1) Compound Represented by General Formula (BS-1)

(BS-1)

In General Formula (BS-1),

R's each independently represent a hydrogen atom or an organic group. Here, at least one of three R's is an organic group. This organic group is a linear or branched alkyl group, a monocyclic or polycyclic cycloalkyl group, an aryl group, or an aralkyl group.

The number of carbon atoms in the alkyl group as R is not particularly limited, but is usually 1 to 20, and preferably 1 to 12.

The number of carbon atoms in the cycloalkyl group as R is not particularly limited, but is usually 3 to 20, and preferably 5 to 15.

The number of carbon atoms in the aryl group as R is not particularly limited, but is usually 6 to 20, and preferably 6 to 10. Specific examples thereof include a phenyl group and a naphthyl group.

The number of carbon atoms in the aralkyl group as R is not particularly limited, but is usually 7 to 20, and preferably 7 to 11. Specific examples thereof include a benzyl group.

A hydrogen atom in the alkyl group, the cycloalkyl group, the aryl group, or the aralkyl group as R may be substituted with a substituent. Examples of the substituent include an alkyl group, a cycloalkyl group, an aryl group, an aralkyl group, a hydroxy group, a carboxy group, an alkoxy group, an aryloxy group, an alkylcarbonyloxy group, and an alkyloxycarbonyl group.

Furthermore, it is preferable that at least two of R's in the compound represented by General Formula (BS-1) are organic groups.

Specific examples of the compound represented by General Formula (BS-1) include tri-n-butylamine, tri-n-pentylamine, tri-n-octylamine, tri-n-decylamine, triisodecylamine, dicyclohexylmethylamine, tetradecylamine, pentadecylamine, hexadecylamine, octadecylamine, didecylamine, methyl octadecylamine, dimethylundecylamine, N,N-dimethyldodecylamine, methyl dioctadecylamine, N,N-dibutylaniline, N,N-dihexylaniline, 2,6-diisopropylaniline, and 2,4,6-tri(t-butyl)aniline.

In addition, as the preferable basic compound represented by General Formula (BS-1), an alkyl group in which at least one R is substituted with a hydroxy group is exemplified. Specific examples thereof include triethanolamine and N,N-dihydroxyethylaniline.

Moreover, the alkyl group as R may have an oxygen atom in the alkyl chain. That is, an oxyalkylene chain may be formed. The oxyalkylene chain is preferably —CH$_2$CH$_2$O—. Specific examples thereof include tris (methoxyethoxyethyl)amine and a compound disclosed after line 60 of column 3 in the specification of U.S. Pat. No. 6,040,112A.

Among the basic compounds represented by General Formula (BS-1), examples of such the basic compounds having a hydroxyl group, an oxygen atom, or the like include the following ones.

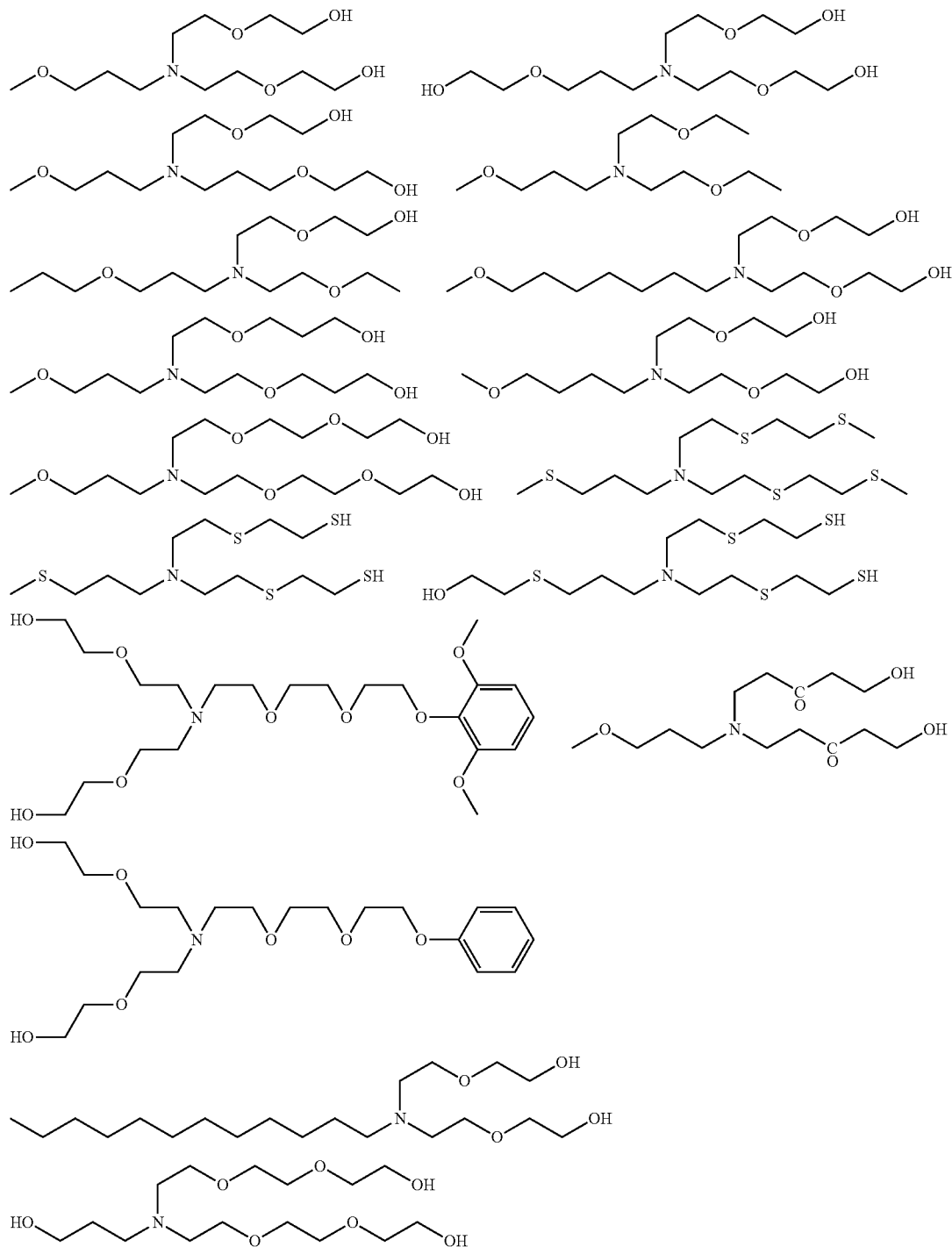

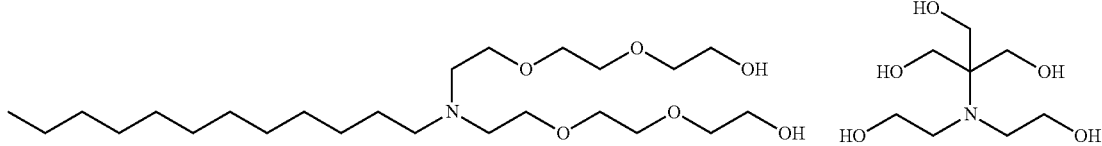

(Q2) Compound Having Nitrogen-Containing Heterocyclic Structure

The nitrogen-containing heterocycle may or may not have aromaticity. The nitrogen-containing heterocycle may have a plurality of nitrogen atoms. Furthermore, the nitrogen-containing heterocycle may contain heteroatoms other than the nitrogen atom. Specific examples thereof include a compound having an imidazole structure (2-phenylbenzimidazole, 2,4,5-triphenylimidazole, and the like), a compound having a piperidine structure [N-hydroxyethylpiperidine, bis(1,2,2,6,6-pentamethyl-4-piperidyl)sebacate, and the like], a compound having a pyridine structure (4-dimethylaminopyridine and the like), and a compound having an antipyrine structure (antipyrine, hydroxyantipyrine, and the like).

Preferred examples of the compound having a nitrogen-containing heterocyclic structure include guanidine, aminopyridine, aminoalkyl pyridine, aminopyrrolidine, indazole, imidazole, pyrazole, pyrazine, pyrimidine, purine, imidazoline, pyrazoline, piperazine, aminomorpholine, and aminoalkyl morpholine. These may further have a substituent.

Preferred examples of the substituent include an amino group, an aminoalkyl group, an alkylamino group, an aminoaryl group, an arylamino group, an alkyl group, an alkoxy group, an acyl group, an acyloxy group, an aryl group, an aryloxy group, a nitro group, a hydroxyl group, and a cyano group.

Particularly preferred examples of the basic compound include imidazole, 2-methylimidazole, 4-methylimidazole, N-methylimidazole, 2-phenylimidazole, 4,5-diphenyl imidazole, 2,4,5-triphenylimidazole, 2-aminopyridine, 3-aminopyridine, 4-aminopyridine, 2-dimethylaminopyridine, 4-dimethylaminopyridine, 2-diethylaminopyridine, 2-(aminomethyl)pyridine, 2-amino-3-methylpyridine, 2-amino-4-methylpyridine, 2-amino-5-methylpyridine, 2-amino-6-methylpyridine, 3-aminoethylpyridine, 4-aminoethyl pyridine, 3-aminopyrrolidine, piperazine, N-(2-aminoethyl)piperazine, N-(2-aminoethyl) piperidine, 4-amino-2,2,6,6-tetramethylpiperidine, 4-piperidinopiperidine, 2-iminopiperidine, 1-(2-aminoethyl)pyrrolidine, pyrazole, 3-amino-5-methylpyrazole, 5-amino-3-methyl-1-p-tolylpyrazole, pyrazine, 2-(aminomethyl)-5-methylpyrazine, pyrimidine, 2,4-diaminopyrimidine, 4,6-dihydroxypyrimidine, 2-pyrazoline, 3-pyrazoline, N-aminomorpholine, and N-(2-aminoethyl)morpholine.

Furthermore, a compound having two or more ring structures is also suitably used. Specific examples thereof include 1,5-diazabicyclo[4.3.0]non-5-ene and 1,8-diazabicyclo[5.4.0]undec-7-ene.

(Q3) Amine Compound Having Phenoxy Group

An amine compound having a phenoxy group is a compound having a phenoxy group at the terminal on the opposite side to the N atom of the alkyl group which is contained in an amine compound. The phenoxy group may have a substituent such as an alkyl group, an alkoxy group, a halogen atom, a cyano group, a nitro group, a carboxy group, a carboxylic acid ester group, a sulfonic acid ester group, an aryl group, an aralkyl group, an acyloxy group, or an aryloxy group.

This compound more preferably has at least one oxyalkylene chain between the phenoxy group and the nitrogen atom. The number of oxyalkylene chains in one molecule is preferably 3 to 9, and more preferably 4 to 6. Among oxyalkylene chains, —$CH_2CH_2O$— is particularly preferable.

Specific examples thereof include 2-[2-{2-(2,2-dimethoxyphenoxyethoxy)ethyl}-bis-(2-methoxyethyl)]amine and the compounds (C1-1) to (C3-3) exemplified in paragraph [0066] in the specification of US2007/0224539A1.

An amine compound having a phenoxy group is obtained by, for example, heating a mixture of a primary or secondary amine having a phenoxy group and an haloalkyl ether to be reacted, by adding an aqueous solution of a strong base such as sodium hydroxide, potassium hydroxide, or tetraalkylammonium thereto, and by extracting the resultant product with an organic solvent such as ethyl acetate and chloroform. In addition, an amine compound having a phenoxy group can also be obtained by heating a mixture of a primary or secondary amine and an haloalkyl ether having a phenoxy group at the terminal to be reacted, by adding an aqueous solution of a strong base such as sodium hydroxide, potassium hydroxide, or tetraalkylammonium thereto, and by extracting the resultant product with an organic solvent such as ethyl acetate and chloroform.

(Q4) Ammonium Salt

An ammonium salt can also be appropriately used as the basic compound.

As the cation of the ammonium salt, a tetraalkylammonium cation in which an alkyl group having 1 to 18 carbon atoms is substituted is preferable, a tetramethylammonium cation, a tetraethylammonium cation, a tetra(n-butyl)ammonium cation, a tetra(n-heptyl)ammonium cation, a tetra(n-octyl)ammonium cation, a dimethylhexadecylammonium cation, a benzyltrimethyl cation, or the like is more preferable, and tetra(n-butyl)ammonium cation is the most preferable.

Examples of the anion of the ammonium salt include hydroxide, carboxylate, halide, sulfonate, borate, and phosphate. Among these, hydroxide or carboxylate is particularly preferable.

The halide is particularly preferably chloride, bromide, or iodide.

The sulfonate is particularly preferably an organic sulfonate having 1 to 20 carbon atoms. Examples of the organic sulfonate include alkyl sulfonate and aryl sulfonate, having 1 to 20 carbon atoms.

The alkyl group included in the alkyl sulfonate may have a substituent. Examples of the substituent include a fluorine atom, a chlorine atom, a bromine atom, an alkoxy group, an acyl group, and an aryl group. Specific examples of the alkyl sulfonate include methanesulfonate, ethanesulfonate, butanesulfonate, hexanesulfonate, octanesulfonate, benzyl sulfonate, trifluoromethanesulfonate, pentafluoroethanesulfonate, and nonafluorobutanesulfonate.

Examples of the aryl group included in the aryl sulfonate include a phenyl group, a naphthyl group, and an anthryl group. These aryl groups may have a substituent. As the substituent, for example, a linear or branched alkyl group having 1 to 6 carbon atoms or a cycloalkyl group having 3 to 6 carbon atoms is preferable. Specifically, for example, a methyl group, an ethyl group, an n-propyl group, an isopropyl group, an n-butyl group, an i-butyl group, a t-butyl group, an n-hexyl group, or a cyclohexyl group is preferable. Examples of other substituents include an alkoxy group having 1 to 6 carbon atoms, a halogen atom, a cyano group, a nitro group, an acyl group, and an acyloxy group.

The carboxylate may be an aliphatic carboxylate or an aromatic carboxylate, and examples thereof include acetate, lactate, pyruvate, trifluoroacetate, adamantane carboxylate, hydroxyadamantane carboxylate, benzoate, naphthoate, salicylate, phthalate, and phenolate, and, in particular, benzoate, naphthoate, or phenolate is preferable, and benzoate is the most preferable.

In this case, the ammonium salt is preferably tetra(n-butyl)ammonium benzoate, tetra(n-butyl)ammonium phenolate, or the like.

In a case where the ammonium salt is hydroxide, the ammonium salt is particularly preferably tetraalkylammonium hydroxide (tetraalkylammonium hydroxide such as tetramethylammonium hydroxide, tetraethylammonium hydroxide, and tetra-n-butyl)ammonium hydroxide) having 1 to 8 carbon atoms.

(Q5) Low Molecular Compound Having Nitrogen Atom and Group Capable of Leaving by Action of Acid The actinic ray-sensitive or radiation-sensitive resin composition used in the present invention can include a low molecular compound having a nitrogen atom and a group capable of leaving by the action of an acid. The compound preferably has basicity after the group capable of leaving by the action of an acid leaves.

With regard to the compound, reference can be made to the description in paragraphs [0324] to [0337] of JP2012-133331A, the contents of which are incorporated herein.

In the present invention, the compound may be used singly or as a mixture of two or more kinds thereof.

Other examples of the basic compound which can be used in the actinic ray-sensitive or radiation-sensitive resin composition include the compounds synthesized in Examples of JP2002-363146A and the compounds described in paragraph 0108 of JP2007-298569A.

A photosensitive basic compound may also be used as the basic compound (C'). As the photosensitive basic compound, for example, the compounds described in JP2003-524799A, J. Photopolym. Sci. & Tech., Vol. 8, P. 543 to 553 (1995), or the like can be used.

Preferred specific examples of the basic compound (C') include the following compounds, but are not limited thereto.

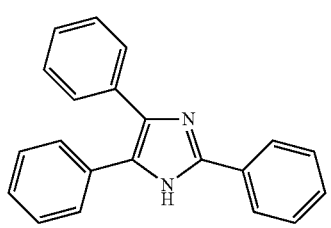
C-1

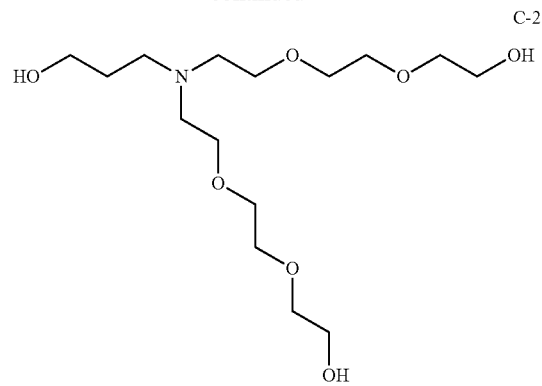
C-2

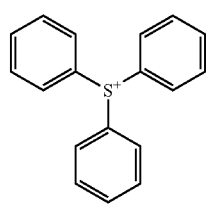
C-3

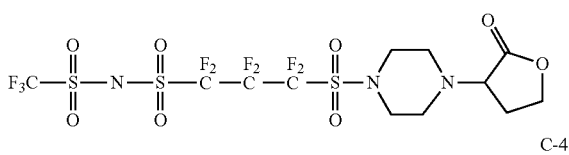
C-4

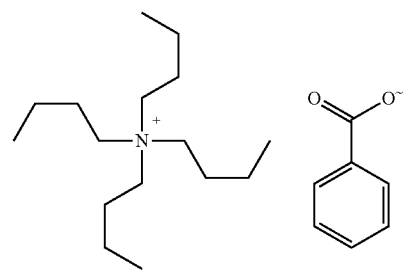
C-5

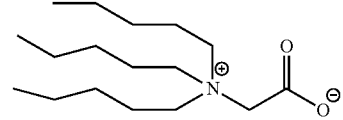
C-6

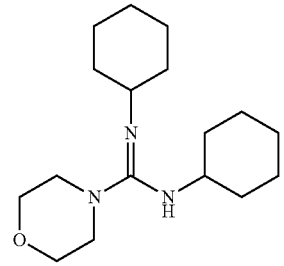

The molecular weight of the basic compound (C') is typically 100 to 1,500, preferably 150 to 1,300, and more preferably 200 to 1,000.

These basic compounds (C') may be used singly or in combination of thereof.

The actinic ray-sensitive or radiation-sensitive resin composition used in the present invention may or may not include the basic compound (C'). However, in a case where the basic compound (C') is included in the composition, the content thereof is preferably 0.01% to 8.0% by mass, more preferably 0.1% to 5.0% by mass, and particularly preferably 0.2% to 4.0% by mass, with respect to the total solid content of the composition.

The molar ratio of the basic compound (C') to the photoacid generator is preferably set to 0.01 to 10, more preferably set to 0.05 to 5, and still more preferably set to 0.1 to 3. In a case where the molar ratio is excessively large, the sensitivity and/or the resolution is/are reduced in some cases. In a case where the molar ratio is excessively small, there is a possibility that thinning of a pattern occurs, during exposure and heating (post-baking). The molar ratio is more preferably 0.05 to 5, and still more preferably 0.1 to 3.

(D) Solvent

The actinic ray-sensitive or radiation-sensitive resin composition used in the present invention preferably includes a solvent (D). The solvent preferably includes at least one with at least one selected from the group consisting of propylene glycol monoalkyl ether carboxylate (M1), propylene glycol monoalkyl ether (M2), lactic acid ester, acetic acid ester, alkoxypropionic acid ester, chain ketone, cyclic ketone, lactone, and alkylene carbonate. Further, the solvent may further include a component other than the component (M1) and the component (M2).

The present inventors have found that in a case where such a solvent and the above-mentioned resin are used in combination, the coatability of a composition is improved, and a pattern having a small number of development defects can be formed. The reason is not clear, but the present inventors consider that the reason is due to the fact that, since these solvents have excellent balance among solubility with respect to the above-mentioned resin, a boiling point, and viscosity, unevenness in the film thickness of the composition film or the generation of precipitates during the spin coating can be suppressed.

As the component (M1), at least one selected from the group consisting of propylene glycol monomethyl ether acetate, propylene glycol monomethyl ether propionate, and propylene glycol monoethyl ether acetate is preferable, and propylene glycol monomethyl ether acetate is particularly preferable.

The component (M2) is preferably the following one.

The propylene glycol monoalkyl ether is preferably propylene glycol monomethyl ether or propylene glycol monoethyl ether.

The lactic acid ester is preferably ethyl lactate, butyl lactate, or propyl lactate.

The acetic acid ester is preferably methyl acetate, ethyl acetate, butyl acetate, isobutyl acetate, propyl acetate, isoamyl acetate, methyl formate, ethyl formate, butyl formate, propyl formate, or 3-methoxybutyl acetate.

Butyl butyrate is also preferable.

The alkoxypropionic acid ester is preferably methyl 3-methoxypropionate (MMP) or ethyl 3-ethoxypropionate (EEP).

The chain ketone is preferably 1-octanone, 2-octanone, 1-nonanone, 2-nonanone, acetone, 4-heptanone, 1-hexanone, 2-hexanone, diisobutyl ketone, phenyl acetone, methyl ethyl ketone, methyl isobutyl ketone, acetyl acetone, acetonyl acetone, ionone, diacetonyl alcohol, acetyl carbinol, acetophenone, methyl naphthyl ketone, or methyl amyl ketone.

The cyclic ketone is preferably methyl cyclohexanone, isophorone, or cyclohexanone.

The lactone is preferably γ-butyrolactone.

The alkylene carbonate is preferably propylene carbonate.

The component (M2) is more preferably propylene glycol monomethyl ether, ethyl lactate, ethyl 3-ethoxypropionate, methyl amyl ketone, cyclohexanone, butyl acetate, pentyl acetate, γ-butyrolactone, or propylene carbonate.

In addition to the components, it is preferable to use an ester-based solvent having 7 or more carbon atoms (preferably 7 to 14 carbon atoms, more preferably 7 to 12 carbon atoms, and still more preferably 7 to 10 carbon atoms), and having 2 or less heteroatoms.

Preferred examples of the ester-based solvent having 7 or more carbon atom and 2 or less heteroatoms include amyl acetate, 2-methylbutyl acetate, 1-methylbutyl acetate, hexyl acetate, pentyl propionate, hexyl propionate, butyl propionate, isobutyl isobutyrate, heptyl propionate, and butyl butanoate, and isoamyl acetate is particularly preferably used.

As the component (M2), a component having a flash point (hereinafter also referred to as fp) of 37° C. or higher is preferably used. Such the component (M2) is preferably propylene glycol monomethyl ether (fp: 47° C.), ethyl lactate (fp: 53° C.), ethyl 3-ethoxypropionate (fp: 49° C.), methyl amyl ketone (fp: 42° C.), cyclohexanone (fp: 44° C.), pentyl acetate (fp: 45° C.), methyl 2-hydroxyisobutyrate (fp: 45° C.), γ-butyrolactone (fp: 101° C.), or propylene carbonate (fp: 132° C.). Among these, propylene glycol monoethyl ether, ethyl lactate, pentyl acetate, or cyclohexanone is more preferable, and propylene glycol monoethyl ether or ethyl lactate is particularly preferable. In addition, the "flash point" described here means a value described in the reagent catalog of Tokyo Chemical Industry Co., Ltd. or Sigma-Aldrich Co. LLC.

The solvent preferably includes the component (M1). It is more preferable that the solvent consists of substantially only the component (M1) or is a mixed solvent of the component (M1) and other components. In the latter case, the solvent still more preferably includes both the component (M1) and the component (M2).

The mass ratio of the component (M1) to the component (M2) is preferably within a range of 100:0 to 15:85, more preferably within a range of 100:0 to 40:60, and still more preferably within a range of 100:0 to 60:40. That is, it is preferable that the solvent consists of only the component (M1), or includes both the component (M1) and the component (M2) and the mass ratio thereof is as follows. That is, in the latter case, the mass ratio of the component (M1) to the component (M2) is preferably 15/85 or more, more preferably 40/60 or more, and still more preferably 60/40 or more. In a case where such a configuration is adopted, the number of development defects can further be reduced.

Moreover, in a case where the solvent includes both the component (M1) and the component (M2), the mass ratio of the component (M1) to the component (M2) is, for example, set to 99/1 or less.

As described above, the solvent may further include a component other than the component (M1) and the component (M2). In this case, the content of the component other than the component (M1) and the component (M2) is preferably within a range of 5% by mass to 30% by mass with respect to the total amount of the solvent.

The content of the solvent in the composition is preferably set such that the concentration of the solid contents of all the components becomes 0.5% to 30% by mass, and more preferably set such that the concentration of the solid contents of all the components becomes 1% to 20% by mass. By doing this, the coatability of the composition can further be improved.

Hydrophobic Resin (E)

The actinic ray-sensitive or radiation-sensitive resin composition in the present invention may have a hydrophobic resin (E), in addition to the resin (A).

It is preferable that the hydrophobic resin is designed to be unevenly distributed to the surface of a resist film, but in contrast to a surfactant, the hydrophobic resin is not necessarily required to have a hydrophilic group in the molecule, and may not contribute to uniform mixing of polar/nonpolar substances.

Examples of the effect of addition of the hydrophobic resin include control of a static/dynamic contact angle of the resist film surface for water, and suppression of out gas.

From the viewpoint of unevenly distribution to the film surface layer, it is preferable that the hydrophobic resin contains one or more kind of any of "a fluorine atom", "a silicon atom", and "a $CH_3$ partial structure contained in the side chain moiety of the resin", and it is more preferable that the hydrophobic resin contains two or more kinds thereof. Further, it is preferable that the hydrophobic resin contains a hydrocarbon group having 5 or more carbon atoms. These groups may be contained in the main chain or may be substituted in the side chain.

In a case where the hydrophobic resin contains a fluorine atom and/or a silicon atom, the fluorine atom and/or the silicon atom in the hydrophobic resin may be contained in the main chain of the resin or may be contained in the side chain of the resin.

In a case where the hydrophobic resin contains a fluorine atom, the resin is preferably a resin containing an alkyl group having a fluorine atom, a cycloalkyl group having a fluorine atom, or an aryl group having a fluorine atom, as the partial structure containing a fluorine atom.

The alkyl group having a fluorine atom (preferably having 1 to 10 carbon atoms, and more preferably 1 to 4 carbon atoms) is a linear or branched alkyl group which has at least one hydrogen atom substituted with a fluorine atom and may further have a substituent other than the fluorine atom.

The cycloalkyl group having a fluorine atom is a monocyclic or polycyclic cycloalkyl group with at least one hydrogen atom being substituted for by a fluorine atom and may further have a substituent other than fluorine atom.

The aryl group having a fluorine atom is an aryl group such as phenyl group or naphthyl group which has at least one hydrogen atom substituted with a fluorine atom and may further have a substituent other than the fluorine atom.

Examples of the repeating unit having a fluorine atom or a silicon atom include those exemplified in paragraph 0519 of US2012/0251948A1.

Moreover, it is also preferable that the hydrophobic resin has a $CH_3$ partial structure in the side chain moiety thereof, as described above.

Here, the $CH_3$ partial structure which the hydrophobic resin has in the side chain moiety thereof (sometimes referred to as "side chain $CH_3$ partial structures") are intended to include $CH_3$ partial structure which an ethyl group, a propyl group and the like have, respectively.

On the other hand, a methyl group bonded directly to the main chain of the hydrophobic resin (for example, an α-methyl group in the repeating unit having a methacrylic acid structure) makes only a small contribution to surface localization of the hydrophobic resin due to the influence of the main chain, and therefore it is not included in the $CH_3$ partial structure in the present invention.

With regard to the hydrophobic resin, reference can be made to the description in [0348] of JP2014-010245A, the contents of which are incorporated herein.

Incidentally, as the hydrophobic resin, those described in JP2011-248019A, JP2010-175859A, and JP2012-032544A can also be preferably used.

In the pattern forming method of the present invention, a resist film can be formed on a substrate, using the actinic ray-sensitive or radiation-sensitive resin composition, and a topcoat layer can be formed on the resist film, using the topcoat composition. The film thickness of this resist film is preferably 10 to 100 nm, and the film thickness of the topcoat layer is preferably 10 to 200 nm, more preferably 20 to 100 nm, and particularly preferably 40 to 80 nm.

As a method for applying the actinic ray-sensitive or radiation-sensitive resin composition onto the substrate, spin coating is preferable, and the rotation speed is preferably 1,000 to 3,000 rpm.

For example, the actinic ray-sensitive or radiation-sensitive resin composition is applied onto a substrate which is used in the manufacture of a precision integrated circuit element (e.g.: silicon/silicon dioxide coating) by a suitable coating method such as with a spinner or a coater, and dried to form a resist film. Incidentally, a well-known antireflection film may be coated in advance. In addition, it is preferable to dry the resist film before forming a topcoat layer.

Subsequently, the topcoat composition is applied onto the obtained resist film by the same method as the method for forming the resist film, and the topcoat composition is dried to form the topcoat layer.

A resist film having the topcoat layer on an upper layer is irradiated with electron beams, X-rays, or extreme ultraviolet rays, usually through a mask, preferably baked (heated), and developed. Thus, a good pattern can be obtained.

Surfactant (F)

The actinic ray-sensitive or radiation-sensitive resin composition used in the present invention may further include a surfactant (F). By the incorporation of the surfactant, in a case where an exposure light source having a wavelength of 250 nm or less, in particular, 220 nm or less, is used, a pattern having good sensitivity, resolution, and adhesiveness, and smaller development defects can be formed.

As the surfactant, a fluorine-based and/or silicon-based surfactant is particularly preferably used.

Examples of the fluorine-based and/or the silicon-based surfactant include the surfactants described in paragraph [0276] of US2008/0248425A. Further, examples of the commercially available surfactants that can be used include fluorine-based surfactants or silicon-based surfactants such as EFTOP EF301 and EF303 (manufactured by Shin-Akita Kasei K. K.); FLORAD FC430, 431, and 4430 (manufactured by Sumitomo 3M Inc.); MEGAFACE F171, F173, F176, F189, F113, F110, F177, F120, and R08 (manufactured by DIC Corp.); SURFLON S-382, SC101, 102, 103, 104, 105, and 106 (manufactured by Asahi Glass Co., Ltd.); TROYSOL S-366 (manufactured by Troy Chemical Corp.); GF-300 and GF-150 (manufactured by Toagosei Chemical Industry Co., Ltd.); SURFLON S-393 (manufactured by Seimi Chemical Co., Ltd.); EFTOP EF121, EF122A, EF122B, RF122C, EF125M, EF135M, EF351, EF352, EF801, EF802, and EF601 (manufactured by JEMCO Inc.); PF636, PF656, PF6320, and PF6520 (manufactured by OMNOVA Solutions Inc.); and FTX-204G, 208G, 218G, 230G, 204D, 208D, 212D, 218D, and 222D (manufactured by NEOS COMPANY LIMITED). In addition, Polysiloxane Polymer KP-341 (manufactured by Shin-Etsu Chemical Co., Ltd.) can also be used as the silicon-based surfactant.

Furthermore, in addition to those known surfactants as described above, a surfactant may be synthesized using a fluoroaliphatic compound which is produced by a telomerization method (also referred to as a telomer method) or an oligomerization method (also referred to as an oligomer method). Specifically, a polymer containing a fluoroaliphatic group derived from the fluoroaliphatic compound may also be used as the surfactant. The fluoroaliphatic compound can be synthesized by the method described in JP2002-90991A.

In addition, surfactants other than the fluorine-based surfactant and/or the silicon-based surfactants described in paragraph [0280] of US2008/0248425A may be used.

These surfactants may be used singly or in combination of two or more kinds thereof.

In a case where the actinic ray-sensitive or radiation-sensitive resin composition used in the present invention includes a surfactant, the content thereof is preferably 0% to 2% by mass, more preferably 0.0001% to 2% by mass, and still more preferably 0.0005% to 1% by mass, with respect to the total solid content of the composition.

Other Additives (G)

The actinic ray-sensitive or radiation-sensitive resin composition used in the present invention may further include a compound (for example, a phenol compound having a molecular weight of 1,000 or less, or an alicyclic or aliphatic compound including a carboxy group) promoting solubility with respect to a dissolution inhibiting compound, a dye, a plasticizer, a photosensitizer, a light absorber, and/or a developer.

The actinic ray-sensitive or radiation-sensitive resin composition used in the present invention may further include a dissolution inhibiting compound. Here, the "dissolution inhibiting compound" is a compound having a molecular weight of 3,000 or less, which decreases the degree of solubility in an organic developer by being decomposed due to the action of an acid.

As the dissolution inhibiting compound, an alicyclic or aliphatic compound which contains an acid-decomposable group such as a cholic acid derivative which includes an acid-decomposable group described in the Proceeding of SPIE, 2724, 355 (1996) is preferable since the transparency with respect to light having a wavelength of 220 nm or less is not reduced. Examples of the acid-decomposable group and the alicyclic structure include the same as those exemplified above.

Hereinafter, a pattern forming method using the above-mentioned resin composition will be described in more detail.

<<Step (1)>>

A film is formed using an actinic ray-sensitive or radiation-sensitive resin composition including the resin (A) having an acid-decomposable repeating unit capable of decomposing by the action of an acid to generate an acid having a pKa of 3.0 or less. The step (1) of forming a film on a substrate using the composition can be carried out by a generally known method.

In the present invention, the substrate on which a film is formed is not particularly limited. As the substrate, a substrate which is generally used for a process for manufacturing a semiconductor such as an IC, the manufacture of a circuit board for a liquid crystal, a thermal head, or the like, and other lithographic processes for photofabrication can be used. Examples of such a substrate include inorganic substrates such as silicon, SiN, and $SiO_2$, and coated inorganic substrates such as SOG. Further, an organic antireflection film may be formed between a film and a substrate, as desired.

After film formation, a pre-heating (PB; Prebake) step is also preferably included before the exposing step. In addition, after the exposing step and before the developing step, a post-exposure heating (Post Exposure Bake; PEB) step is also preferably included.

Both the PB step and the PEB step are carried out at a heating temperature of preferably 40° C. to 130° C., more preferably 50° C. to 120° C., and still more preferably 60° C. to 120° C. In particular, in a case where the PEB step is carried out at a low temperature of 60° C. to 90° C., exposure latitude (EL) and resolving power can be significantly improved.

In addition, the heating time is preferably 30 seconds to 300 seconds, more preferably 30 seconds to 180 seconds, and still more preferably 30 seconds to 90 seconds.

<<Step (2)>>

The film formed above is exposed using actinic rays or radiation. The step of exposing the film can also be carried out by a generally known method.

The above light source used for exposure is preferably X-rays, extreme ultraviolet rays, or electron beams.

The film formed using the actinic ray-sensitive or radiation-sensitive resin composition used in the present invention may be subjected to liquid immersion exposure. Thus, the resolution can be increased. Although the immersion medium used is not particularly limited as long as it is liquid having a higher refractive index than air, pure water is preferable.

In this case, a hydrophobic resin may also be added to the composition, or after film formation, a topcoat may also be provided on the film. Further, the performance required for the topcoat and the method of use thereof are explained in Chapter 7 in "Process and Ingredient of Immersion Lithography" published by CMC Publishing Co., Ltd.

In a case where the topcoat is released after exposure, a developer may be used, or a separate release agent may be used. As the release agent, a solvent which hardly permeates into a film is preferable. From the viewpoint of being capable of performing a releasing step simultaneously with a developing treatment step of a film, the topcoat can be preferably released with a developer.

<<Step (3)>>

A negative tone pattern is formed by carrying out development using a developer including an organic solvent after the exposing step (2). The developing step can be carried out by a generally known method.

Examples of the developing method include a method in which a substrate is immersed in a tank filled with a developer for a certain period of time (a dip method), a method in which a developer is heaped up to the surface of a substrate by surface tension and developed by stopping for a certain period of time (a paddle method), a method in which a developer is sprayed on the surface of a substrate (a spray method), and a method in which a developer is continuously discharged on a substrate rotated at a constant rate while scanning a developer discharging nozzle at a constant rate (a dynamic dispense method).

In a case where the above-described various developing method includes a step of discharging a developer toward a resist film from a developing nozzle of a developing device, the discharge pressure (flow rate per unit area of the developer to be discharged) of the developer to be discharged is preferably 2 mL/sec/mm$^2$ or less, more preferably 1.5 mL/sec/mm$^2$ or less, and still more preferably 1 mL/sec/mm$^2$ or less. The lower limit of the flow rate is not particularly limited, but 0.2 mL/sec/mm$^2$ or more is preferable in consideration of throughput.

By setting the discharge pressure of the developer to be discharged is within the above range, the defects of the pattern resulting from resist residues after development can be significantly reduced.

Details of the mechanism are not clear, but it is considered that this is probably since the pressure applied to the resist film by the developer decreases by setting the discharge pressure within the above range, or unexpected scraping or collapsing of the composition film and/or the pattern is suppressed.

Moreover, the discharge pressure (mL/sec/mm$^2$) of a developer is a value at the developing nozzle exit in the developing device.

Examples of the method of adjusting the discharge pressure of a developer include a method of adjusting the discharge pressure using a pump and a method of adjusting the pressure by supply from a pressure tank.

In addition, after the step of carrying out development, a step of stopping the development while replacing with another solvent may be carried out.

<Developer>

The developer is used in the developing step (3) and an organic developer formed by incorporating an organic solvent can be used as the developer.

(Organic Solvent)

The vapor pressure (total vapor pressure in a case of a mixed solvent) of the organic solvent is preferably 5 kPa or less, more preferably 3 kPa or less, and particularly preferably 2 kPa or less, at 20° C. By setting the vapor pressure of the organic developer to 5 kPa or less, the evaporation of the developer on a substrate or in a development cup is suppressed, and the temperature evenness within a wafer plane is improved, whereby the dimensional evenness within a wafer plane is enhanced.

As the organic solvent used in the developer, various organic solvents are widely used, and, for example, solvents such as an ester-based solvent, a ketone-based solvent, an alcohol-based solvent, an amide-based solvent, an ether-based solvent, and a hydrocarbon-based solvent can be used.

In the present invention, the ester-based solvent refers to a solvent having an ester group in the molecule, the ketone-based solvent refers to a solvent having a ketone group in the molecule, the alcohol-based solvent refers to a solvent having an alcoholic hydroxyl group in the molecule, the amide-based solvent refers to a solvent having an amido group in the molecule, and the ether-based solvent refers to a solvent having an ether bond in the molecule. Among these, a solvent having a plurality of functional groups described above in one molecule may also be present, but in this case, it is assumed that the solvent also corresponds to any solvent type including the functional group which the solvent has. For example, it is assumed that diethylene glycol monomethyl ether also corresponds to any of the alcohol-based solvent, or the ether-based solvent, in the above classification. In addition, the hydrocarbon-based solvent is a hydrocarbon solvent having no substituent.

In particular, a developer containing at least one kind of solvent selected from a ketone-based solvent, an ester-based solvent, an alcohol-based solvent, and an ether-based solvent is preferable.

Examples of the ester-based solvent can include methyl acetate, ethyl acetate, butyl acetate, isobutyl acetate, pentyl acetate, propyl acetate, isopropyl acetate, amyl acetate (pentyl acetate), isoamyl acetate (isopentyl acetate, 3-methylbutyl acetate), 2-methylbutyl acetate, 1-methylbutyl acetate, hexyl acetate, heptyl acetate, octyl acetate, methoxyethyl acetate, ethoxyethyl acetate, butyl butyrate, methyl 2-hydroxyisobutyrate, propylene glycol monomethyl ether acetate (PGMEA; also referred to as 1-methoxy-2-acetoxypropane), ethylene glycol monoethyl ether acetate, ethylene glycol monopropyl ether acetate, ethylene glycol monobutyl ether acetate, ethylene glycol monophenyl ether acetate, diethylene glycol monomethyl ether acetate, diethylene glycol monopropyl ether acetate, diethylene glycol monoethyl ether acetate, diethylene glycol monophenyl ether acetate, diethylene glycol monobutyl ether acetate, diethylene glycol monoethyl ether acetate, 2-methoxybutylacetate, 3-methoxybutylacetate, 4-methoxybutylacetate, 3-methyl-3-methoxybutylacetate, 3-ethyl-3-methoxybutylacetate, propylene glycol monoethyl ether acetate, propylene glycol monopropyl ether acetate, 2-ethoxybutylacetate, 4-ethoxybutylacetate, 4-propoxybutylacetate, 2-methoxypentylacetate, 3-methoxypentylacetate, 4-methoxypentylacetate, 2-methyl-3-methoxypentylacetate, 3-methyl-3-methoxypentylacetate, 3-methyl-4-methoxypentylacetate, 4-methyl-4-methoxypentylacetate, propylene glycol diacetate, methyl formate, ethyl formate, butyl formate, propyl formate, ethyl lactate, butyl lactate, propyl lactate, ethyl carbonate, propyl carbonate, butyl carbonate, methyl pyruvate, ethyl pyruvate, propyl pyruvate, butyl pyruvate, methyl acetoacetate, ethyl acetoacetate, methyl propionate, ethyl propionate, propyl propionate, isopropyl propionate, pentyl propionate, hexyl propionate, heptyl propionate, butyl butanoate, isobutyl butanoate, pentyl butanoate, hexyl butanoate, isobutyl isobutanoate, propyl pentanoate, isopropyl pentanoate, butyl pentanoate, pentyl pentanoate, ethyl hexanoate, propyl hexanoate, butyl hexanoate, isobutyl hexanoate, methyl heptanoate, ethyl heptanoate, propyl heptanoate, cyclohexyl acetate, cycloheptyl acetate, 2-ethylhexyl acetate, cyclopentylpropionate, methyl 2-hydroxypropionate, ethyl 2-hydroxypropionate, methyl-3-methoxypropionate, ethyl-3-methoxypropionate, ethyl-3-ethoxypropionate, and propyl-3-methoxypropionate. Among these, butyl acetate, amyl acetate, isoamyl acetate, 2-methylbutyl acetate, 1-methylbutyl acetate, hexyl acetate, pentyl propionate, hexyl propionate, heptyl propionate, or butyl butanoate is preferably used, and isoamyl acetate is particularly preferably used.

Examples of the ketone-based solvent include 1-octanone, 2-octanone, 1-nonanone, 2-nonanone, acetone, 2-heptanone, 4-heptanone, 1-hexanone, 2-hexanone, diisobutyl ketone, cyclohexanone, methylcyclohexanone, phenylacetone, methyl ethyl ketone, methyl isobutyl ketone, acetyl acetone, acetonyl acetone, ionone, diacetonyl alcohol, acetyl carbinol, acetophenone, methyl naphthyl ketone, isophorone, propylene carbonate, and γ-butyrolactone. Among those, 2-heptanone is preferable.

Examples of the alcohol-based solvent include alcohols (monovalent alcohols) such as methanol, ethanol, 1-propanol, isopropanol, 1-butanol, 2-butanol, 3-methyl-1-butanol, tert-butyl alcohol, 1-pentanol, 2-pentanol, 1-hexanol, 1-heptanol, 1-octanol, 1-decanol, 2-hexanol, 2-heptanol, 2-octanol, 3-hexanol, 3-heptanol, 3-octanol, 4-octanol, 3-methyl-3-pentanol, cyclopentanol, 2,3-dimethyl-2-butanol, 3,3-dimethyl-2-butanol, 2-methyl-2-pentanol, 2-methyl-3-pentanol, 3-methyl-2-pentanol, 3-methyl-3-pentanol, 4-methyl-2-pentanol, 4-methyl-3-pentanol, cyclohexanol, 5-methyl-2-hexanol, 4-methyl-2-hexanol, 4,5-methyl-2-hexanol, 6-methyl-2-heptanol, 7-methyl-2-octanol, 8-methyl-2-nonal, 9-methyl-2-decanol, and 3-methoxy-1-butanol, glycol-based solvents such as ethylene glycol, diethylene glycol, and triethylene glycol, and hydroxyl group-containing glycol ether-based solvents such as ethylene glycol monomethyl ether, propylene glycol monomethyl ether (PGME; also referred to as 1-methoxy-2-propanol), diethylene glycol monomethyl ether, triethylene glycol monoethyl ether, methoxymethylbutanol, ethylene glycol monoethyl ether, ethylene glycol monopropyl ether, ethylene glycol monobutyl ether, propylene glycol monoethyl ether, propylene glycol monopropyl ether, propylene glycol monobutyl ether, propylene glycol monophenyl ether. Among these, glycol ether-based solvents are preferably used.

Examples of the ether-based solvent include glycol ether-based solvents having no hydroxyl group, such as propylene glycol dimethyl ether, propylene glycol diethyl ether, diethylene glycol dimethyl ether, and diethylene glycol diethyl ether, aromatic ether solvents such as anisole and phenetole, dioxane, tetrahydrofuran, tetrahydropyran, perfluoro-2-butyltetrahydrofuran, perfluorotetrahydrofuran, and 1,4-dioxane, in addition to the glycol ether-based solvents containing a hydroxyl group. A glycol ether-based solvent or an aromatic ether solvent such as anisole is preferably used.

Examples of the amide-based solvent which can be used include N-methyl-2-pyrrolidone, N,N-dimethylacetamide, N,N-dimethylformamide, hexamethylphosphoric triamide, and 1,3-dimethyl-2-imidazolidinone.

Examples of the hydrocarbon-based solvent include aliphatic hydrocarbon-based solvents such as pentane, hexane, octane, nonane, decane, dodecane, undecane, hexadecane, 2,2,4-trimethylpentane, 2,2,3-trimethylhexane, perfluorohexane, and perfluoroheptane, and aromatic hydrocarbon-based solvents such as toluene, xylene, ethyl benzene, propyl benzene, 1-methylpropyl benzene, 2-methylpropyl benzene, dimethyl benzene, diethyl benzene, ethylmethyl benzene, trimethyl benzene, ethyldimethyl benzene, and dipropyl benzene.

In a case of using extreme ultraviolet rays or electron beams in the exposing step, the developer preferably uses an ester-based solvent having 7 or more carbon atoms (preferably 7 to 14 carbon atoms, more preferably 7 to 12 carbon atoms, and still more preferably 7 to 10 carbon atoms) and 2 or less heteroatoms in view that swelling of the resist film can be suppressed.

Examples of the heteroatom of the ester-based solvent include an oxygen atom, a nitrogen atom, and a sulfur atom as an atom other than a carbon atom and a hydrogen atom. The number of heteroatoms is preferably 2 or less.

Examples of the ester-based solvent having 7 or more carbon atoms and 2 or less heteroatoms include amyl acetate, isoamyl acetate, 2-methylbutyl acetate, 1-methylbutyl acetate, hexyl acetate, pentyl propionate, hexyl propionate, butyl propionate, isobutyl isobutyrate, heptyl propionate, and butyl butanoate, and isoamyl acetate is particularly preferably used.

In a case of using extreme ultraviolet rays or electron beams in the exposing step, the developer may use a mixed solvent of the ester-based solvent and the hydrocarbon-based solvent, or a mixed solvent of the ketone-based solvent and the hydrocarbon solvent, instead of the above-mentioned ester-based solvent having 7 or more carbon atoms and 2 or less heteroatoms. Also, this case is effective for suppression of the swelling of the resist film.

In a case of the ester-based solvent and the hydrocarbon-based solvent in combination, isoamyl acetate is preferably used as the ester-based solvent. Further, from the viewpoint of adjusting the solubility of the resist film, a saturated hydrocarbon solvent (for example, octane, nonane, decane, dodecane, undecane, and hexadecane) is preferably used as the hydrocarbon-based solvent.

In a case of the ketone-based solvent and the hydrocarbon-based solvent in combination, 2-heptanone is preferably used as the ketone-based solvent. Further, from the viewpoint of adjusting the solubility of the resist film, a saturated hydrocarbon solvent (for example, octane, nonane, decane, dodecane, undecane, and hexadecane) is preferably used as the hydrocarbon-based solvent.

In a case of using the above mixed solvents, the content of the hydrocarbon-based solvent depends on the solubility of the resist film in the solvent, and thus, it is not particularly limited and the required amount thereof may be determined by appropriate adjustment.

A plurality of the above organic solvents may be used in combination, or the solvent may be used in combination with a solvent other than the solvents described above or water. Here, in order to exhibit the effects of the present invention sufficiently, the moisture content of the entirety of the developer is preferably less than 10% by mass, and the developer more preferably substantially does not contain moisture. The concentration of the organic solvent (a sum total content in a case where a plurality of solvents are mixed together) in the developer is preferably 50% by mass or more, more preferably 50% to 100% by mass, still preferably 85% to 100% by mass, even still more preferably 90% to 100% by mass, and particularly preferably 95% to 100% by mass. A case where the developer is formed of substantially only an organic solvent is the most preferable. Moreover, a case where the developer is formed of substantially only an organic solvent includes a case where trace amounts of a surfactant, an antioxidant, a stabilizer, or an antifoaming agent are contained.

Suitable examples of the organic solvent used as the developer include ester-based solvents. As the ester-based solvent, a solvent represented by General Formula (S1) which will be described later or a solvent represented by General Formula (S2) which will be described later is more preferably used, the solvent represented by General Formula (S1) is still more preferably used, alkyl acetate is particularly preferably used, and butyl acetate, pentyl acetate, or isopentyl acetate is most preferably used.

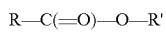   General Formula (S1)

In General Formula (S1), R and R' each independently represent a hydrogen atom, an alkyl group, a cycloalkyl group, an alkoxyl group, an alkoxycarbonyl group, a carboxyl group, a hydroxyl group, a cyano group, or a halogen atom. R and R' may be bonded to each other to form a ring.

The alkyl group, the alkoxyl group, or the alkoxycarbonyl group represented by each of R and R' preferably has 1 to 15 carbon atoms, and the cycloalkyl group represented by each of R and R' preferably has 3 to 15 carbon atoms.

R and R' are each preferably a hydrogen atom or an alkyl group, and the alkyl group, the cycloalkyl group, the alkoxyl group, and the alkoxycarbonyl group represented by each of R and R', and a ring formed by bonding of R and R' to each other may be substituted with a hydroxyl group, a group including a carbonyl group (for example, an acyl group, an aldehyde group, and alkoxycarbonyl), a cyano group, or the like.

Examples of the solvent represented by General Formula (S1) include methyl acetate, butyl acetate, ethyl acetate, isopropyl acetate, amyl acetate, isoamyl acetate, methyl formate, ethyl formate, butyl formate, propyl formate, ethyl lactate, butyl lactate, propyl lactate, ethyl carbonate, propyl carbonate, butyl carbonate, methyl pyruvate, ethyl pyruvate, propyl pyruvate, butyl pyruvate, methyl acetoacetate, ethyl acetoacetate, methyl propionate, ethyl propionate, propyl propionate, isopropyl propionate, methyl 2-hydroxypropionate, and ethyl 2-hydroxy propionate.

Among these, a solvent in which R and R' are unsubstituted alkyl groups is preferable.

As the solvent represented by General Formula (S1), alkyl acetate is preferable, butyl acetate, amyl acetate (pentyl acetate), or isoamyl acetate (isopentyl acetate) is more preferable, and isoamyl acetate is still more preferable.

The solvent represented by General Formula (S1) may be used in combination with one or more other kinds of organic solvents. The solvent used in combination in this case is not particularly limited as long as it can be mixed in without being separating from the solvent represented by General Formula (S1), the solvents represented by General Formula (S1) may be used in combination with each other, or a solvent represented by General Formula (S1) may be used by being mixed with a solvent selected from other ester-based solvents, ketone-based solvents, alcohol-based solvents, amide-based solvents, ether-based solvents, and hydrocarbon-based solvents. One or more solvents can be used in combination, but one solvent is preferably used in combination in order to obtain a stable performance. The mixing ratio to the solvent represented by General Formula (S1) to a solvent used in combination in a case where one solvent is used in combination by being mixed is typically 20:80 to 99:1, preferably 50:50 to 97:3, more preferably 60:40 to 95:5, and most preferably 60:40 to 90:10, in terms of a mass ratio.

As the organic solvent used as a developer, a glycol ether-based solvent can be used. As the glycol ether-based solvent, a solvent represented by General Formula (S2) may be used.

R''—C(=O)—O—R'''—O—R''''  General Formula (S2)

In General Formula (S2),

R'' and R'''' each independently represent a hydrogen atom, an alkyl group, a cycloalkyl group, an alkoxyl group, an alkoxycarbonyl group, a carboxyl group, a hydroxyl group, a cyano group, or a halogen atom. R'' and R'''' may be bonded to each other to form a ring. R'' and R'''' are each preferably a hydrogen atom or an alkyl group. The alkyl group, the alkoxyl group, or the alkoxycarbonyl group represented by each of R'' and R'''' preferably has 1 to 15 carbon atoms, and the cycloalkyl group represented by each of R'' and R'''' preferably has 3 to 15 carbon atoms. R''' represents an alkylene group or a cycloalkylene group. R''' is preferably an alkylene group. The alkylene group represented by R''' preferably has 1 to 10 carbon atoms. The cycloalkylene group represented by to R''' preferably has 3 to 10 carbon atoms. The alkyl group, the cycloalkyl group, the alkoxyl group, or the alkoxycarbonyl group represented by each of R'' and R'''', the alkylene group or the cycloalkylene group represented by R''', and a ring formed by the mutual bonding of R'' and R'''' may be substituted with a hydroxyl group, a group containing a carbonyl group (for example, an acyl group, an aldehyde group, and an alkoxycarbonyl group), a cyano group, or the like.

In General Formula (S2), the alkylene group for R''' may have an ether bond in the alkylene chain.

Examples of the solvent represented by General Formula (S2) include propylene glycol monomethyl ether acetate, ethylene glycol monoethyl ether acetate, ethylene glycol monopropyl ether acetate, ethylene glycol monobutyl ether acetate, ethylene glycol monophenyl ether acetate, diethylene glycol monomethyl ether acetate, diethylene glycol monopropyl ether acetate, diethylene glycol monophenyl ether acetate, diethylene glycol monobutyl ether acetate, diethylene glycol monoethyl ether acetate, propylene glycol monoethyl ether acetate, propylene glycol monopropyl ether acetate, methyl-3-methoxypropionate, ethyl-3-methoxypropionate, ethyl-3-ethoxypropionate, propyl-3-methoxypropionate, ethyl methoxyacetate, ethyl ethoxyacetate, 2-methoxybutyl acetate, 3-methoxybutyl acetate, 4-methoxybutyl acetate, 3-methyl-3-methoxybutyl acetate, 3-ethyl-3-methoxybutyl acetate, 2-ethoxybutyl acetate, 4-ethoxybutyl acetate, 4-propoxybutyl acetate, 2-methoxypentyl acetate, 3-methoxypentyl acetate, 4-methoxypentyl acetate, 2-methyl-3-methoxypentyl acetate, 3-methyl-3-methoxypentyl acetate, 3-methyl-4-methoxypentyl acetate, and 4-methyl-4-methoxypentyl acetate, and propylene glycol monomethyl ether acetate is preferable.

Among these, it is preferable that R'' and R'''' are each an unsubstituted alkyl group and R''' is an unsubstituted alkylene group, R'' and R'''' are each more preferably either a methyl group or an ethyl group, and R'' and R'''' are each still more preferably a methyl group.

The solvent represented by General Formula (S2) may be used in combination with one or more kinds of other organic solvents. The solvent used in combination in this case is not particularly limited as long as it can be mixed in without being separating from the solvent represented by General Formula (S2), the solvents represented by General Formula (S2) may be used in combination with each other, or a solvent represented by General Formula (S2) may be used by being mixed with a solvent selected from other ester-based solvents, ketone-based solvents, alcohol-based solvents, amide-based solvents, ether-based solvents, and hydrocarbon-based solvents. One or more solvents can be used in combination, but one solvent is preferably used in combination in order to obtain a stable performance. The mixing ratio to the solvent represented by General Formula (S2) and a solvent in a case where one solvent is used in combination by being mixed is typically 20:80 to 99:1, preferably 50:50 to 97:3, more preferably 60:40 to 95:5, and most preferably 60:40 to 90:10, in terms of a mass ratio.

In addition, suitable examples of the organic solvent used as a developer also include an ether-based solvent.

Examples of s the ether-based solvent which can be used include the ether-based solvents described above, and among these, an ether-based solvent including one or more aromatic rings is preferable, a solvent represented by the following General Formula (S3) is more preferable, and anisole is most preferable.

(S3)

In General Formula (S3), $R_S$ represents an alkyl group. An alkyl group having 1 to 4 carbon atoms is preferable, a methyl group or an ethyl group is more preferable, and a methyl group is most preferable.

As the organic solvent included in the developer, the organic solvents which are used in the actinic ray-sensitive or radiation-sensitive composition can be used.

The developer preferably contains an antioxidant. Thus, generation of oxidizing agents over time can be suppressed, and the content of the oxidizing agent can further be reduced. As the antioxidant, known ones can be used, but in a case of being used in semiconductor applications, an amine-based antioxidant or a phenol-based antioxidant is preferably used.

The content of the antioxidant is not particularly limited, but is preferably 0.0001% to 1% by mass, more preferably 0.0001% to 0.1% by mass, and still more preferably 0.0001% to 0.01% by mass, with respect to the total mass of the developer. With the content of 0.0001% by mass or more, more excellent antioxidant effects are obtained, and with the content of 1% by mass or less, developing residues tend to be suppressed.

The developer may contain a basic compound, and specific examples thereof include the same as the basic compound which may be contained in the actinic ray-sensitive or radiation-sensitive composition in the present invention.

It is preferable that after the above developing step in the pattern forming method according to the present invention, a rinsing step (a step of washing the film with a rinsing liquid including an organic solvent) is further included, for a reason that the effect of the present invention is more excellent.

<Rinsing Liquid>

The rinsing liquid which is one kind of organic treatment liquid is used in the rinsing step, and can be referred to as an organic rinsing liquid due to incorporation of an organic solvent. In the "washing" (that is, the "rinsing" of the resist film) of the resist film using the organic treatment liquid, the rinsing liquid is used.

The vapor pressure (total vapor pressure in a case of a mixed solvent) of the rinsing liquid is preferably from 0.05 kPa to 5 kPa, more preferably from 0.1 kPa to 5 kPa, and most preferably from 0.12 kPa to 3 kPa, at 20° C. By setting the vapor pressure of the rinsing liquid to from 0.05 kPa to 5 kPa, the temperature evenness within a wafer plane is improved and the swelling due to the permeation of the rinsing liquid is suppressed, whereby the dimensional evenness within a wafer plane is enhanced.

(Organic Solvent)

As the organic solvent included in the rinsing liquid, various organic solvents are used, but an organic solvent of at least one selected from the group consisting of a hydrocarbon-based solvent, a ketone-based solvent, an ester-based solvent, an alcohol-based solvent, an amide-based solvent, and an ether-based solvent is preferably used.

Specific examples of these organic solvents are the same as the organic solvents described for the developer.

In a case of using extreme ultraviolet rays or electron beams in the exposing step, as the organic solvent included in the rinsing liquid, a hydrocarbon-based solvent is preferably used among the above organic solvents, and an aliphatic hydrocarbon-based solvent is more preferably used. As the aliphatic hydrocarbon-based solvent used in the rinsing liquid, an aliphatic hydrocarbon-based solvent having 5 or more carbon atoms (for example, pentane, hexane, octane, decane, undecane, dodecane, and hexadecane) is preferable, an aliphatic hydrocarbon-based solvent having 8 or more carbon atoms is preferable, and an aliphatic hydrocarbon-based solvent having 10 or more carbon atoms is more preferable, from the viewpoint that the effect is more improved.

Furthermore, the upper limit value of the number of carbon atoms of the aliphatic hydrocarbon-based solvent is not particularly limited, but, for example, may be 16 or less, is preferably 14 or less, and more preferably 12 or less.

Among the aliphatic hydrocarbon-based solvents, decane, undecane, or dodecane is particularly preferable, and undecane is most preferable.

By using the hydrocarbon-based solvent (particularly an aliphatic hydrocarbon-based solvent) as the organic solvent included in the rinsing liquid as above, an effect in which the developer slightly soaked into the resist film is washed away after the development, the swelling is further suppressed, and the pattern collapse is inhibited is exhibited more effectively.

A plurality of the organic solvents may be used in mixture or the organic solvent may be used in combination with a solvent other than the solvents described above. The solvents described above may be mixed with water, and the moisture content in the rinsing liquid is usually 60% by mass or less, preferably 30% by mass or less, more preferably 10% by mass or less, and most preferably 5% by mass or less. By setting the moisture content to 60% by mass or less, good rinsing characteristics can be obtained.

The rinsing liquid preferably contains a surfactant. Thus, the wettability for the resist film is improved, and thus, the washing effect tends to be further improved.

As the surfactant, the same surfactant as that used in the actinic ray-sensitive or radiation-sensitive composition can be used.

The content of the surfactant is usually 0.001% to 5% by mass, preferably 0.005% to 2% by mass, and more preferably 0.01% to 0.5% by mass, with respect to the total mass of the rinsing liquid.

It is preferable that the rinsing liquid contains an antioxidant. Thus, generation of an oxidizing agent over time can be suppressed, and thus the content of the oxidizing agent can further be lowered. Specific examples and the content of the antioxidant are the same as described above for the developer.

In the rinsing step, the wafer which has been subjected to development is washed using the above rinsing liquid. The washed treatment method is not particularly limited, but examples thereof include a method in which a rinsing liquid is continuously discharged on a substrate rotated at a constant rate (a spin coating method), a method in which a substrate is immersed in a tank filled with a rinsing liquid for a certain period of time (a dip method), and a method in which a rinsing liquid is sprayed onto a substrate surface (a spray method). Among these, a method in which a washing treatment is carried out using the spin coating method, and a substrate is rotated at a rotation speed of 2,000 rpm to 4,000 rpm after washing, and then the rinsing liquid is removed from the substrate, is preferable.

Housing Container

As the organic solvent (hereinafter also referred to as an "organic treatment liquid") which can be used in the developer and the rinsing liquid, an organic solvent preserved in a housing container of an organic treatment liquid for patterning of a chemical amplification-type resist film, having the housing section is preferably used. The housing container is preferably, for example, a housing container of an organic treatment liquid for patterning of a chemical amplification-type resist film, in which the inner wall in contact with an organic treatment liquid of the housing section is formed from a resin different from a polyethylene resin, a polypropylene resin, and a polyethylene-polypropylene resin, or a metal which has been subjected to a rust-preventing/metal elution-preventing treatment. An organic solvent that is supposed to be used as an organic treatment liquid for patterning of a chemical amplification-type resist film is contained in the housing section of the housing container, and then discharged from the housing section upon the patterning of the chemical amplification-type resist film can be used.

In a case where the housing container further has a sealing portion for sealing the housing section, the sealing portion is preferably formed of a resin different from a polyethylene resin, a polypropylene resin, and a polyethylene-polypropylene resin, or a metal which has been subjected to a rust-preventing/metal elution-preventing treatment.

Here, the sealing portion means a member capable of shielding the housing section from an outside air, and suitable examples thereof include a packing and an O-ring.

The resin different from a polyethylene resin, a polypropylene resin, and a polyethylene-polypropylene resin is preferably a perfluoro resin.

Examples of the perfluoro resin include a polytetrafluoroethylene resin (PTFE), a tetrafluoroethylene-perfluoroalkylvinyl ether copolymer (PFA), a tetrafluoroethylene-hexafluoropropylene copolymer resin (FEP), a tetrafluoroethylene-ethylene copolymer resin (ETFE), a chlorotrifluoroethylene-ethylene copolymer resin (ECTFE), a polyvinylidene resin (PVDF), a polychlorotrifluoroethylene copolymer resin (PCTFE), and a polyvinyl fluoride resin (PVF).

Particularly preferred examples of the perfluoro resin include a tetrafluoroethylene resin, a tetrafluoroethylene-perfluoroalkylvinyl ether copolymer, and a tetrafluoroethylene-hexafluoropropylene copolymer resin.

Examples of the metal in the metal which has been subjected to the rust-preventing/metal elution-preventing treatment include carbon steel, alloy steel, nickel-chrome steel, nickel chrome molybdenum steel, chrome steel, chrome molybdenum steel, and manganese steel.

As the rust-preventing/metal elution-preventing treatment, a coating technique is preferably applied.

The coating technique is largely divided into three kinds of coatings such as metal coating (various platings), inorganic coating (various chemical conversion treatments, glass, concrete, ceramics, and the like) and organic coating (rust preventive oil, paint, rubber, and plastics).

Preferred examples of the coating technique include a surface treatment using a rust-preventing oil, a rust inhibitor, a corrosion inhibitor, a chelate compound, a peelable plastic, or a lining agent.

Among those, various corrosion inhibitors such as chromate, nitrite, silicate, phosphate, carboxylic acids such as oleic acid, dimer acid, and naphthalenic acid, a carboxylic acid metallic soap, sulfonate, an amine salt, esters (a glycerin ester or a phosphate ester of a higher fatty acid), chelate compounds such as ethylenediaminetetraacetic acid, gluconic acid, nitrilotriacetic acid, hydroxyethylethylenediaminetriacetic acid, and diethylenetriaminepentaacetic acid, and a fluorine resin lining are preferable. The phosphate treatment and the fluorine resin lining are particularly preferable.

Furthermore, a "pre-treatment" which is at a pre-stage for the rust-preventing treatment is also preferably employed as a treatment method which leads to extension of an anti-rust period through a coating treatment although not directly preventing rust, as compared with a direct coating treatment.

Suitable specific examples of such a pre-treatment include a treatment for removing various corrosive factors, such as chloride and sulfate, present on a metal surface through washing or polishing.

Specific examples of a housing container including the following ones.

FluoroPurePFA complex drum manufactured by Entegris Inc. (liquid contact inner surface; PFA resin lining)

Steel-made drum manufactured by JFE (liquid contact inner surface; zinc phosphate film)

Generally, the pattern obtained by the pattern forming method of the present invention is suitably used as an etching mask in a semiconductor device, or the like, but can also be used in other applications. Examples of such other applications include guide pattern formation (see, for example, ACS Nano Vol. 4 No. 8 Pages 4815-4823) in a directed self-assembly (DSA), and uses as a core in a so-called spacer process (see, for example, JP1991-270227A (JP-H03-270227A) and JP2013-164509A).

Furthermore, the present invention also relates to a method for manufacturing an electronic device, including the above-described pattern forming method, and an electronic device manufactured by the manufacturing method.

The electronic device of the present invention is suitably mounted in electrical and electronic devices (home appliances, OA-media-related devices, optical devices, communication devices, or the like).

EXAMPLES

Hereinafter, the present invention will be described with reference to Examples, but the present invention is not limited thereto.

As the resin (A) and the comparative resin, resins A-1 to A-18 were used. The resins A-1 to A-18 were synthesized by the method described in JP2013-8020A. The structures, the weight-average molecular weight (Mw), the dispersity (Mw/Mn), the ratio of repeating units (molar ratio), and the values of pKa of the acid generated by decomposition by the action of an acid of the resins A-1 to A-18 are shown below. The values of pKa are values determined by calculation using ACD/LABs pKaDB (FUJITSU LIMITED), for the monomers corresponding to the repeating units that became acids.

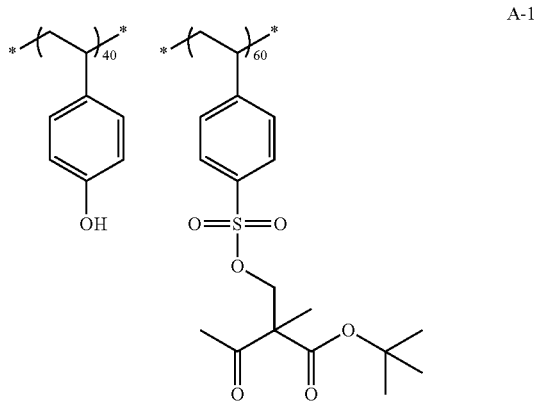

A-1

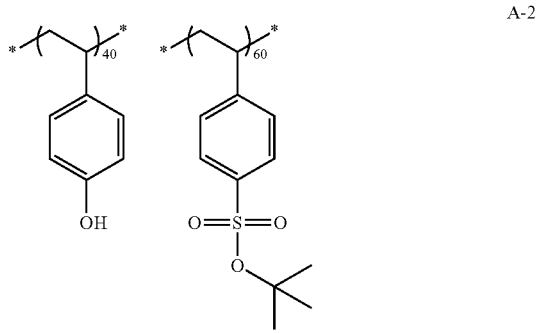

A-2

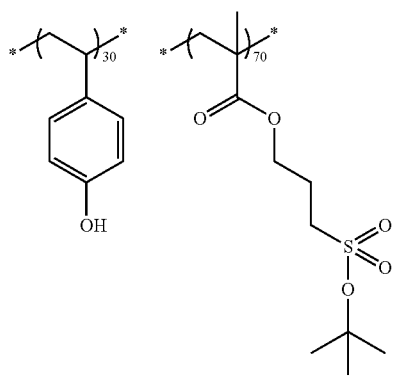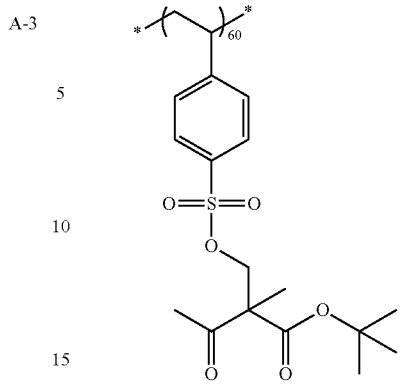

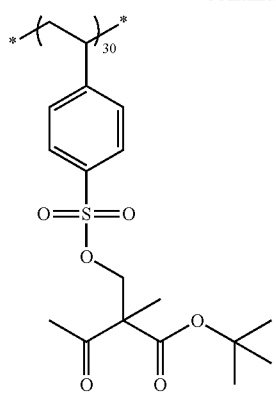
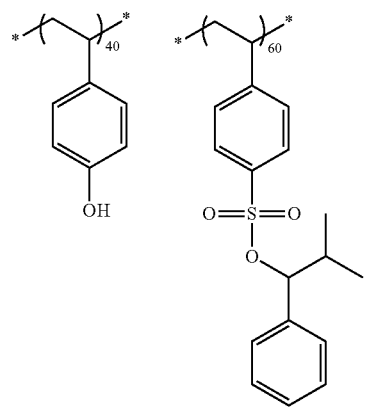
A-12
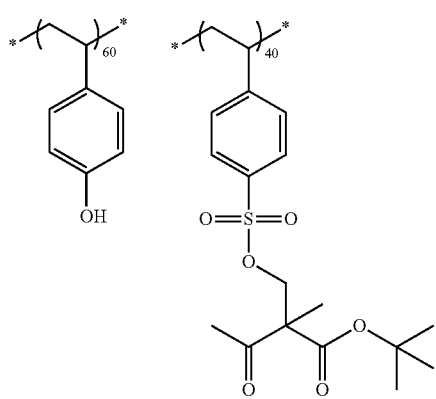
A-9
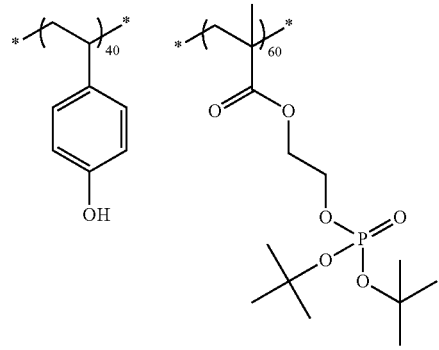
A-13
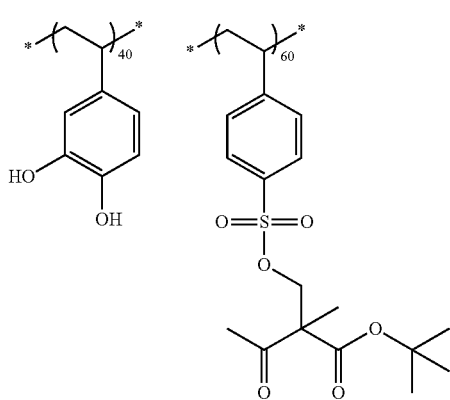
A-10
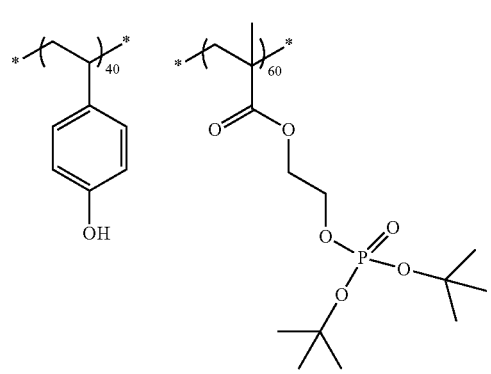
A-14
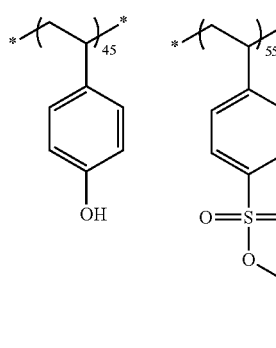
A-11
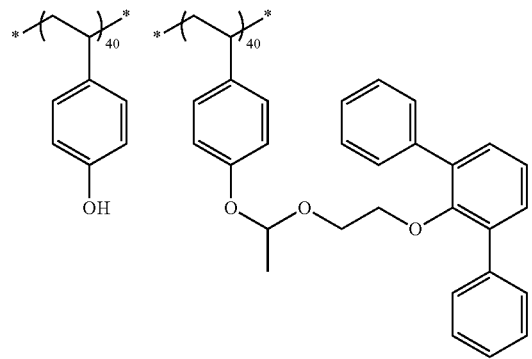
A-15

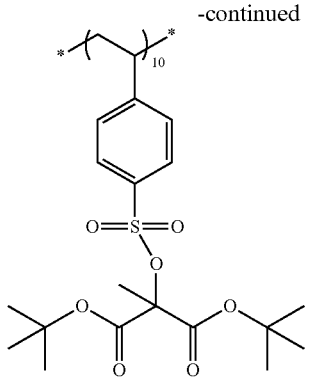
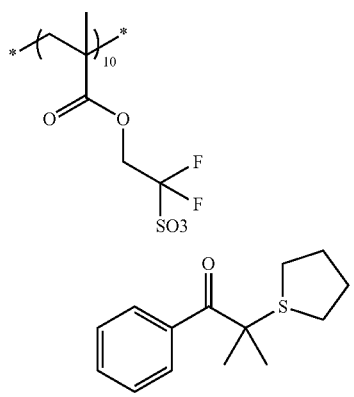
A-16
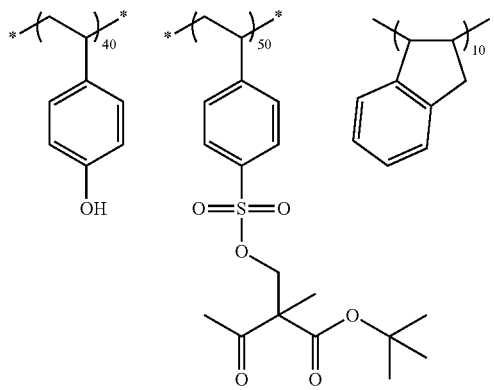
A-17
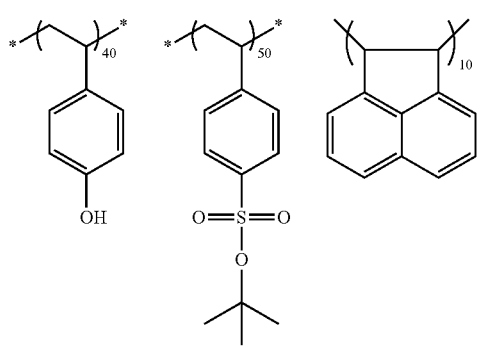
A-18
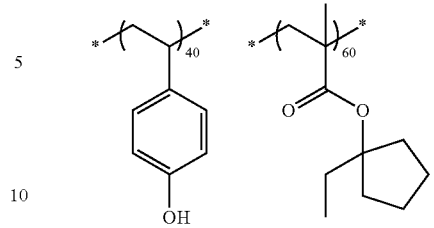
TABLE 1
|  | Weight-average molecular weight (Mw) | Dispersity (Mw/Mn) | pKa of acid generated by decomposition by action of acid |
|---|---|---|---|
| A-1 | 15,000 | 1.53 | −0.65 |
| A-2 | 13,000 | 1.57 | −0.65 |
| A-3 | 12,000 | 1.51 | 1.5 |
| A-4 | 15,000 | 1.46 | −0.65 |
| A-5 | 13,000 | 1.50 | −0.65 |
| A-6 | 14,500 | 1.55 | −0.65 |
| A-7 | 13,000 | 1.61 | 1.5 |
| A-8 | 12,500 | 1.49 | −0.65 |
| A-9 | 15,500 | 1.50 | −0.65 |
| A-10 | 15,000 | 1.53 | −0.65 |
| A-11 | 13,000 | 1.52 | −0.65 |
| A-12 | 14,000 | 1.49 | −0.65 |
| A-13 | 14,000 | 1.58 | 2.1 |
| A-14 | 13,500 | 1.62 | 1.5 |
| A-15 | 13,000 | 1.53 | −0.65 |
| A-16 | 12,000 | 1.61 | −0.65 |
| A-17 | 13,500 | 1.59 | −0.65 |
| A-18 | 13,000 | 1.52 | 4.6 |
As the acid generator, B-1 to B-9 below were used.
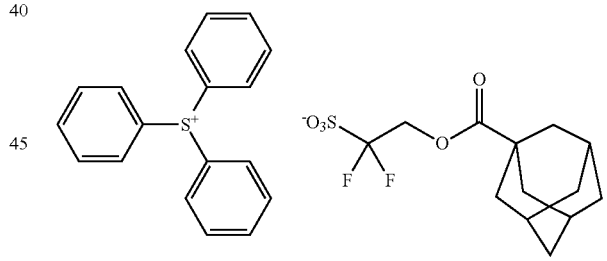
B-1
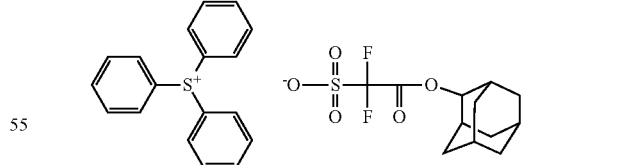
B-2
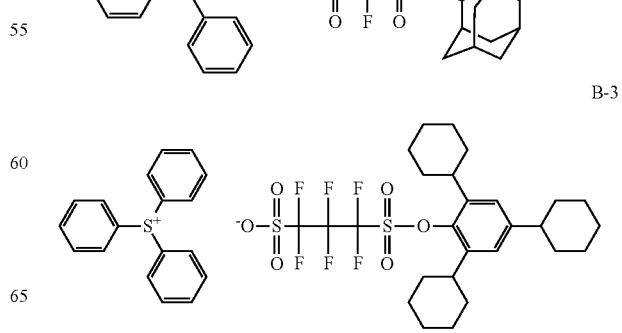
B-3

B-4
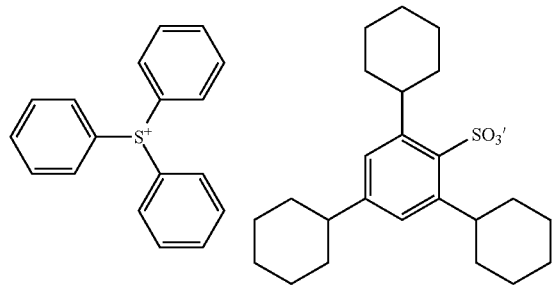
B-9
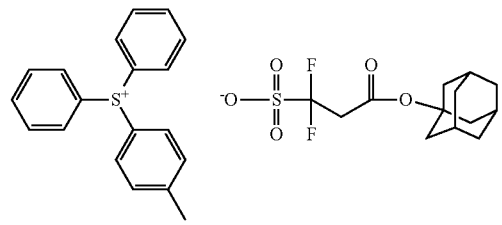
As the basic compound, C-1 to C-6 below were used.
B-5
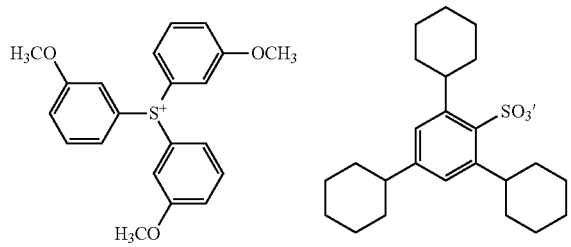
C-1
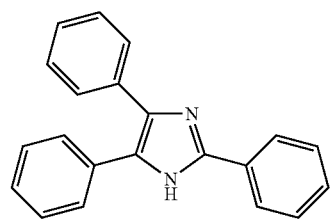
B-6
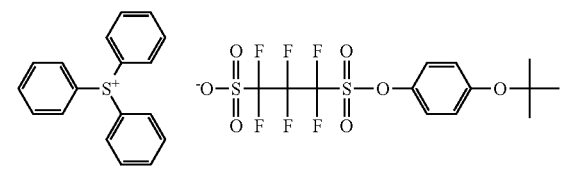
C-2
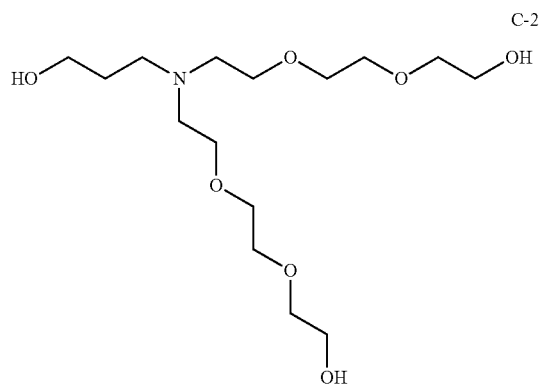
B-7
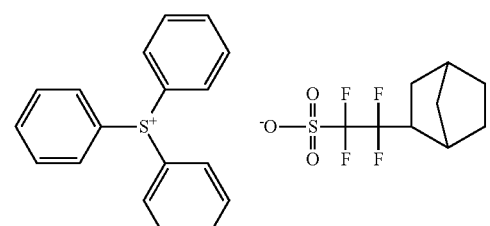
C-3
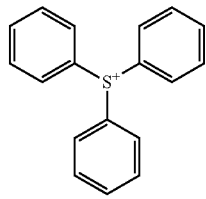
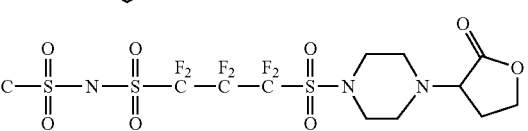
B-8
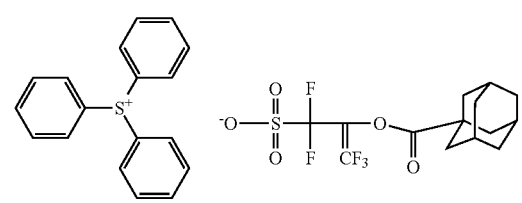
C-4

-continued

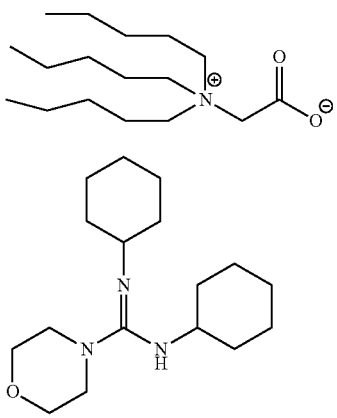

C-5

C-6

As the surfactant, the following compounds were used.
W1: MEGAFACE F176 (manufactured by DIC Corporation) (fluorine-based)
W2: MEGAFACE R08 (manufactured by DIC Corporation) (fluorine- and silicon-based)
W3: Polysiloxane Polymer KP-341 (manufactured by Shin-Etsu Chemical Co., Ltd.) (silicon-based)
W4: TROYSOL S-366 (manufactured by Troy Chemical Corporation)
W5: KH-20 (manufactured by Asahi Glass Co., Ltd.)
W6: POLYFOXT™ PF-6320 (manufactured by OMNOVA solution inc.) (fluorine-based)
As the solvent, the following ones were used.
Group a
SL-1: Propylene glycol monomethyl ether acetate (PG-MEA)
SL-2: Propylene glycol monomethyl ether propionate
SL-3: 2-Heptanone
Group b
SL-4: Ethyl lactate
SL-5: Propylene glycol monomethyl ether (PGME)
SL-6: Cyclohexanone
Group c
SL-7: γ-Butyrolactone
As the developer and the rinsing liquid, the following ones were used.
DR-1: 3-Methylbutyl acetate
DR-2: Butyl acetate
DR-3: Methyl amyl ketone (MAK)
DR-4: 2.38%-by-mass aqueous tetramethylammonium hydroxide solution
DR-5: Undecane
DR-6: Decane
DR-7: Methyl isobutyl carbinol (MIBC=4-methyl-2-pentanol)
DR-8: Pure water Examples 1 to 35 and Comparative Example 1
(Extreme Ultraviolet (EUV) Exposure and Organic Solvent Development)

<Preparation of Resist Composition>

The components shown in Tables 2 and 3 below were dissolved in a solvent, and each of the solutions was filtered through a polyethylene filter having a pore size of 0.03 μm to prepare resist compositions of Examples 1 to 35 and Comparative Example 1. Further, in Tables 2 and 3, the amounts in parts by mass of the respective components and solvent in are shown.

<Formation of Resist Film, Pattern Formation, and Development>

An organic antireflection film ARC29SR (manufactured by Nissan Chemical Industries, Ltd.) was applied onto a silicon wafer, and baking was carried out at 205° C. for 60 seconds to form an antireflection film having a film thickness of 86 nm. Each of the resist compositions prepared above was applied thereonto, and baking (PB) was carried out at 120° C. for 60 seconds to form a resist film having a film thickness of 50 nm. The wafer having the resist film applied thereon was subjected to pattern exposure with an exposure mask (line/space=1/1), using an EUV exposure device (Micro Exposure Tool manufactured by Exitech, NA 0.3, Quadrupole, outer sigma 0.68, inner sigma 0.36). After irradiation, heating was carried out at 120° C. for 60 seconds, development was then carried out by paddling for 30 seconds using a developer on a hot plate, the wafer was rotated at a rotation speed of 2,000 rpm for 30 seconds, and baking was carried out at 100° C. for 60 seconds to obtain a 1:1 line-and-space pattern having a line width of 20 nm.

Comparative Example 2 (Extreme Ultraviolet (EUV) Exposure) and Alkali Development In the same manner as in Comparative Example 1 except that the composition was changed as shown in Table 2 below, and thus, development was carried out with an aqueous alkali solution (TMAH; 2.38%-by-mass aqueous tetramethylammonium hydroxide solution) instead of the organic developer, and water was used as a rinsing liquid, a resist composition was prepared and pattern formation was carried out.

TABLE 2

| | | Resin (A) | | Acid generator | | Basic compound | | Surfactant | | Solvent | | | |
|---|---|---|---|---|---|---|---|---|---|---|---|---|---|
| | | Compound Nos. | Parts by mass | Compound Nos. | Parts by mass | Compound Nos. | Parts by mass | Compound Nos. | Parts by mass | Compound Nos. | Parts by mass | Developer | Rinsing |
| Example | 1 | A-1 | 42 | B-1 | 7 | C-1 | 1 | | | SL-1/SL-2 | 2,200/250 | DR-1 | DR-5 |
| Example | 2 | A-2 | 43 | B-3 | 6 | C-5 | 1 | | | SL-1/SL-2 | 2,200/250 | DR-1 | DR-5 |
| Example | 3 | A-4 | 41 | B-3 | 8 | C-1 | 1 | W1 | 1 | SL-1/SL-3 | 2,000/450 | DR-1 | DR-5 |
| Example | 4 | A-3 | 41 | B-4 | 8 | C-1 | 1 | | | SL-1/SL-6 | 2,000/450 | DR-1 | DR-5 |
| Example | 5 | A-2 | 40 | B-1 | 9 | C-1 | 1 | | | SL-1/SL-2 | 2,200/250 | DR-1 | DR-5 |
| Example | 6 | A-11 | 44 | B-5 | 5 | C-1 | 1 | W2 | 1 | SL-1/SL-2 | 2,200/250 | DR-1 | DR-5 |
| Example | 7 | A-7 | 43 | B-4 | 6 | C-4 | 1 | | | SL-1/SL-2/SL-5 | 2,200/150/250 | DR-1 | DR-5 |
| Example | 8 | A-8 | 42 | B-2 | 7 | C-5 | 1 | | | SL-1/SL-2 | 2,200/250 | DR-1 | DR-5 |
| Example | 9 | A-5 | 44 | B-6 | 5 | C-2 | 1 | W6 | 1 | SL-1/SL-4 | 2,100/350 | DR-1 | DR-5 |
| Example | 10 | A-5 | 39 | B-1 | 10 | C-1 | 1 | | | SL-1/SL-2 | 2,200/250 | DR-1 | DR-5 |

TABLE 2-continued

| | | Resin (A) | | Acid generator | | Basic compound | | Surfactant | | Solvent | | | |
|---|---|---|---|---|---|---|---|---|---|---|---|---|---|
| | | Compound Nos. | Parts by mass | Compound Nos. | Parts by mass | Compound Nos. | Parts by mass | Compound Nos. | Parts by mass | Compound Nos. | Parts by mass | Developer | Rinsing |
| Example | 11 | A-2 | 39 | B-1 | 10 | C-5 | 1 | | | SL-1/SL-4 | 2,100/350 | DR-1 | DR-5 |
| Example | 12 | A-1 | 39 | B-2 | 10 | C-1 | 1 | | | SL-1/SL-3 | 2,000/450 | DR-1 | DR-5 |
| Example | 13 | A-12 | 41 | B-3 | 8 | C-5 | 1 | W4 | 1 | SL-1/SL-2 | 2,200/250 | DR-1 | DR-5 |
| Example | 14 | A-9 | 41 | B-5 | 8 | C-5 | 1 | | | SL-1/SL-2 | 2,200/250 | DR-1 | DR-5 |
| Example | 15 | A-1 | 42 | B-7 | 7 | C-3 | 1 | | | SL-1/SL-4 | 2,100/350 | DR-1 | DR-5 |
| Example | 16 | A-4 | 38 | B-1 | 11 | C-3 | 1 | W3 | 1 | SL-1/SL-7 | 2,000/450 | DR-1 | DR-5 |
| Example | 17 | A-10 | 43 | B-8 | 6 | C-5 | 1 | | | SL-1/SL-4 | 2,100/350 | DR-1 | DR-5 |
| Example | 18 | A-5 | 39 | B-4 | 10 | C-6 | 1 | | | SL-1/SL-2 | 2,200/250 | DR-1 | DR-5 |
| Example | 19 | A-4 | 41 | B-9 | 8 | C-1 | 1 | | | SL-1/SL-7 | 2,000/450 | DR-1 | DR-5 |
| Example | 20 | A-6 | 41 | B-3 | 8 | C-1 | 1 | W5 | 1 | SL-1/SL-3 | 2,000/450 | DR-1 | DR-5 |
| Example | 21 | A-1/A-2 | 40 | B-1 | 9 | C-1 | 1 | | | SL-1/SL-2 | 2,200/250 | DR-1 | DR-5 |
| Example | 22 | A-2 | 39 | B-1/B-2 | 5/5 | C-1 | 1 | | | SL-1/SL-2 | 2,200/250 | DR-1 | DR-5 |
| Example | 23 | A-13 | 39 | B-1 | 10 | C-1 | 1 | | | SL-1/SL-2 | 2,200/250 | DR-1 | DR-5 |
| Example | 24 | A-14 | 41 | B-1 | 8 | C-1 | 1 | | | SL-1/SL-2 | 2,200/250 | DR-1 | DR-5 |
| Example | 25 | A-15 | 43 | B-2 | 6 | C-3 | 1 | | | SL-1/SL-2 | 2,200/250 | DR-1 | DR-5 |
| Example | 26 | A-16 | 42 | B-2 | 7 | C-2 | 1 | | | SL-1/SL-2 | 2,200/250 | DR-1 | DR-5 |
| Example | 27 | A-17 | 41 | B-2 | 8 | C-2 | 1 | | | SL-1/SL-2 | 2,200/250 | DR-1 | DR-5 |
| Comparative Example | 1 | A-18 | 42 | B-1 | 7 | C-1 | 1 | | | SL-1/SL-2 | 2,200/250 | DR-1 | DR-5 |
| Comparative Example | 2 | A-18 | 42 | B-1 | 7 | C-1 | 1 | | | SL-1/SL-2 | 2,200/250 | DR-4 | DR-8 |

For the resist described in Example 1, pattern formation was carried out by adjusting the developer and the rinsing liquid.

TABLE 3

| | | Developer | | Rinsing | |
|---|---|---|---|---|---|
| | | Compound Nos. | Ratio | Compound Nos. | Ratio |
| Example | 28 | DR-1/DR-2 | 50/50 | DR-5 | 100 |
| Example | 29 | DR-1/DR-2 | 75/25 | DR-5 | 100 |
| Example | 30 | DR-2 | 100 | DR-6 | 100 |
| Example | 31 | DR-3 | 100 | DR-5/DR-7 | 90/10 |
| Example | 32 | DR-1/DR-3 | 75/25 | DR-5/DR-1 | 90/10 |
| Example | 33 | DR-1/DR-5 | 75/25 | DR-5/DR-1 | 80/20 |
| Example | 34 | DR-1/DR-5 | 90/10 | DR-5/DR-1 | 70/30 |
| Example | 35 | DR-1 | 100 | DR-5/DR-6 | 50/50 |

[Evaluation of Resist Pattern/EUV]

Performance evaluation of the resist pattern was carried out using a scanning electron microscope (S-9380II manufactured by Hitachi, Ltd.).

<Resolving Power (LS)>

An optimum exposure dose at which the resolution of the resist pattern having a line width of 50 nm (line:space=1:1) was resolved was taken as sensitivity (Eopt) (mJ/cm$^2$). A critical resolving power at the determined optimum exposure dose (Eopt) (the minimum line width with which the line and the space (line:space=1:1) are separated and resolved) was taken as an LS resolving power (nm). As the value is smaller, the resolving power is excellent, which is thus favorable.

<Line Width Roughness (LWR)>

With regard to the line width roughness, in the Eopt, line widths at arbitrary 50 points having a size of 0.5 μm in the longitudinal direction of a line-and-space pattern (line:space=1:1) having a line width of 20 nm were measured, and the standard deviation thereof was determined to calculate 3σ (nm). A smaller value indicates better performance.

<PEB Shrinkage>

With regard to the PEB shrinkage, electron beams were irradiated at an irradiation dose of 2.0 times the irradiation dose for providing sensitivity above, the film thickness was measured after exposure and before post-baking, and the change rate from the film thickness upon unexposure was determined. A case where the change rate is 100% or less and 80% or more is denoted as A, a case where the change rate is less than 80% and 70% or more is denoted as B, a case where the change rate is less than 70% and 60% or more is denoted as C, and a case where the change rate is less than 60% is defined as D.

PEB Shrinkage (%)=100−[(Film thickness upon unexposure−Film thickness after PEB)/Film thickness upon unexposure]×100

TABLE 4

| | Line-and-space performance evaluation results | | PEB Shrinkage performance evaluation |
|---|---|---|---|
| | LS Resolving power | LWR | results |
| Example 1 | 17 | 3.1 | A |
| Example 2 | 16 | 2.9 | A |
| Example 3 | 17 | 3.3 | A |
| Example 4 | 16 | 3.0 | A |
| Example 5 | 16 | 2.8 | A |
| Example 6 | 18 | 3.4 | A |
| Example 7 | 18 | 3.6 | B |
| Example 8 | 20 | 3.7 | B |
| Example 9 | 18 | 3.6 | A |
| Example 10 | 18 | 3.0 | A |
| Example 11 | 18 | 2.8 | A |
| Example 12 | 17 | 3.1 | B |
| Example 13 | 17 | 3.1 | B |
| Example 14 | 20 | 3.7 | B |
| Example 15 | 17 | 3.3 | A |
| Example 16 | 18 | 3.5 | A |
| Example 17 | 17 | 3.4 | B |
| Example 18 | 18 | 3.4 | A |
| Example 19 | 18 | 3.3 | A |
| Example 20 | 18 | 3.3 | B |
| Example 21 | 18 | 3.3 | A |

TABLE 4-continued

| | Line-and-space performance evaluation results | | PEB Shrinkage performance evaluation |
|---|---|---|---|
| | LS Resolving power | LWR | results |
| Example 22 | 18 | 3.1 | A |
| Example 23 | 20 | 3.3 | B |
| Example 24 | 20 | 3.4 | A |
| Example 25 | 21 | 3.8 | C |
| Example 26 | 20 | 3.6 | B |
| Example 27 | 20 | 3.6 | A |
| Comparative Example 1 | 22 | 4.2 | D |
| Comparative Example 2 | 24 | 4.5 | D |

TABLE 5

| | Line-and-space performance evaluation results | | PEB Shrinkage performance evaluation |
|---|---|---|---|
| | LS Resolving power | LWR | results |
| Example 28 | 19 | 3.5 | A |
| Example 29 | 19 | 3.6 | A |
| Example 30 | 24 | 4.7 | A |
| Example 31 | 26 | 5.5 | A |
| Example 32 | 23 | 3.8 | A |
| Example 33 | 22 | 3.4 | A |
| Example 34 | 22 | 3.8 | A |
| Example 35 | 19 | 3.4 | A |

From Tables 4 and 5, the patterns of Examples which were formed by the pattern forming method using the composition including the resins (A-1) to (A-17) in the present invention exhibited good results due to excellent resolution performance and LWR performance as well as small PEB shrinkage, as compared with Comparative Examples 1 and 2.

In a case where the organic treatment liquid according to the present invention is subjected to analysis of wet particles and the concentration of organic impurities, and the concentration of metal impurities after storage at normal temperature for 14 days, and analysis of metal impurities in the manner described in JP2014-12176A in a FluoroPurePFA complex drum manufactured by Entegris Inc. (liquid contact inner surface: PFA resin lining) and a steel-made drum manufactured by JFE (liquid contact inner surface; zinc phosphate film), the FluoroPurePFA complex drum manufactured by Entegris Inc. (liquid contact inner surface; PFA resin lining) can lead to better results than the steel-made drum manufactured by JFE (liquid contact inner surface; zinc phosphate film).

INDUSTRIAL APPLICABILITY

According to the present invention, it is possible to provide a pattern forming method having excellent performance of resolution and line width roughness as well as reduction in film shrinkage (PEB shrinkage) in a PEB process, particularly in the formation of an ultrafine pattern (for example, a pattern having a line width of 20 nm hp or less). In addition, according to the present invention, it is also possible to provide a method for manufacturing an electronic device, including the pattern forming method, and an electronic device manufactured by the manufacturing method.

Although the present invention has been described with reference to detailed and specific aspects, it is obvious to those skilled in the art that various changes or modifications can be made without departing from the spirit and scope of the present invention.

The present application is based on Japanese Patent Application (Patent Application No. 2015-074229) filed on Mar. 31, 2015, the contents of which are incorporated herein by reference.

What is claimed is:

1. A pattern forming method comprising:
   a step (1) of forming a film using an actinic ray-sensitive or radiation-sensitive resin composition including a resin having an acid-decomposable repeating unit capable of decomposing by the action of an acid to generate an acid having a pKa of 3.0 or less;
   a step (2) of exposing the film using actinic rays or radiation; and
   a step (3) of carrying out development using a developer including an organic solvent after the exposure to form a negative tone pattern,
   wherein the acid-decomposable repeating unit capable of decomposing by the action of an acid to generate an acid having a pKa of 3.0 or less is represented by General Formula (1-1),

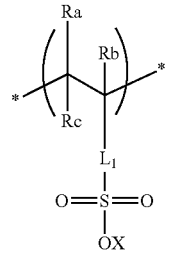

(1-1)

in the formula,
Ra and Rb each independently represents a hydrogen atom, an alkyl group, or a cyano group,
Rc represents a hydrogen atom or a substituent,
$L_1$ represents a single bond or a linking group selected from the group consisting of an arylene group, an alkylene group, a cycloalkylene group, —O—, —S—, —$SO_2$—, —CO—, —N($R_{33}$)—, or a combination thereof, wherein $R_{33}$ represents a hydrogen atom, an alkyl group, a cycloalkyl group, an alkenyl group, an aryl group, or an aralkyl group,
in a case where Rc is the substituent and $L_1$ is the linking group, Rc and $L_1$ may be bonded to each other to form a ring, and
X represents a group capable of leaving by the action of an acid and has a total number of carbon atoms and oxygen atoms of 4 or less.

2. The pattern forming method according to claim 1, wherein the content of the repeating unit capable of decomposing by the action of an acid to generate an acid having a pKa of 3.0 or less is 55% to 100% by mole with respect to all the repeating units of the resin.

3. The pattern forming method according to claim 1, wherein the resin further has a repeating unit represented by General Formula (2),

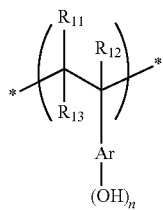

(2)

in the formula, $R_{11}$ and $R_{12}$ each independently represent a hydrogen atom, an alkyl group, a cycloalkyl group, a halogen atom, a cyano group, or an alkoxycarbonyl group, $R_{13}$ represents a hydrogen atom, an alkyl group, a cycloalkyl group, a halogen atom, a cyano group, or an alkoxycarbonyl group, or is bonded to Ar below to form a ring structure, Ar represents an aromatic cyclic group, and n represents an integer of 1 to 4.

4. The pattern forming method according to claim 1, wherein the resin does not contain a fluorine atom.

5. The pattern forming method according to claim 1, wherein the actinic ray-sensitive or radiation-sensitive resin composition contains a compound capable of generating an acid with actinic rays or radiation.

6. The pattern forming method according to claim 1, wherein the organic solvent includes an ester-based solvent.

7. The pattern forming method according to claim 1, wherein the step (2) is a step of exposing the film using electron beams, X-rays, or extreme ultraviolet rays.

8. A method for manufacturing an electronic device, comprising:
   the pattern forming method according to claim 1.

9. The pattern forming method according to claim 1, wherein the linking group represented by $L_1$ is selected from the group consisting of an arylene group, an alkylene group, —O—, —SO$_2$—, —CO—, —N($R_{33}$)—, or a combination thereof, wherein $R_{33}$ represents a hydrogen atom, an alkyl group, a cycloalkyl group, an alkenyl group, an aryl group, or an aralkyl group.

10. The pattern forming method according to claim 1, wherein the resin has a molecular weight in the range of 1,000 to 100,000.

11. The pattern forming method according to claim 1, wherein the resin has a dispersity (Mw/Mn) in a range of 1.00 to 5.00.

12. The pattern forming method according to claim 1, wherein the content of the resin is 20% to 99% by mass with respect to the total solids content in the actinic ray-sensitive or radiation-sensitive resin composition.

* * * * *